United States Patent
Yunogami et al.

(10) Patent No.: US 6,326,218 B1
(45) Date of Patent: Dec. 4, 2001

(54) SEMICONDUCTOR INTEGRATED CIRCUIT AND ITS MANUFACTURING METHOD

(75) Inventors: Takashi Yunogami, Niiza; Kazuo Nojiri, Higashimurayama; Yuzuru Ohji, Nishitama; Sukeyoshi Tsunekawa, Iruma; Masahiko Hiratani, Akishima; Yuichi Matsui, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/575,442

(22) Filed: May 22, 2000

Related U.S. Application Data

(63) Continuation of application No. 09/459,343, filed on Dec. 13, 1999.

(30) Foreign Application Priority Data

Dec. 11, 1998 (JP) .................................... 10-352559
Feb. 1, 1999 (JP) .................................... 11-024452

(51) Int. Cl.[7] .................................................. H01G 7/06
(52) U.S. Cl. ................................. 438/3; 438/240
(58) Field of Search ........................ 438/3, 240–241, 438/381, 393–399, 250–256

(56) References Cited

U.S. PATENT DOCUMENTS

| | | |
|---|---|---|
| 5,236,550 | 8/1993 | Abt et al. . |
| 5,254,217 | 10/1993 | Maniar et al. . |
| 5,313,089 | 5/1994 | Jones, Jr. . |
| 5,350,705 | 9/1994 | Brassington et al. . |
| 5,352,622 | 10/1994 | Chung . |
| 5,401,680 | 3/1995 | Abt et al. . |
| 5,405,796 | 4/1995 | Jones, Jr. . |
| 5,488,011 | 1/1996 | Figura et al. . |
| 5,543,644 | 8/1996 | Abt et al. . |
| 5,780,338 | 7/1998 | Jeng et al. . |
| 5,824,563 | 10/1998 | Hwang . |
| 5,998,258 | 12/1999 | Melnick et al. . |
| 6,218,231 * | 4/2001 | Hong ................................. 438/238 |
| 6,238,932 * | 5/2001 | Aoki et al. ............................. 438/3 |

FOREIGN PATENT DOCUMENTS

| | | |
|---|---|---|
| 8-153707 | 6/1996 | (JP) . |
| 9-266200 | 10/1997 | (JP) . |
| 1098162 | 4/1998 | (JP) . |

* cited by examiner

*Primary Examiner*—Jey Tsai
(74) *Attorney, Agent, or Firm*—Antonelli, Terry, Stout & Kraus, LLP

(57) ABSTRACT

Described is a manufacturing method of an integrated circuit which uses a thin film such as platinum or BST as a hard mask upon patterning ruthenium or the like, thereby making it possible to form a device without removing the hard mask. In addition, the invention method makes it possible to interpose a protecting film such as platinum in order to prevent, upon removing a resist used for the patterning of the hard mask, an underlying ruthenium film or the like from being damaged.

6 Claims, 31 Drawing Sheets

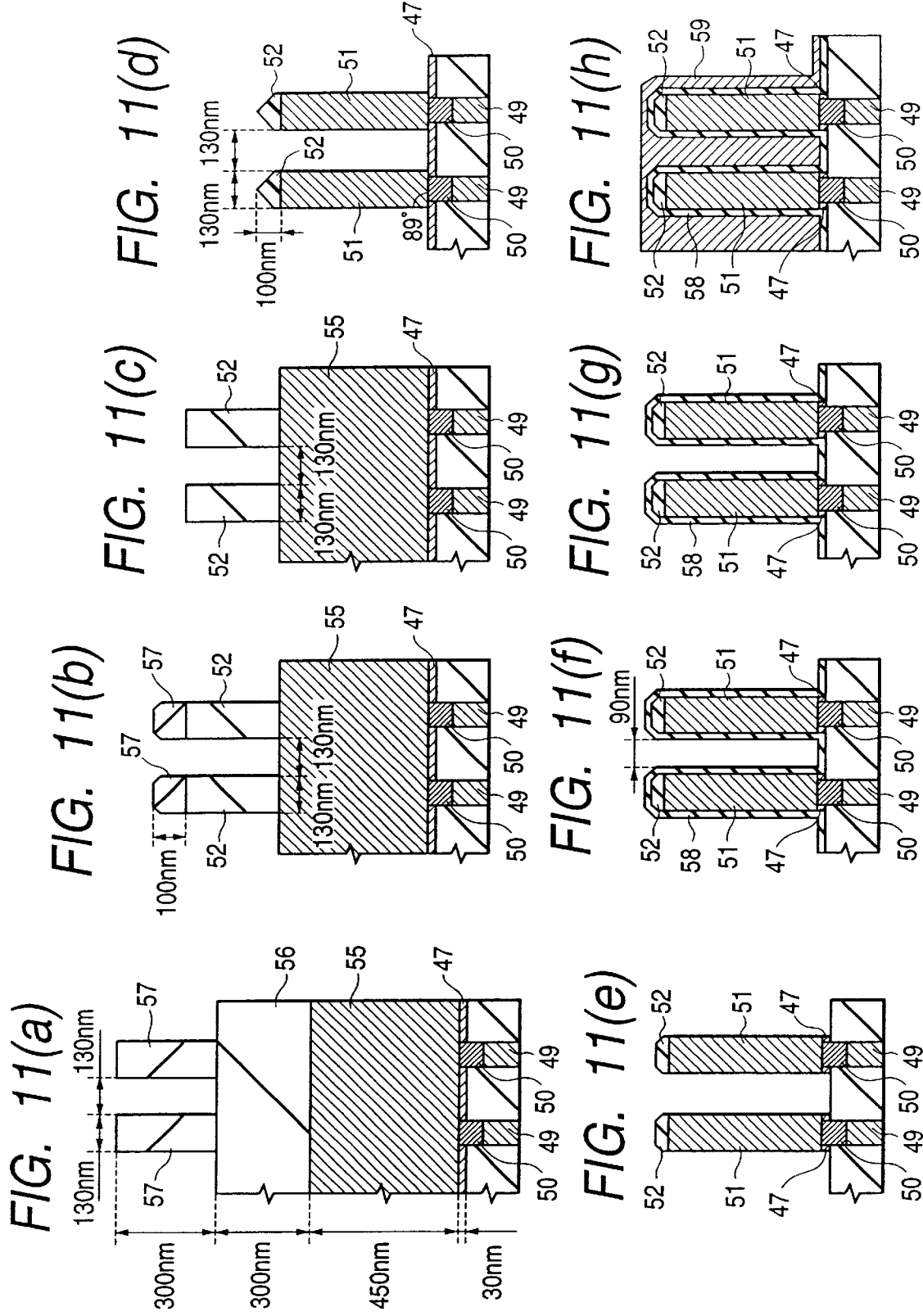

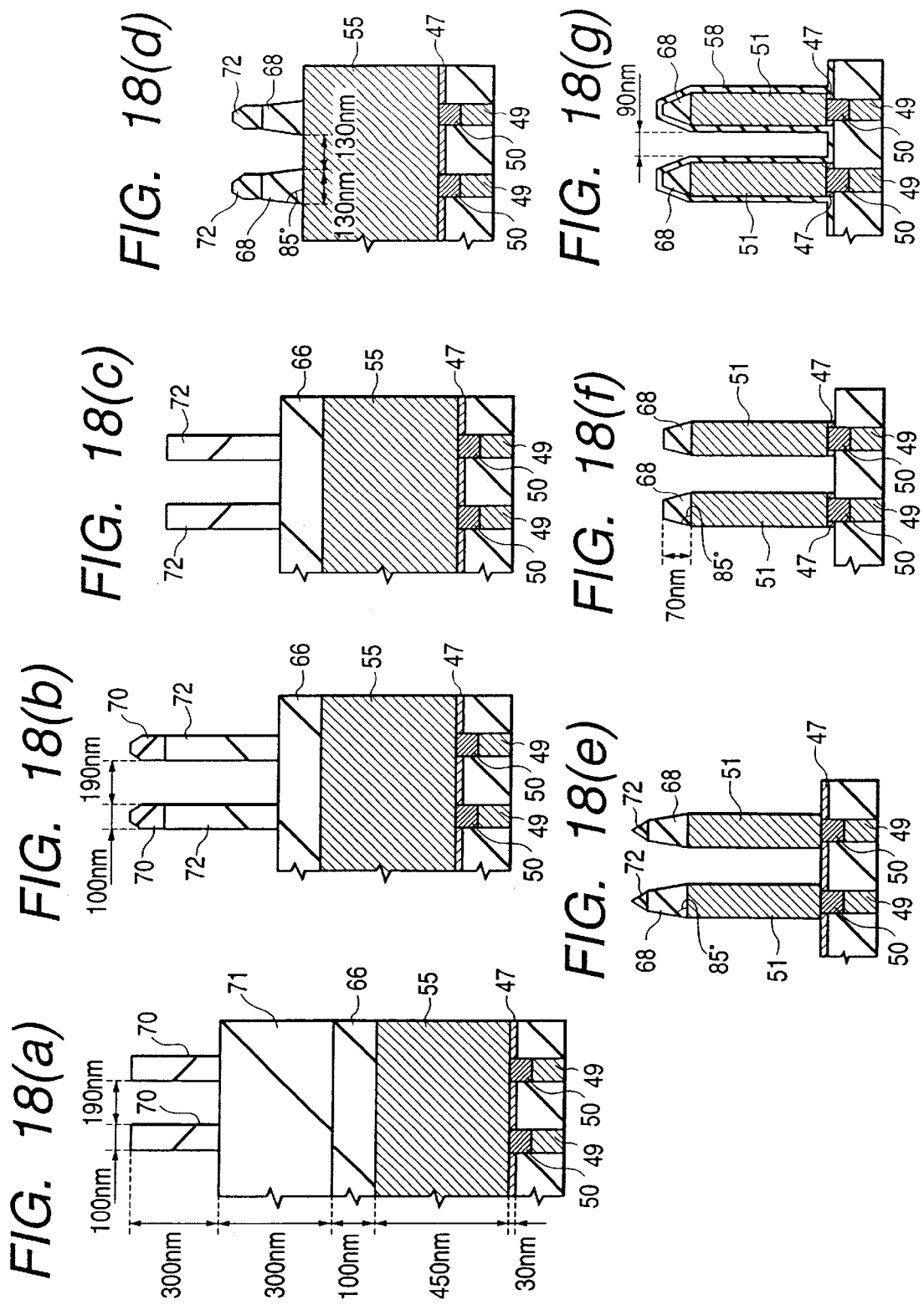

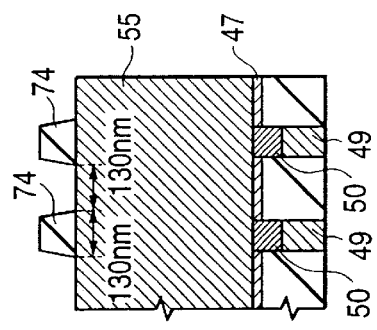
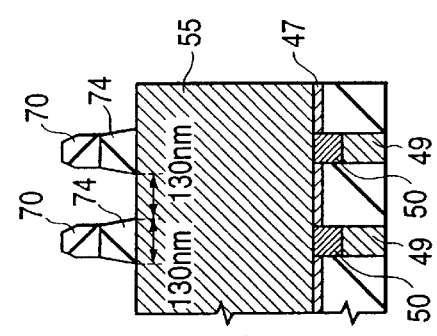
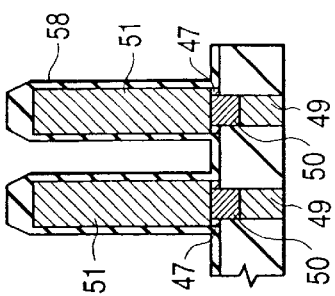
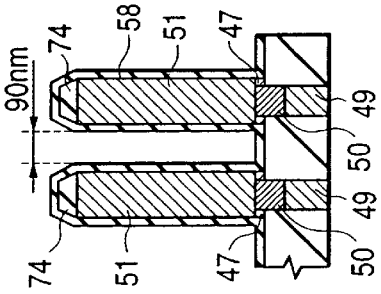
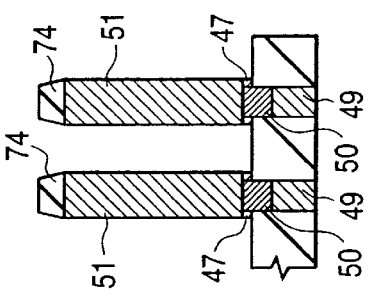
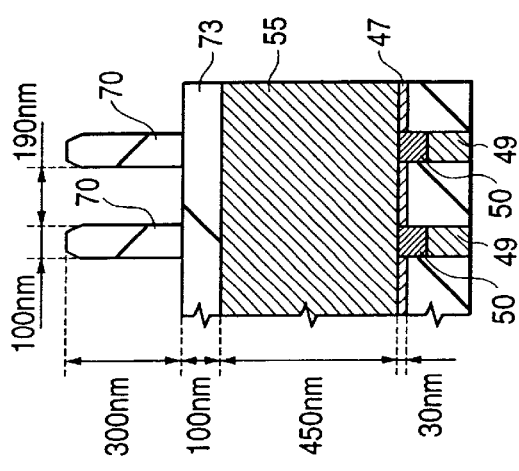
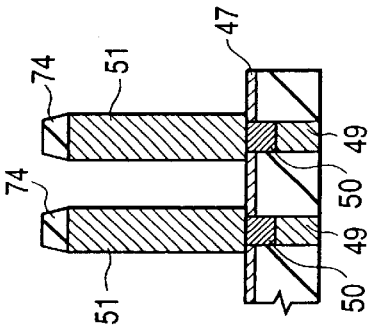

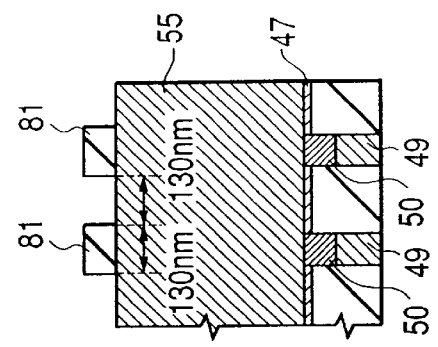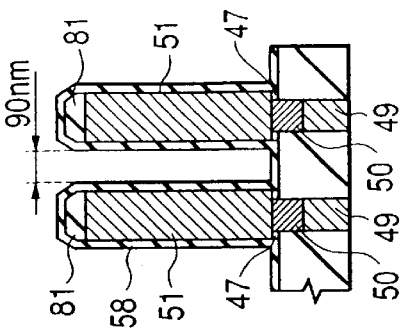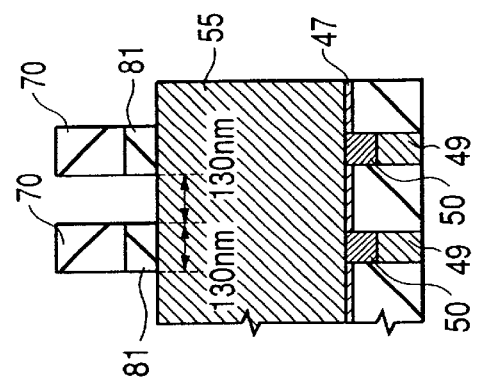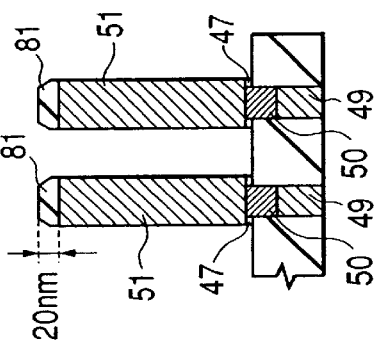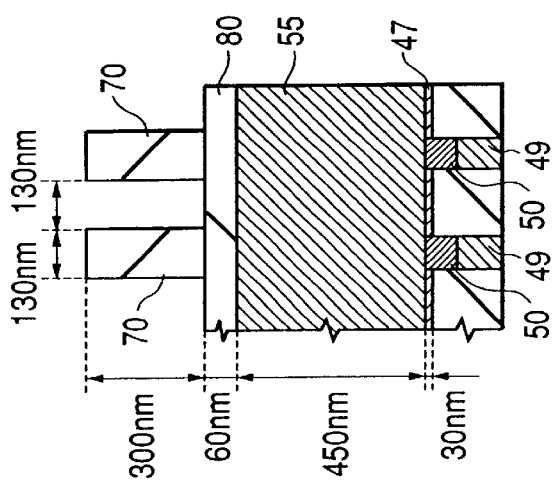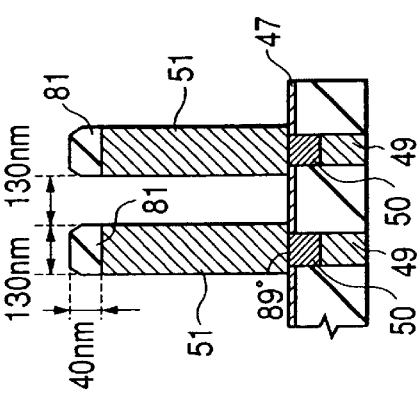

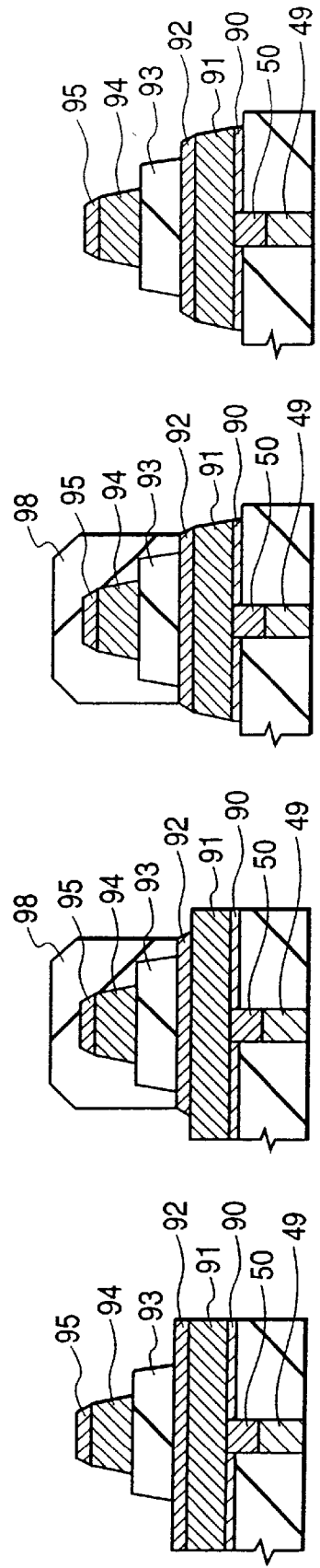

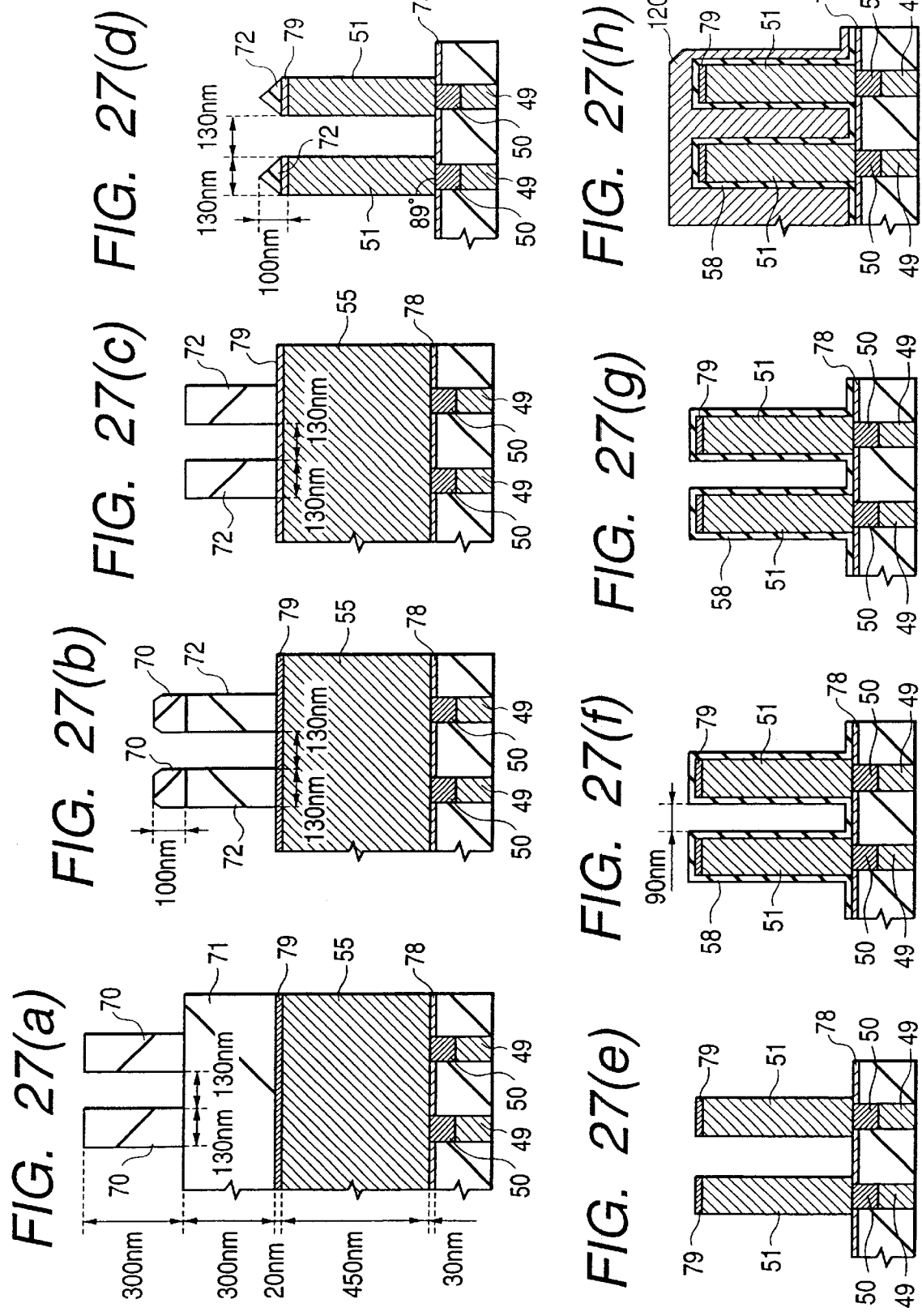

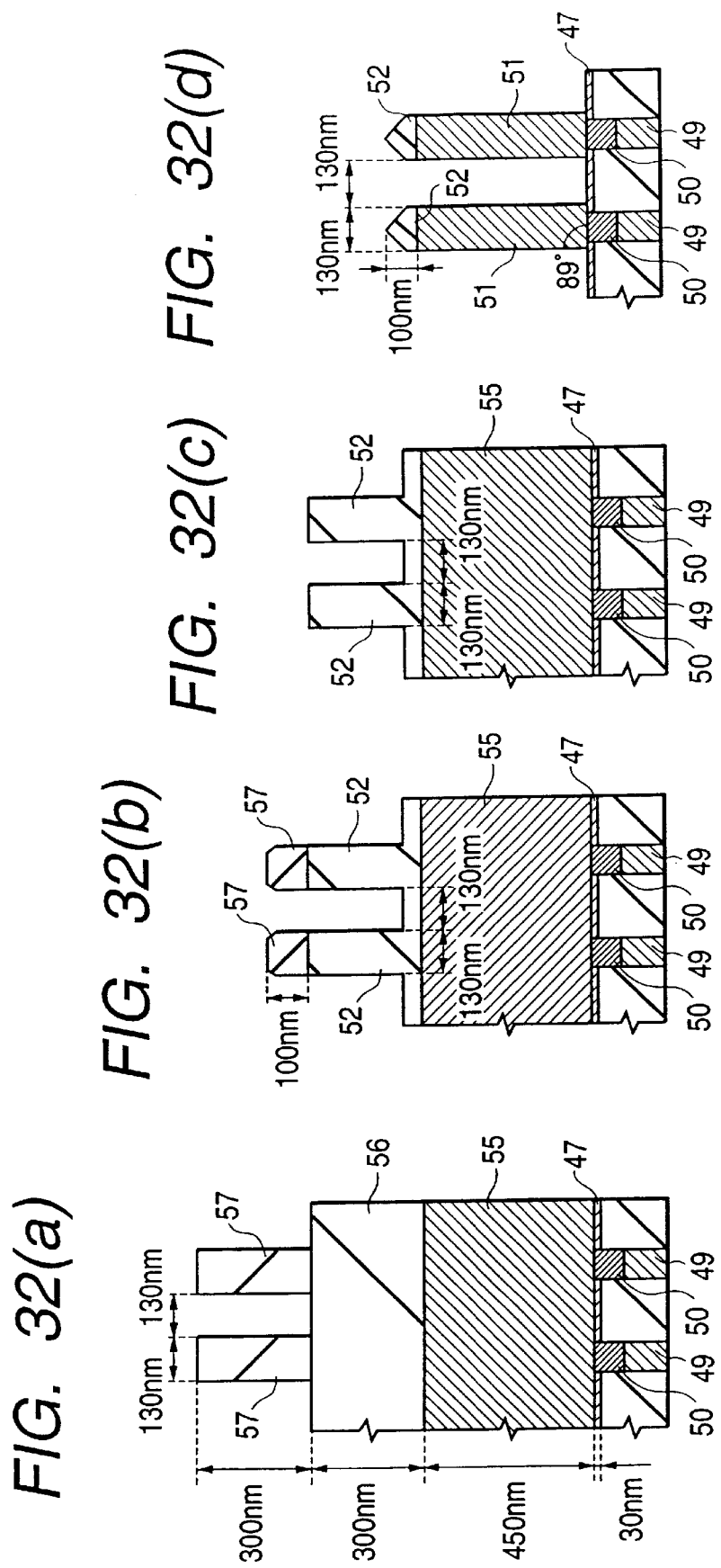

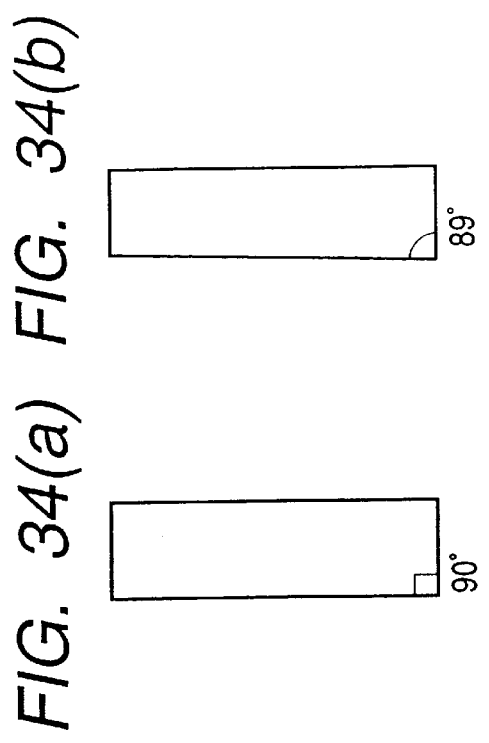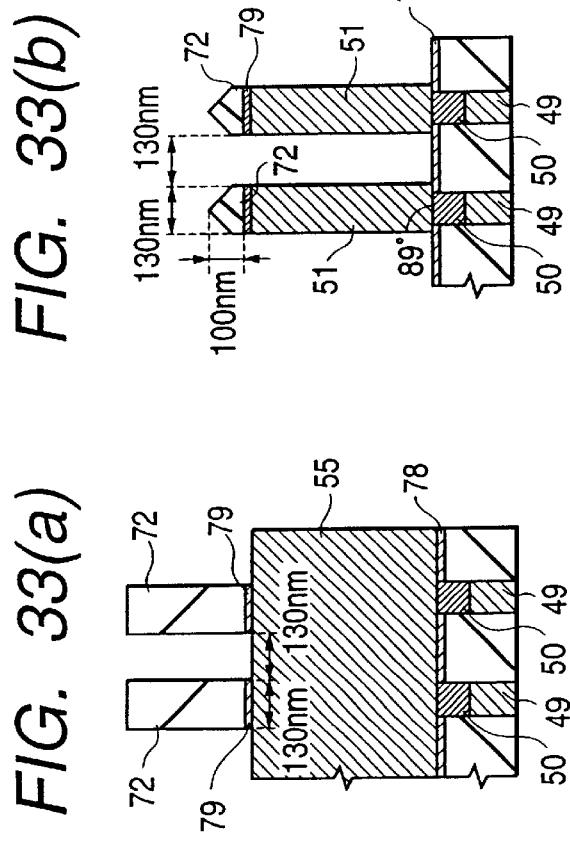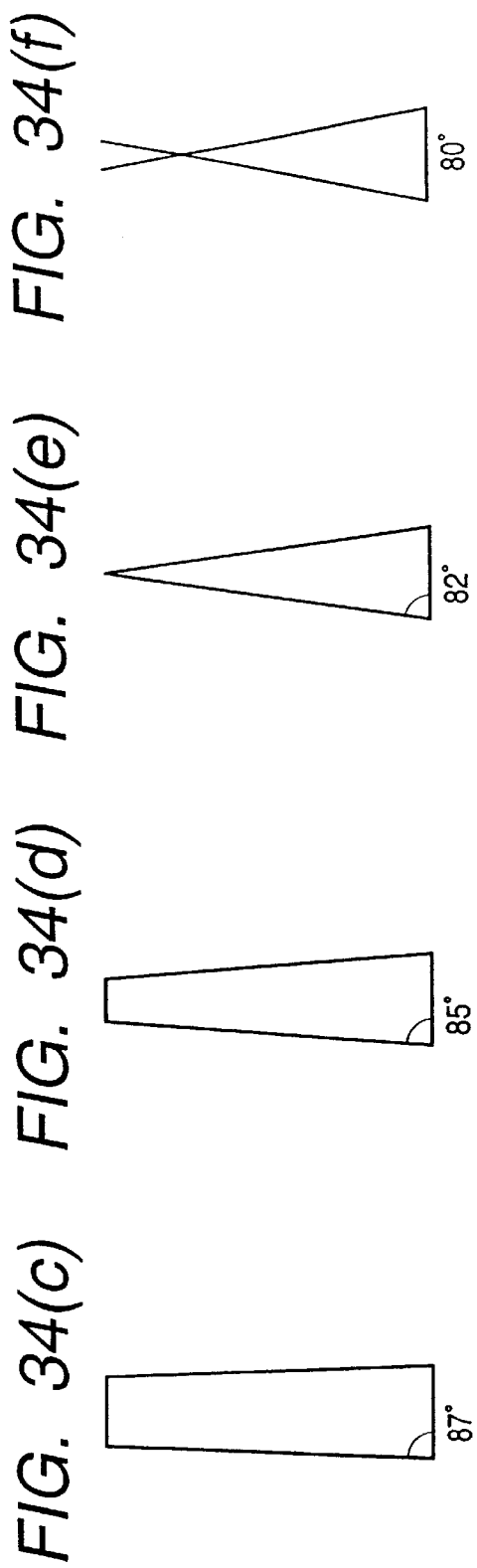

SEMICONDUCTOR INTEGRATED CIRCUIT AND ITS MANUFACTURING METHOD

CROSS-REFERENCE TO RELATED APPLICATION

This application is a continuation of application Ser. No. 09/459,343 filed on Dec. 13, 1999, the entire disclosure of which is hereby incorporated by reference.

BACKGROUND OF THE INVENTION

This invention relates to a semiconductor integrated circuit having a ferroelectric (high dielectric) capacitor and a manufacturing method of the integrated circuit. In particular, the present invention relates to technique which is effective when adapted to a process for forming a conductive material, which constitutes a lower electrode of the capacitor, at a high aspect ratio or with high anisotropy.

Described in Japanese Patent Application Laid-Open No. Hei 10-98162 (Yunogami, et al.) is technique for patterning a thin film such as Pt film by dry etching through a resist mask with a view to forming a minute pattern at high dimensional accuracy without leaving a low vapor-pressure reaction product on the side surface of the pattern, wherein the dry etching is carried out using, as a mask, a photo resist of a predetermined pattern having, at at least the lower half portion thereof, a perpendicular side surface and a forward taper or roundness at the outer periphery of the head portion so as to form, on the side surface of the thin-film pattern, a forward taper reaching the lower end of the thin film.

Described in Japanese Patent Application Laid-Open No. Hei 8-153707 (Tokashiki) is technique of selectively dry etching an electrode containing ruthenium or ruthenium oxide and then treating the surface of the electrode with oxygen, ozone, water vapor or nitrogen oxide gas, with a view to removing the contamination of carbon or halogen which has appeared, during the formation of a minute pattern of platinum or conductive oxide, on its surface and at the same time, making the surface condition of the electrode similar or almost similar to that upon formation of the electrode material.

Disclosed in Japanese Patent Application Laid-Open No. Hei 9-266200 (Nakagawa, et al.) with a view to facilitating minute processing of a ferroelectric substance or platinum is the following technique. Described specifically, a laminate film of a lower platinum film, a ferroelectric film and an upper platinum film is formed over a device insulating film on a semiconductor substrate, followed by the formation of a titanium film having a film thickness not greater than one-tenth of the laminate film. After patterning the titanium film through a photo resist film, the laminate film is etched with the patterned titanium film by using a gas mixture of oxygen and chlorine having an oxygen concentration of 40%. Then the titanium film is removed by etching with a chlorine gas.

SUMMARY OF THE INVENTION

Since the development of a large-capacity DRAM (Dynamic Random Access Memory) of 1 Gbit or greater, it has been investigated, as a countermeasure against a reduction in the accumulated charge amount due to the miniaturization of a memory cell, to constitute the capacitive insulating film of an information storage capacitative element (capacitor) from a high dielectric material such as $Ta_2O_5$ having a specific dielectric constant of about 20 and a non-perovskite structure or BST(($Ba,Sr$)$TiO_3$) having a specific dielectric constant of at least 100 and being an $ABO_3$ type double oxide, that is, a perovskite type double oxide, or a ferroelectric material, which contains a perovskite or the like crystal structure, such as PZT($PbZr_xTi_{1-x}O_3$), PLT ($PbLa_xTi_{1-x}O_3$), PLZT, $PbTiO_3$, $SrTiO_3$, or $BaTiO_3$. In the field of a nonvolatile memory, on the other hand, a ferroelectric memory making use of the polarization and inversion of the above-exemplified ferroelectric material for the maintenance of memory is under development.

When the capacitative insulating film of a capacitor is made of a ferroelectric material as exemplified above or when a ferroelectric material as exemplified above is employed for the polarization and inversion film of a nonvolatile memory, it is necessary, as described in the above-described literature, to constitute conductive films for an electrode, between which the ferroelectric material film is sandwiched, of a material having high affinity with it such as a metal mainly made of a platinum group element (ruthenium (Ru), rhodium (Rh), palladium (Pd), osmium (Os), iridium (Ir) or platinum (Pt)) or an oxide thereof.

In general, the platinum group metal or oxide thereof cannot be etched easily with good anisotropy and in addition, short-circuiting failure presumably occurs owing to the etching residue. For example, formation of a capacitor using Pt is accompanied with the problem that a large amount of a low vapor-pressure reaction product sticks to the side surface of the pattern upon dry etching of a thin Pt film deposited on a substrate and it becomes a cause for the short circuit between capacitors. The existence of such a reaction product sticking to the side surface of the pattern also becomes a cause for deteriorating the anisotropy of the pattern.

According to the investigation of the present inventors, the use of a high dielectric BST as a capacitative insulating film for the capacitor of a 1 Gbit DRAM requires a lower electrode having the minimum width of 0.13 μm and a height of 0.45 μm, and also requires a space of 0.13 μm between the adjacent lower electrodes. A taper angle not less than 80 degree, preferably not less than 85 degree is necessary for forming such a minute pattern while imparting it with high reliability in durability to practical use. The term "taper angle" as used herein means an angle formed by the side wall of a lower electrode and the surface of an underlying material.

FIG. 34 is a schematic cross-sectional view illustrating the relation between a taper angle and the shape of a minute pattern. As illustrated in FIG. 34(a), a taper angle of 90 degree is ideal. Supposing that the width of the bottom surface of the pattern is 0.13 μm and the height of the pattern is 0.45 μm, this pattern height cannot be actualized in the case where the taper angle is 80 degree (FIG. 34(f)) but can be actualized in the case where the taper angle is 82 degree (FIG. 34(e)). In the latter case, however, an area on the upper surface of the pattern is not available. At the taper angle of 85 degree (FIG. 34(d)), a certain extent of an area can be held on the upper surface of the pattern and at the taper angle of 87 degree (FIG. 34(c)), a sufficient area can be held on the upper surface of the pattern. The shape of the minute pattern is ideal when the taper angle is 89 degree (FIG. 34(b)).

As a result of the investigation on etching technique of a platinum group metal such as ruthenium or an oxide thereof with a titanium nitride film or the like as a mask by using a chlorine-containing oxygen plasma, the present inventors developed technique, which is not known yet, for actualizing a substantially ideal cross-sectional shape having a taper angle of 89 degree by largely increasing the flow rate of an etching gas and carrying out over etching;

Even if the cross-sectional shape just after etching is almost ideal, however, the removing treatment of the titanium nitride film or the like, which serves as a mask, blunts the etching shape, more specifically, the taper angle, thereby causing a problem such as the narrowing of the pattern. The mask removing treatment causes another problem that it roughens the surface of a platinum group metal or oxide thereof, which is to serve as a lower electrode, thereby deteriorating the adhesion of a capacitive insulating film. By the etching treatment upon removal of the mask, the underlying insulating film adjacent to the bottom part of the pillar-shaped lower electrode is etched. The occurrence of such undesirable etching heightens the difficulty in the step coverage of the capacitive insulating film and is not preferred from the viewpoint of forming a highly reliable capacitive insulating film.

An object of the present invention is to actualize minute etching of ruthenium or ruthenium oxide having high affinity with a ferroelectric film such as BST.

Another object of the present invention is to prevent the narrowing of the pattern, roughening of the upper surface of the pattern and etching of the underlying insulating film which will otherwise occur by the removal of the hard mask such as titanium nitride film, thereby forming a highly reliable capacitive insulating film.

A further object of the present invention is to simplify the step of forming the information storage capacitive element.

The above-described and further objects and novel features of the present invention will be apparent from the description herein and attached drawings.

Among the inventions disclosed in the present application, the typical ones will hereinafter be described briefly, classified in items.

1. A semiconductor integrated circuit comprising the steps of:
   (a) an integrated circuit substrate having a first main surface,
   (b) a plurality of pillar-shaped lower electrodes each of which is disposed over said first main surface at intervals similar to or narrower than the width of the lower electrode, constitutes an information storage capacitive element of each of memory cells and contains, as a main component, a first material,
   (c) a film which is disposed over each of the upper end portions of said plurality of pillar-shaped lower electrodes and contains, as a main component, a second material,
   (d) a dielectric film which is disposed over the side surface and upper surface of each of said plurality of pillar-shaped lower electrodes, constitutes a capacitive insulating film of the information storage capacitive element of the memory cell and is made of a high dielectric substance or a ferroelectric substance, and
   (e) one or more than one upper electrode which is disposed over said dielectric film and constitutes the information storage capacitive element of the memory cell,
   wherein said second material has an etching rate smaller than that of said first material in an oxygen-containing plasma atmosphere, an oxygen-radical-containing atmosphere or an ozone-containing atmosphere.

2. A semiconductor integrated circuit according to the item 1, wherein said first material is any one selected from ruthenium or iridium, or oxides thereof and said second material is any one selected from platinum, ruthenium dioxide, tantalum oxide, titanium oxide, BST, silicon oxide, iridium or iridium dioxide.

3. A semiconductor integrated circuit according to the item 2, wherein said first material is ruthenium and said second material is platinum.

4. A semiconductor integrated circuit according to the item 3, wherein each of said plurality of pillar-shaped lower electrodes has, in the narrower width direction. thereof, a cross-sectional shape having an aspect ratio not less than 2.

5. A semiconductor integrated circuit comprising:
   (a) an integrated circuit substrate having a first main surface,
   (b) a plurality of pillar-shaped lower electrodes each of which is disposed over said first main surface at intervals similar to or narrower than the width of the lower electrode, and constitutes an information storage capacitive element of each of memory cells,
   (c) a dielectric film which is disposed over the side surface and upper surface of each of said plurality of pillar-shaped lower electrodes, constitutes a capacitive insulating film of the information storage capacitive element of the memory cell and is made of a high dielectric substance or a ferroelectric substance, and
   (d) one or more than one upper electrode which is disposed over said dielectric film and constitutes the information storage capacitive element of the memory cell,
   wherein a material constituting at least the surface portion of said upper electrode has an etching rate smaller than that of ruthenium in an oxygen-containing plasma atmosphere, an oxygen-radical-containing atmosphere or an ozone-containing atmosphere.

6. A semiconductor integrated circuit according to the item 5, wherein said upper electrode is made of any material selected from platinum, iridium or iridium dioxide.

7. A semiconductor integrated circuit according to the item 5, wherein said upper electrode comprises a lower layer made of ruthenium and an upper layer made of any material selected from titanium nitride, silicon oxide, tantalum oxide, ruthenium dioxide, platinum, titanium oxide, iridium or iridium dioxide.

8. A semiconductor integrated circuit according to the item 7, wherein said upper electrode comprises a lower layer made of ruthenium and an upper layer made of any material selected from titanium nitride, silicon oxide or tantalum oxide.

9. A semiconductor integrated circuit comprising:
   (a) an integrated circuit substrate having a first main surface,
   (b) a plurality of pillar-shaped lower electrodes each of which is disposed on said first main surface at intervals similar to or narrower than the width of the lower electrode, constitutes an information storage capacitive element of each of memory cells and contains, as a main component, a first material,
   (c) a film which is disposed over each of the upper end portions of said plurality of pillar-shaped lower electrodes and contains, as a main component, a second material,
   (d) a dielectric film which is disposed over the side surface and upper surface of each of said plurality of pillar-shaped lower electrodes, constitutes a capacitive insulating film of the information storage capacitive element of the memory cell and is made of a high dielectric substance or a ferroelectric substance, and
   (e) one or more than one upper electrode which is disposed over said dielectric film and constitutes the information storage capacitive element of the memory cell and has at least a surface made of a third material, wherein said second and third materials each has an etching rate smaller than that of said first material in an oxygen-containing plasma atmosphere, an oxygen-radical-containing atmosphere or an ozone-containing atmosphere.

10. A semiconductor integrated circuit according to the item 9, wherein said first material is any material selected from ruthenium or iridium, or oxides thereof, said second material is any material selected from platinum, ruthenium dioxide, tantalum oxide, titanium oxide, BST, silicon oxide, iridium or iridium dioxide, and said third material is any material selected from titanium nitride, silicon oxide, tantalum oxide, ruthenium dioxide, platinum, titanium oxide, iridium or iridium dioxide.

11. A semiconductor integrated circuit according to item 10, wherein said first material is ruthenium, said second material is platinum and said third material is any material selected from titanium nitride, silicon oxide or tantalum oxide.

12. A semiconductor integrated circuit according to the item 11, wherein each of said plurality of pillarshaped lower electrodes has, in the narrower width direction thereof, a cross-sectional shape having an aspect ratio not less than 2.

13. A method for manufacturing a semiconductor integrated circuit, comprising the steps of:

(a) forming, over the main surface of an integrated circuit wafer, a conductive first film which constitutes a lower electrode of an information storage capacitive element of a memory cell, (b) forming, over said first film, a second film having a smaller etching rate than said first film in an ashing atmosphere upon removal of a photoresist film, (c) forming an inorganic third film over said second film, (d) forming a photoresist film pattern over said third film, (e) dry etching said third film in the presence of said photoresist film pattern, thereby forming an inorganic film pattern of said third film over said second film, (f) removing said photoresist film pattern by ashing, (g) dry etching said first and second films in the presence of said inorganic film pattern, thereby patterning said first and second films, and (h) forming, over the patterned surfaces of said first and second films, a dielectric film which constitutes a capacitive insulating film of the information storage capacitive element of said memory cell.

14. A method for manufacturing a semiconductor integrated circuit according to the item 13, wherein said first film is made of ruthenium and said second film is made of any material selected from platinum, ruthenium dioxide, tantalum oxide, titanium oxide, BST, silicon oxide, iridium or iridium dioxide.

15. A method for manufacturing a semiconductor integrated circuit according to the item 14, further comprising the steps of:

(i) forming, over said capacitive insulating film, a monolayer or multilayer conductive fourth film which is made of, at at least the surface portion thereof, a material having a smaller etching rate than said first film in the ashing atmosphere upon removal of the photoresist film, (j) forming a photoresist film pattern over said fourth film, (k) dry etching said fourth film in the presence of said photoresist film pattern, thereby patterning said fourth film, and (l) removing said photoresist film pattern by ashing.

16. A method for manufacturing a semiconductor integrated circuit according to the item 15, wherein said fourth film is formed of a lower layer made of ruthenium and an upper layer made of titanium nitride, silicon oxide or tantalum oxide.

17. A method for manufacturing a semiconductor integrated circuit according to the item 14, further comprising the steps of:

(i) forming, over said capacitive insulating film, a monolayer or multilayer conductive fourth film which is made of, at at least the surface thereof, a material having a smaller etching rate than said first film in an ashing atmosphere upon removal of a photoresist film, (j) forming an inorganic fifth film over said fourth film, (k) forming a photoresist film pattern over said fifth film, (l) dry etching said fifth film in the presence of said photoresist film pattern, thereby forming an inorganic film pattern of said fifth film, (m) removing said photoresist film pattern by ashing, and (n) dry etching said fourth film in the presence of said inorganic film pattern, thereby patterning said fourth film.

18. A method for manufacturing a semiconductor integrated circuit according to the item 17, wherein said fourth film is formed of a lower layer made of ruthenium and an upper layer made of titanium nitride and said fifth film is formed of a silicon oxide film.

19. A method for manufacturing a semiconductor integrated circuit, comprising the steps of:

(a) forming, over the main surface of an integrated circuit wafer, a conductive first film which constitutes a lower electrode of an information storage capacitive element of a memory cell, (b) forming an inorganic third film over said first film, (c) forming a photoresist film pattern over said third film, (d) dry etching said third film in the presence of said photoresist film pattern, (e) removing said photoresist film pattern by ashing, (f) dry etching said first film in the presence of said third film, thereby patterning said first film, and (g) forming, over the patterned surface of said first film, a dielectric film which constitutes a capacitive insulating film of the information storage capacitive element of said memory cell, wherein dry etching in said step (d) is carried out for the formation of an unevenness on said third film so that it is. stopped before etching reaches the bottom surface of said third film, and after said dry etching, said third film remains even in the concave portion of said third film.

20. A method for manufacturing a semiconductor integrated circuit, further comprising the steps of:

(a) forming, over the main surface of an integrated circuit wafer, a conductive first film which constitutes a lower electrode of an information storage capacitive element of a memory cell, (b) forming an inorganic third film over said first film, (c) forming a photoresist film pattern over said third film, (d) dry etching said third film in the presence of said photoresist film pattern, thereby forming an inorganic film pattern of said third film over said first film, (e) removing said photoresist film pattern, (f) dry etching said first film in the presence of said inorganic film pattern, thereby patterning said first film, and (h) forming, over the patterned surface of said first film, a dielectric film which constitutes a capacitive insulating film of the information storage capacitive element of said memory cell, wherein removal of said photoresist film pattern in said step (e) is carried out by the peeling method or wet etching method.

The other inventions according to the present application will next be summarized, classified into items.

1. A method for manufacturing a semiconductor integrated circuit, comprising the steps of:

(a) forming, over the main surface of an integrated circuit wafer, a first conductive film which constitutes a lower electrode of an information storage capacitive element of a memory cell, (b) forming, over said first conductive film, a first dielectric film pattern made of a high dielectric or ferroelectric film, (c) dry etching said first conductive film in the presence of said first dielectric film pattern, thereby patterning said first conductive film, (d) forming, over the patterned surface of said first conductive film and the surface of said first dielectric film pattern, a second dielectric film which constitutes a capacitive insulating film of the information storage capacitive element of said memory cell and is made of a high dielectric or ferroelectric film, and (e) forming, over said second dielectric film, a second conductive film which constitutes an upper electrode of the information storage capacitive element of said memory cell.

2. A method for manufacturing a semiconductor integrated circuit according to the above-described item 1, wherein said step (c) is free from the use of a photoresist pattern.

3. A method for manufacturing a semiconductor integrated circuit according to the above-described item 2, wherein said first dielectric film is made of a substance having substantially the same molecular structure as that of said second dielectric film.

4. A method for manufacturing a semiconductor integrated circuit according to the above-described item 3, wherein said first conductive film is made of a platinum group element or an oxide thereof.

5. A method for manufacturing a semiconductor integrated circuit, comprising the steps of:

(a) forming, over the main surface of an integrated circuit wafer, a first conductive film which constitutes a lower electrode of an information storage capacitive element of a memory cell and is made of a platinum group element or an oxide thereof, (b) forming a first inorganic film pattern over said first conductive film, (c) dry etching said first conductive film in the presence of said first inorganic film pattern, thereby patterning said first conductive film, (d) forming, over the patterned surface of said first conductive film and the surface of said first inorganic film pattern, a second dielectric film which constitutes a capacitive insulating film of the information storage capacitive element of said memory cell, and (e) forming, over said second dielectric film, a second conductive film which constitutes an upper electrode of the information storage capacitive element of said memory cell.

6. A method for manufacturing a semiconductor integrated circuit according to the above-described item 5, wherein said step (c) is free from the use of a photoresist pattern.

7. A method for manufacturing a semiconductor integrated circuit according to the above-described item 6, wherein said first inorganic film pattern is made of a silicon oxide film.

8. A method for manufacturing a semiconductor integrated circuit according to the above-described item 6, wherein said first inorganic film pattern is made of a compound containing a metal and nitrogen.

9. A method for manufacturing a semiconductor integrated circuit, comprising the steps of:

(a) forming, over the main surface of an integrated circuit wafer, a first conductive film which constitutes a lower electrode of an information storage capacitive element of a memory cell and is made of ruthenium or iridium, or an oxide thereof and, (b) forming, over said first conductive film, a first platinum film pattern, (c) dry etching said first conductive film in the presence of said platinum film pattern, thereby patterning said first conductive film, (d) forming, over the patterned surface of said first conductive film and the surface of said first platinum film pattern, a first dielectric film which constitutes a capacitive insulating film of the information storage capacitive element of said memory cell and is made of a high dielectric or ferroelectric film, and (e) forming, over said first dielectric film, a second conductive film which constitutes an upper electrode of the information storage capacitive element of said memory cell.

10. A method for manufacturing a semiconductor integrated circuit according to the above-described item 9, wherein said step (c) is free from the use of a photoresist pattern.

11. A method for manufacturing a semiconductor integrated circuit according to the above-described item 10, wherein said first conductive film is made of ruthenium or an oxide thereof.

12. A method for manufacturing a semiconductor integrated circuit according to the above-described item 10, wherein said first conductive film is made of iridium or an oxide thereof.

13. A semiconductor integrated circuit, comprising:

(a) an integrated circuit substrate having a first main surface, (b) a plurality of pillar-shaped lower electrodes each of which is disposed over said first main surface at intervals similar to or narrower than the width of said pillar-shaped lower electrode and constitutes an information storage capacitive element of a memory cell, (c) a first dielectric film which is disposed over the side surface and upper surface of each of said plurality of pillar-shaped lower electrodes, constitutes a capacitive insulating film of the information storage capacitive element of the memory cell and is made of a high dielectric or ferroelectric film, and (d) one or more than one upper electrode which is disposed over said first dielectric film disposed over the side surface and upper surface of each of said plurality of pillar-shaped lower electrodes and constitutes the information storage capacitive element of the memory cell, wherein each of said plurality of pillar-shaped lower electrodes has, at the side surface thereof, a taper so that the upper surface of the lower electrode has an area not greater than 25% of that of the bottom surface.

14. A semiconductor integrated circuit according to the above-described item 13, wherein at least some of said plurality of pillar-shaped lower electrodes have, in the narrower width direction, a substantially triangular cross-section.

15. A semiconductor integrated circuit according to the above-described item 14, wherein each of said plurality of pillar-shaped lower electrodes has, in the narrower width direction thereof, a cross-sectional shape having an aspect ratio not less than 2.

16. A semiconductor integrated circuit according to the above-described item 14, wherein each of said plurality of pillar-shaped lower electrodes has, in the narrower width direction thereof, a cross-sectional shape having an aspect ratio not less than 3.

17. A semiconductor integrated circuit, comprising:
 (a) an integrated circuit substrate having a first main surface,
 (b) a plurality of pillar-shaped lower electrodes each of which is disposed over said first main surface at intervals similar to or narrower than the width of the electrode and constitutes an information storage capacitive element of each memory cell,
 (c) a first dielectric film which is disposed over the side surface and upper surface of each of said plurality of pillar-shaped lower electrodes, constitutes a capacitive insulating film of the information storage capacitive element of the memory cell and is made of a high dielectric or ferroelectric film, and
 (d) one or more than one upper electrode which is disposed over said first dielectric film disposed over the side surface and upper surface of each of said plurality of pillar-shaped lower electrodes and constitutes the information storage capacitive element of the memory cell,
 wherein the contribution of the capacity of the upper surface portion of each of said plurality of pillar-shaped lower electrodes to the corresponding information storage capacitive element of the memory cell is not greater than 3%.

18. A semiconductor integrated circuit according to the above-described item 17, wherein at least some of said plurality of pillar-shaped lower electrodes have, in the narrower width direction thereof, a substantially triangular cross-section.

19. A semiconductor integrated circuit according to the above-described item 18, wherein each of said plurality of pillar-shaped lower electrodes has, in the narrower width direction thereof, a cross-sectional shape having an aspect ratio not less than 2.

20. A semiconductor integrated circuit according to the above-described item 18, wherein each of said plurality of pillar-shaped lower electrodes has, in the narrower width direction thereof, a cross-sectional shape having an aspect ratio not less than 3.

21. A semiconductor integrated circuit, comprising:
 (a) an integrated circuit substrate having a first main surface,
 (b) a plurality of pillar-shaped lower electrodes each of which is disposed over said first main surface at intervals similar to or narrower than the width of the electrode and constitutes an information storage capacitive element of each memory cell,
 (c) a first dielectric film which is disposed over the side surface and upper surface of each of said plurality of pillar-shaped lower electrodes, constitutes a capacitive insulating film of the information storage capacitive element of the memory cell and is made of a high dielectric or ferroelectric film, and
 (d) one or more than one upper electrode which is disposed over said first dielectric film disposed over the side surface and upper surface of each of said plurality of pillar-shaped lower electrodes and constitutes the information storage capacitive element of the memory cell,
 wherein each of said plurality of pillar-shaped lower electrodes has a main portion which occupies the maximum volume of the pillar-shaped lower electrode and an upper end portion which is disposed to cover the upper surface of the main portion and is made of a material different from that of the main portion, the upper end portion of said lower electrode having, at both ends of the head portion of the upper end portion, a beveled shape larger than the cross-sectional shape of said main portion at both ends of the head portion of the main portion.

22. A semiconductor integrated circuit according to the above-described item 21, wherein the upper end portion of each of said plurality of pillar-shaped lower electrodes has a trapezoidal cross-section.

23. A semiconductor integrated circuit according to the above-described item 21, wherein the upper end portion of each of said plurality of pillar-shaped lower electrodes has a triangular cross-section.

24. A semiconductor integrated circuit according to the above-described item 21, wherein the upper end portion of each of said plurality of pillar-shaped lower electrodes has a rectangular cross-section formed by cutting off, in the thickness-wise direction of the pillar-shaped lower electrode, more than half of the side surface at the head portion.

25. A semiconductor integrated circuit according to the above-described item 21, wherein the upper portion of each of said plurality of pillar-shaped lower electrodes has a cross-sectional shape rounded, in the thickness-wise direction of the lower electrode, at more than half of the side surface of the head portion of the lower electrode.

26. A semiconductor integrated circuit, comprising:
 (a) an integrated circuit substrate having a first main surface,
 (b) a plurality of pillar-shaped lower electrodes each of which is disposed over said first main surface at intervals similar to or narrower than the width of the lower electrode, constitutes an information storage capacitive element of each memory cell and contains, as a main component, ruthenium or an oxide thereof,
 (c) a conductive film which is disposed over the upper portion of each of said plurality of pillar-shaped lower electrodes and is made of platinum, and
 (d) a first dielectric film which is disposed over the side surface and upper surface of said plurality of pillar-shaped lower electrodes, constitutes an capacitive insulating film of the information storage capacitive element of the memory cell and is made of a high electric or ferroelectric film, and
 (e) one or more than one upper electrode which is disposed over said first dielectric film disposed over the side surface and upper surface of each of said plurality of pillar-shaped lower electrodes and constitutes the information storage capacitive element of the memory cell.

27. A semiconductor integrated circuit according to the above-described item 26, wherein each of said plurality of pillar-shaped lower electrodes is thicker than said conductive film formed thereover.

28. A semiconductor integrated circuit according to the above-described item 27, wherein each of said plurality of pillar-shaped lower electrodes is at least two times thicker than said conductive film formed thereover.

29. A semiconductor integrated circuit, comprising:
 (a) an integrated circuit substrate having a first main surface,
 (b) a plurality of pillar-shaped lower electrodes each of which is disposed over said first main surface at intervals similar to or narrower than the width of the lower electrode, constituted an information storage capacitive element of a memory cell of dynamic RAM and contains, as a main component, iridium or an oxide thereof,
 (c) a conductive film which is disposed over the upper portion of each of said plurality of pillar-shaped lower electrodes and is made of platinum,
 (d) a first dielectric film which is disposed over the side surface and upper surface of each of said plurality of pillar-shaped lower electrodes, constitutes a capacitive insulating film of the information storage capacitive element of the memory cell and is made of a high dielectric or ferroelectric film, and
 (e) one or more than one upper electrode which is disposed over said first dielectric film disposed over the side surface and upper surface of each of said plurality of pillar-shaped lower electrodes and constitutes the information storage capacitive element of the memory cell.

30. A semiconductor integrated circuit device according to the above-described item 29, wherein each of said plurality of pillar-shaped lower electrodes is thicker than said conductive film formed thereover.

31. A semiconductor integrated circuit device according to the above-described item 30, wherein each of said plurality of pillar-shaped lower electrodes is at least two times thicker than said conductive film formed thereover.

32. A semiconductor integrated circuit, comprising:
 (a) an integrated circuit substrate having a first main surface,
 (b) a first film pattern disposed over said first main surface,
 (c) a second film pattern which is made of a platinum group element or an oxide thereof and is disposed over said first film pattern,
 (d) a side-wall deposit film which has been deposited over the side wall of said second film pattern upon patterning thereof by dry etching, and
 (e) an insulating film formed directly or indirectly over said first film pattern to cover said side-wall deposit film and said second film pattern.

33. A method for manufacturing a semiconductor integrated circuit, comprising the steps of:
 (a) forming a first film over the main surface of an integrated circuit wafer,
 (b) forming thereover a second film made of an inorganic material,
 (c) forming thereover a photoresist film,
 (d) patterning said photoresist film,
 (e) dry etching said second film in the presence of said patterned photoresist film, thereby patterning said second film and at the same time, forming a side-wall deposit film over the patterned side surface of said second film, and
 (f) dry etching said first film in the presence of said patterned second film having a side-wall deposit, thereby patterning said first film.

Further inventions according to the present application will next be summarized, classified in items.

1. A method for manufacturing a semiconductor integrated circuit, comprising the steps of:
 (a) forming, over the main surface of an integrated circuit wafer, a first conductive film which constitutes a lower electrode of an information storage capacitive element of a memory cell and is made of a platinum group element or an oxide thereof,
 (b) forming thereover a first inorganic film pattern,
 (c) dry etching said first conductive film in the presence of said first inorganic film pattern, thereby patterning said first conductive film,
 (d) forming, over the patterned surface of said first conductive film and the surface of said first inorganic film pattern, a second dielectric film which constitutes a capacitive insulating film of the information storage capacitive element of said memory cell, and
 (e) forming, over said second dielectric film, a second conductive film which constitutes an upper electrode of the information storage capacitive element of said memory cell,
 wherein said first inorganic film pattern is made of any one of a silicon nitride film, a platinum film, a ruthenium film, a BST film and a PZT film and a laminate film thereof with a silicon oxide film.

2. A semiconductor integrated circuit, comprising:
 (a) an integrated circuit substrate having a first main surface,
 (b) a plurality of pillar-shaped lower electrodes each of which is disposed over said first main surface at intervals similar to or narrower than the width of the lower electrode and constitutes an information storage capacitive element of each memory cell,
 (c) a first dielectric film which is disposed over the side surface and upper surface of each of said plurality of pillar-shaped lower electrodes, constituted a capacitive insulating film of the information storage capacitive element of the memory cell and is made of a high dielectric or ferroelectric film, and
 (d) one or more than one upper electrode which is disposed over said first dielectric film disposed over the side surface and upper surface of each of said plurality of pillar-shaped lower electrodes and constitutes the information storage capacitive element of the memory cell,
 wherein a second dielectric film is formed between the upper surface of each of said plurality of pillar-shaped lower electrodes and said first dielectric film and a first area S1 of each of said plurality of pillar-shaped lower electrodes which is contiguous to said first dielectric film and a second area S2 of each of said plurality of pillar-shaped lower electrodes which is contiguous to said second dielectric film have a relation satisfying the following equation: $S1/(S1+S2)>85\%$.

3. A semiconductor integrated circuit according to the above-described item 2, wherein said first dielectric film has a dielectric constant not less than that of said second dielectric film.

4. A method for manufacturing a semiconductor integrated circuit, comprising the steps of:
   (a) forming, over the main surface of an integrated circuit wafer, a first conductive film which constitutes a lower electrode of an information storage capacitive element of a memory cell and is made of a platinum group element or an oxide thereof,
   (b) forming thereover a second conductive film which is thinner than said first conductive film,
   (c) forming thereover a first inorganic film pattern,
   (d) dry etching said first and second conductive films in the presence of said first inorganic film pattern, thereby patterning said first and second conductive films,
   (e) forming, over the patterned surfaces of said first and second conductive films, a second dielectric film which constitutes a capacitive insulating film of the information storage capacitive element of said memory cell, and
   (f) forming, over said second dielectric film, a second conductive film which constitutes an upper electrode of the information storage capacitive element of said memory cell,
   wherein upon completion of said step (d) or during over etching, said first inorganic film pattern disappears by etching.

5. A method for manufacturing a semiconductor integrated circuit according to the above-described item 4, wherein said first conductive film is at least 10 times thicker than said second conductive film.

6. A method for manufacturing a semiconductor integrated circuit according to the above-described item 5, wherein said first conductive film is made of ruthenium or iridium, or an oxide thereof and said second conductive film is made of platinum.

7. A method for manufacturing a semiconductor integrated circuit according to the above-described item 6, wherein said first inorganic film pattern is made of a silicon oxide film.

8. A semiconductor integrated circuit, comprising:
   (a) an integrated circuit substrate having a first main surface,
   (b) a plurality of pillar-shaped lower electrodes each of which is disposed over said first main surface at intervals similar to or narrower than the width of the lower electrode, constitutes an information storage capacitive element of each memory cell and contains, as a main component, ruthenium or iridium, or an oxide thereof,
   (c) a conductive film which is disposed over the upper portion of each of said plurality of pillar-shaped lower electrodes and is made of platinum,
   (d) a first dielectric film which is disposed over the side surface and upper surface of each of said plurality of pillar-shaped lower electrodes, constitutes a capacitive insulating film of the information storage capacitive element of the memory cell and is made of a high dielectric or ferroelectric film, and
   (e) one or more than one upper electrode which is disposed over said first dielectric film disposed over the side surface and upper surface of each of said plurality of pillar-shaped lower electrodes and constitutes the information storage capacitive element of the memory cell,
   wherein each of said plurality of pillar-shaped lower electrodes is at least ten times thicker than said conductive film formed thereover.

9. A method for manufacturing a semiconductor integrated circuit, comprising the steps of:
   (a) forming, over the main surface of an integrated circuit wafer, a first conductive film which constitutes a lower electrode of an information storage capacitive element of a memory cell and is made of a platinum group element or an oxide thereof,
   (b) forming thereover a second conductive film which is thinner than said first conductive film,
   (c) forming thereover a dielectric film,
   (d) forming thereover a third conductive film which constitutes an upper electrode of the information storage capacitive element of the memory cell and is made of a platinum group element or an oxide thereof,
   (e) forming thereover a fourth conductive film thinner than said third conductive film,
   (f) patterning said fourth conductive film, thereby patterning said third conductive film in the presence of the pattern of said fourth conductive film, and
   (g) patterning said second conductive film, thereby patterning said first conductive film in the presence of the pattern of said second conductive film.

10. A method for manufacturing a semiconductor integrated circuit according to the above-described item 9, wherein said first and third conductive films are each made of ruthenium or iridium, or an oxide thereof, while said second and fourth conductive films are each made of platinum.

11. A method for manufacturing a semiconductor integrated circuit according to the above-described item 10, wherein said second and fourth conductive films each remains.

BRIEF DESCRIPTION OF THE DRAWINGS

FIGS. 11(*a*) to (h) are each a cross-sectional view illustrating, in the order of step, one example of the manufacturing step of DRAM according to Embodiment 1, FIGS. 12(*a*) to (c) are each a cross-sectional view illustrating, in the order of step, one example of the manufacturing step of DRAM according to Embodiment 1;

FIGS. 18(a) to (g) are each a cross-sectional view illustrating, in the order of step, one example of the manufacturing step of the information storage capacitive element of DRAM according to Embodiment 4 of the present invention;

FIGS. 19(a) to (h) are each a cross-sectional view illustrating, in the order of step, one example of the manufacturing step of the information storage capacitive element of DRAM according to Embodiment 5 of the present invention;

FIGS. 22(a) to (f) are each a cross-sectional view illustrating, in the order of step, one example of the manufacturing step of the information storage capacitive element of DRAM according to Embodiment 8 of the present invention;

FIG. 26(g) to (j) are each a cross-sectional view illustrating, in the order of step, one example of the manufacturing step of FeRAM according to Embodiment 11 of the present invention, particularly, a portion of the information storage capacitive element of the FeRAM;

FIG. 27(a) to (h) are each a cross-sectional view illustrating, in the order of step, one example of the manufacturing step of DRAM according to Embodiment 12 of the present invention;

FIG. 32(a) to (d) are each a cross-sectional view illustrating, in the order of step, one example of the manufacturing step of DRAM according to Embodiment 16 of the present invention;

FIG. 33(a) and (b) are each a cross-sectional view illustrating, in the order of step, one example of the manufacturing step of DRAM according to Embodiment 17 of the present invention; and FIGS. 34(a) to (f) are each a schematic cross-sectional view illustrating the relation between a taper angle and a minute pattern shape.

DETAILED DESCRIPTION OF THE INVENTION

Figure 1:
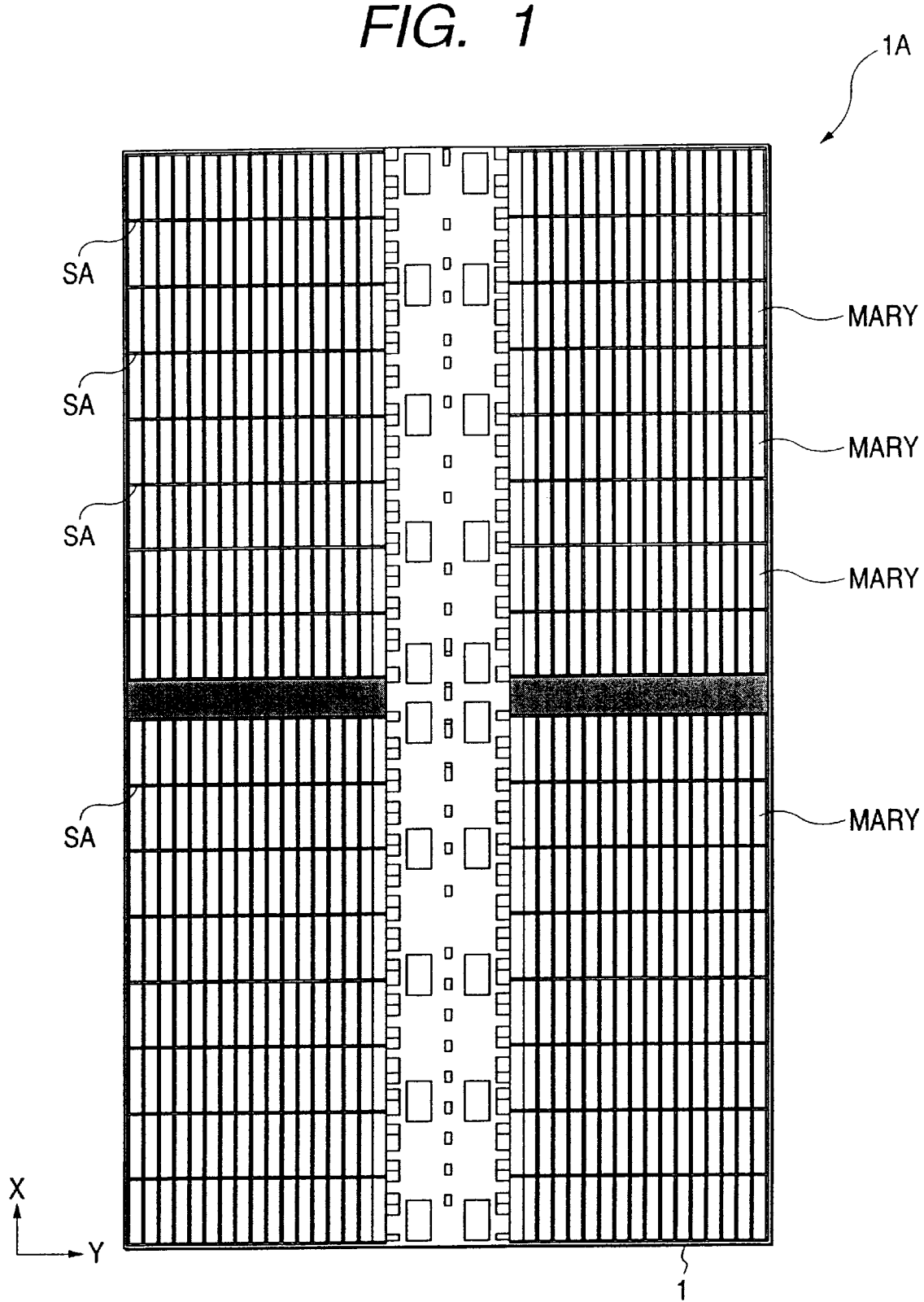
FIG. 1 is an entire plan view of a semiconductor chip having DRAM formed thereover according to one embodiment of the present invention.

Unless otherwise particularly required, description of the same or similar parts is not repeated in principle in the below-described embodiments.

If necessary for convenience sake in the below-described embodiments, description is carried out after division into plural sections or embodiments. Unless otherwise specifically indicated, these divided parts are related each other and one is a modification example, details, supplementary description or the like of the other(s).

The term "semiconductor integrated circuit" as used herein means not only that formed on a silicon wafer but also that formed on another substrate such as TFT liquid crystal devices, unless otherwise specifically indicated. The term "the main surface of a wafer" or "over the main surface of a wafer" as used herein means, according to the situation, the main surface of a substrate or the upper surface of a substrate having a monolayer or multilayer thin-film formed thereover.

In the below-described embodiments, when a description is made of the number or the like (the number, value, amount, range or the like) of the elements, the present invention is not limited to or by the described number but any number greater or less than a specific number is possible unless otherwise specifically indicated or unless otherwise limited to a specific number.

It is needless to say that in the below-described embodiments, the members (including steps) are not always essential unless otherwise specifically indicated or unless it is presumed to be obviously essential in principle.

It should be noted that, in the below-described embodiments, when a description is made of the shape, positional relation or the like of the members, they embrace those substantially akin or similar to them unless otherwise specifically indicated or unless it is presumed to be obviously essential in principle. This also applies to the above-described numerical value, range or the like.

The embodiments of the present invention will hereinafter be described in detail based on accompanying drawings. Incidentally, in all the drawings for the description of the embodiments, elements of a like function will be identified by like reference numerals and overlapping descriptions will be omitted.

Embodiment 1

FIG. 1 is an entire plan view illustrating a semiconductor chip having DRAM of Embodiment 1 formed thereon. As illustrated in this drawing, a number of memory arrays MARYs are arranged, on the main surface of a semiconductor chip 1A made of single crystal silicon, in the form of a matrix along the direction X (longitudinal direction of the semiconductor chip 1A) and the direction Y (lateral direction of the semiconductor chip 1A). Between any two of the adjacent memory arrays MARYs in the direction X, a sense amplifier SA is disposed. At the center of the main surface of the semiconductor chip 1A, word drivers WDs, control circuits such as data line selecting circuits, input/output circuits, bonding pads and the like are arranged.

Figure 2:
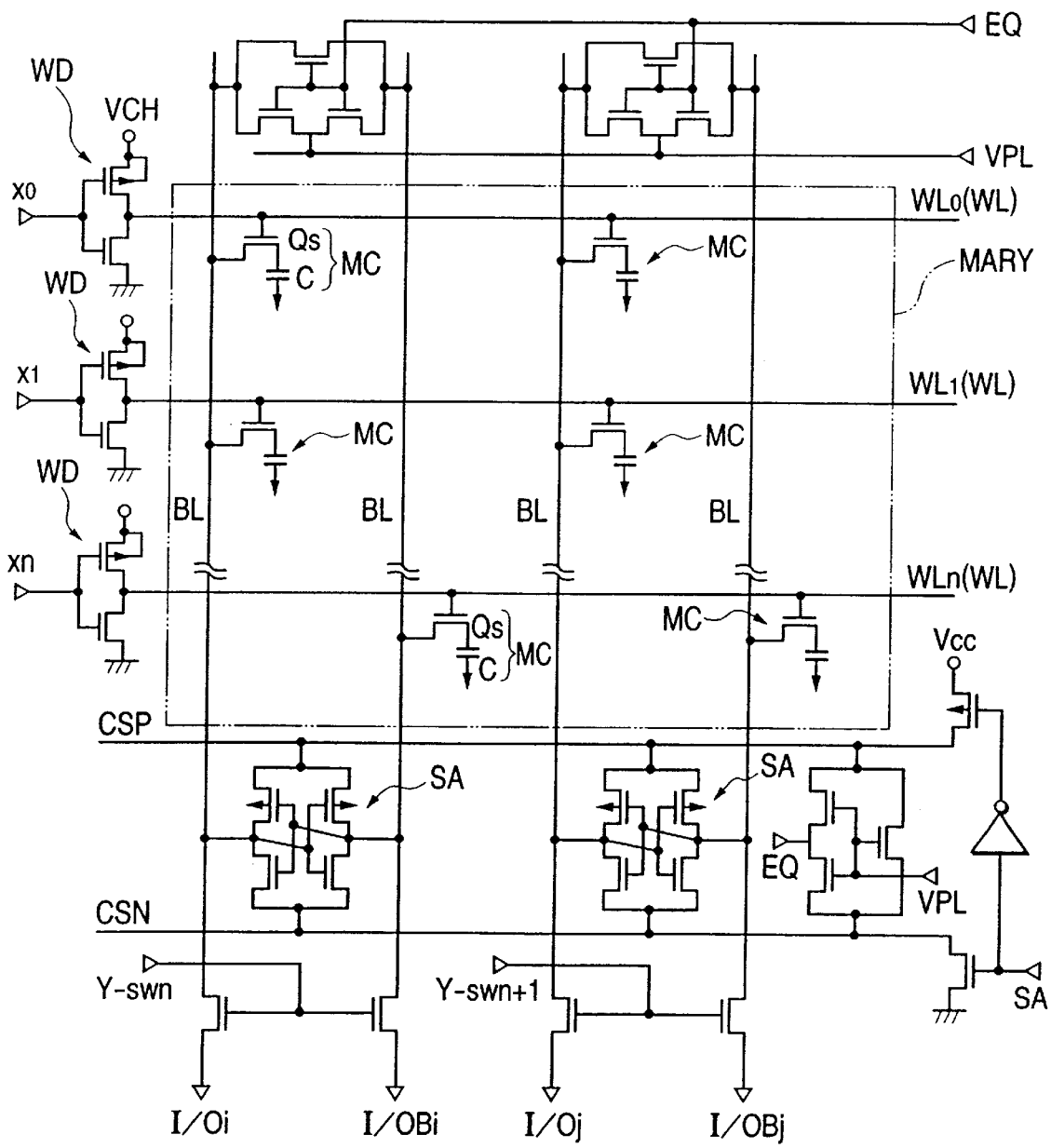
FIG. 2 illustrates an equivalent circuit of the DRAM according to Embodiment 1.

FIG. 2 illustrates an equivalent circuit of DRAM according to Embodiment 2. As illustrated in this drawing, the memory array (MARY) of this DRAM is formed of a plurality of word lines WLs (WL0, WL1, WLn . . . ) disposed in the form of a matrix, a plurality of bit lines BLs and a plurality of memory cells (MCs) disposed on the intersections of these lines. One memory cell which stores one bit of information is formed of one information storage capacitive element C and one memory-cell selecting MISFETQs connected in series therewith. Either one of a source and a drain of the memory-cell selecting MISFETQs is electrically connected with the information storage capacitive element C and the other one is electrically connected with the bit line BL. One end of the word line WL is connected with the word driver WD, while one end of the bit line BL is connected with the sense amplifier SA.

The manufacturing method of the DRAM of this embodiment will next be described in the order of step based on accompanying drawings. FIGS. 3 to 12 and FIG. 15 are each a cross-sectional view illustrating, in the order of step, one example of the manufacturing step of the DRAM according to Embodiment 1.

Figure 3:
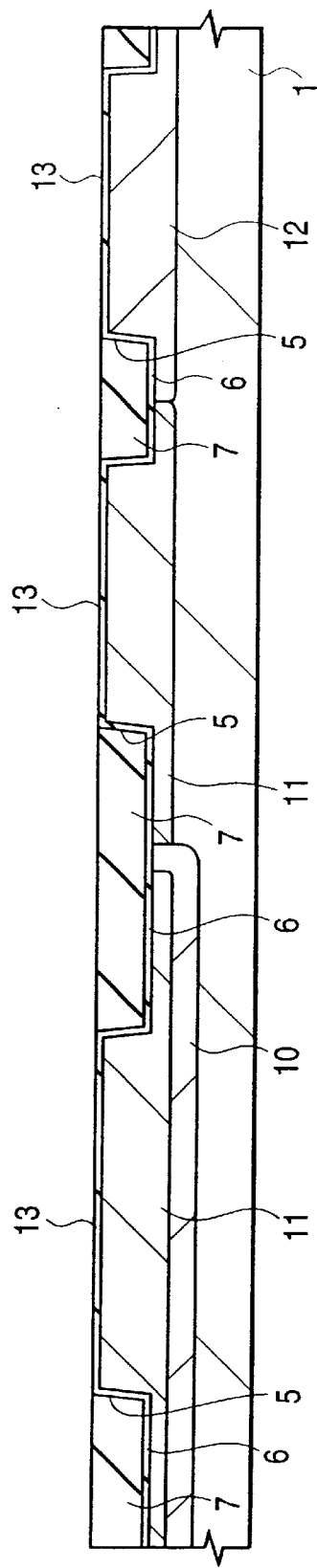
FIG. 3 is a cross-sectional view illustrating, in the order of step, one example of the manufacturing step of DRAM according to Embodiment 1.

First, as illustrated in FIG. 3, an element isolation region and a well region having impurities introduced therein are formed.

A p-type integrated circuit substrate 1 (integrated circuit wafer) which is made of single crystal silicon having a specific resistance of about 10 Ωcm is prepared. A thin silicon oxide film (not illustrated) of about 10 nm thick formed, for example, by wet oxidation at about 850° C. and a silicon nitride film (not illustrated) of about 140 nm thick formed, for example, by the CVD (chemical vapor deposition) method are deposited over the integrated circuit substrate 1. It should be noted that the term "integrated circuit wafer" as used herein means a wafer for the fabrication of a semiconductor integrated circuit or a semiconductor wafer and it includes an insulating substrate such as SOS, SOI, single crystal silicon substrate and TFT. It is needless to say that not only an unprocessed wafer but also a wafer under processing which has an insulating film or conductive film formed thereon is also included. The term "integrated circuit substrate" as used herein means not only an unprocessed wafer or a semiconductor single crystal piece which has underwent a dicing step but also a wafer during wafer process. In general, the term "semiconductor chip" means a pellet and in some cases, it means a wafer for a semiconductor integrated circuit or a semiconductor wafer and it includes an insulating substrate such as SOS, SOI, single crystal silicon substrate and TFT.

The silicon nitride film and silicon oxide film in a region wherein a groove 5 is to be formed are patterned with a photoresist mask (not illustrated) as a mask and then, the integrated circuit substrate 1 is dry etched with the resulting silicon nitride film as a mask, whereby the groove 5 of about 300 to 400 mm deep is formed in the element isolation region of the integrated circuit substrate 1.

After removal of the photoresist film, in order to remove a damage layer which has appeared on the inside wall of the groove 5 by the above-described etching, a thin silicon oxide film 6 (of about 10 nm thick) is formed on the inside wall of the groove 5, for example, by wet oxidation at about 850 to 900° C. and a silicon oxide film (not illustrated) of about 300 to 400 nm thick is deposited, for example, by the plasma CVD method using ozone ($O_3$) and tetraethoxysilane (TEOS) as source gases. This silicon oxide film may be sintered by dry oxidation at about 1000° C.

The silicon oxide film of the region other than the groove 5 is then removed by polishing by the CMP method, whereby a silicon oxide film 7 is left inside of the groove 5 to form the element isolation region. By forming a silicon nitride film in the region of the groove 5 prior to polishing by the CMP method, dishing, that is, excessively deep polishing of the silicon oxide film in the region of the groove 5 can be prevented.

The silicon oxide film and silicon nitride film remaining on the integrated circuit substrate 1 are removed, for example, by wet etching using hot phosphoric acid, followed by ion-implantation of n type impurities such as P (phosphorus) in the integrated circuit substrate 1 of the region (memory array) wherein a memory cell is to be formed, whereby an n-type semiconductor region 10 is formed. Then, p-type impurities such as B (boron) are ion-implanted to the memory array and a part (a region wherein an n-channel type MISFET is to be formed) of a peripheral circuit to form a p-type well 11, while n-type impurities such as P (phosphorus) are ion-implanted to another part of the peripheral circuit (a region wherein a p-channel type MISFET is to be formed) to form an n-type well 12. Then, impurities for adjusting a threshold voltage of MISFET such as $BF_2$ (boron fluoride) are ion-implanted to the p-type well 11 and n-type well 12. The n-type semiconductor region 10 is formed with a view to preventing the invasion of a noise through the integrated circuit substrate 1 from the input/output circuit or the like into the p-type well of the memory array.

After the surface of the integrated circuit substrate 1 is washed, for example, with an HF (hydrofluoric acid) base washing liquid, the integrated circuit substrate 1 is wet oxidized at about 850° C. to form a clean gate oxide film 13 of about 7 nm thick over the surface of each of the p-type well 11 and n-type well 12. Although no particular limitation is imposed, segregation of nitrogen on the interface between the gate oxide film 13 and the integrated circuit substrate 1 may be caused by heat treating the integrated circuit substrate 1 in an No (nitric oxide) atmosphere or $N_2O$ (nitrous oxide) atmosphere subsequent to the formation of the gate oxide film 13 (acid nitriding treatment).

Figure 4:
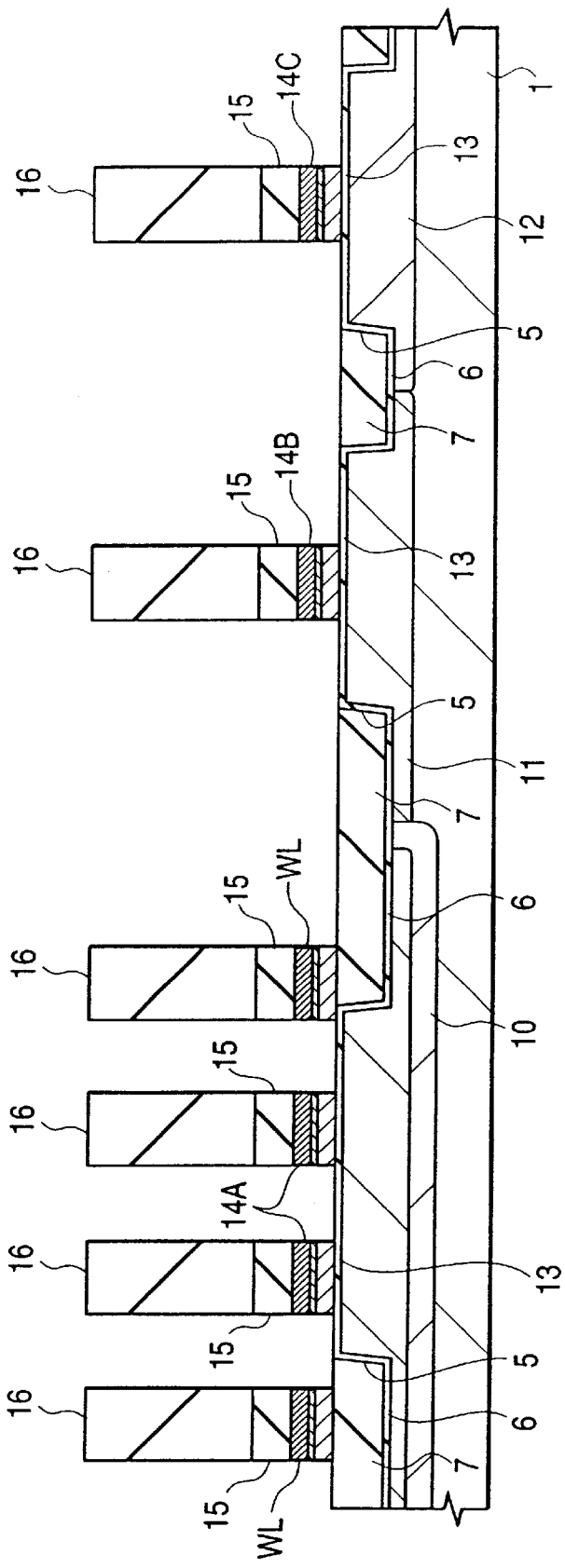
FIG. 4 is a cross-sectional view illustrating, in the order of step, one example of the manufacturing step of DRAM according to Embodiment 1.
Figure 5:
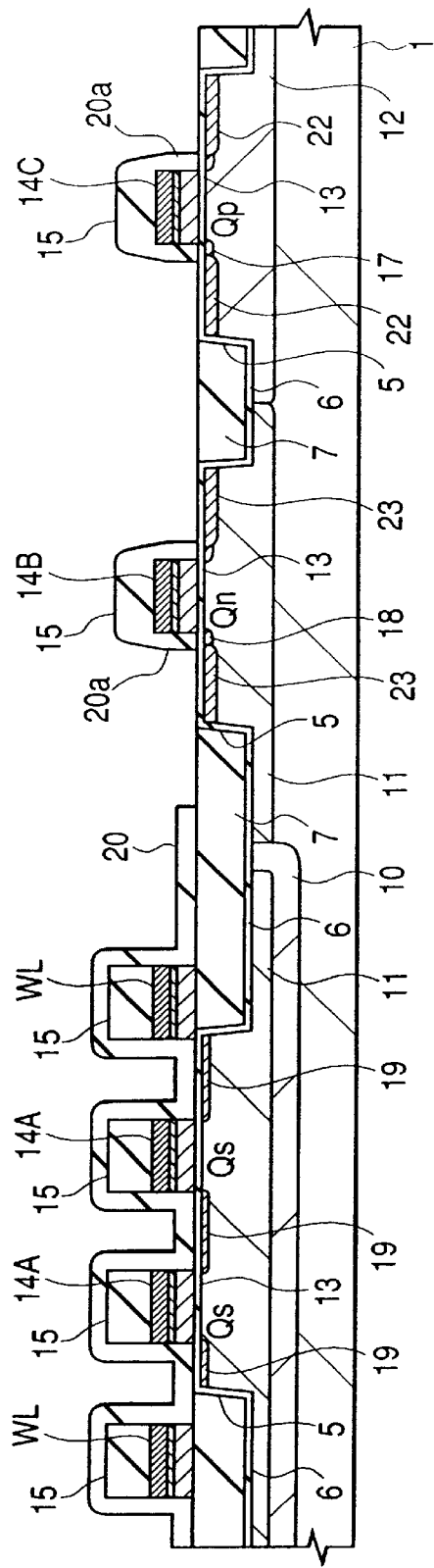
FIG. 5 is a cross-sectional view illustrating, in the order of step, one example of the manufacturing step of DRAM according to Embodiment 1.

As illustrated in FIG. 4, gate electrodes 14A, 14B and 14C are formed above the gate oxide film 13. The gate electrode 14A constitutes a portion of a memory-cell selecting MISFET and serves as a word line WL in a region other than an active region. The width of this gate electrode 14A (word line WL), that is, the gate length is adjusted to a permissible range, within which the short channel effects of the memory-cell selecting MISFET are suppressed and the threshold voltage can be maintained at a predetermined value or greater. The distance between the adjacent gate electrodes 14A (word lines WL) can be set at a size determined by the dissolution limit of photolithography. The gate electrode 14B and gate electrode 14C constitute a part of the n-channel type MISFET and p-channel type MISFET of the peripheral circuit, respectively.

The gate electrode 14A (word line WL) and gate electrodes 14B and 14C are each formed by depositing over the integrated circuit substrate 1 a polycrystalline silicon film of about 70 nm thick, which has n-type impurities such as P (phosphorus) doped therein, by the CVD method, depositing thereover a WN (tungsten nitride) film of about 50 nm thick and a W film of about 100 nm thick by the sputtering method, depositing thereover a silicon nitride film 15 of about 150 nm thick by the CVD method and then patterning these films with a photoresist film 16 as a mask. The WN film serves as a barrier layer for preventing the formation of a highly-resistant silicide layer on the interface between the W film and the polycrystalline silicon film due to the reaction therebetween upon high-temperature heat treatment. As the barrier layer, in addition to the WN film, TiN (titanium nitride) film or the like can also be employed.

After the removal of the photoresist film 16, p-type impurities such as B (boron) are ion-implanted into the n-type well 12, whereby p⁻ type semiconductor regions 17 are formed on both sides of the gate electrode 14C, while n-type impurities such as P (phosphorus) are ion-implanted into the p-type well 11, whereby n⁻ type semiconductor regions 18 are formed on both sides of the gate electrode 14B and n-type semiconductor regions 19 are formed in the p-type well 11 on both sides of the gate electrode 14A. Thus, the memory-cell selecting MISFETQs are formed in the memory array.

After deposition of a silicon nitride film 20 of about 50 to 100 nm thick above the integrated circuit substrate 1 by the CVD method, the silicon nitride film 20 of the memory array is covered with a photoresist film 21 and the silicon nitride film 20 in the peripheral circuit is subjected to anisotropic etching, whereby side wall spacers 20a are formed on the side walls of the gate electrodes 14B and 14C. For the purpose of suppressing the etched amount of the gate oxide film 13 or the silicon oxide film 7 embedded in the element isolation groove 5 to the minimum, this etching is carried out using an etching gas which makes the etching rate of the silicon nitride film 20 larger than that of the silicon oxide film. In addition, the over etching amount is suppressed to the necessary but minimum amount in order to control the etching of the silicon nitride film 15 over the gate electrodes 14B and 14C to the minimum.

After the removal of the photoresist film 21, p type impurities such as B (boron) are ion-implanted to the n-type well 12 of the peripheral circuit region to form p⁺ type semiconductor regions 22 (source and drain) of the p-channel type MISFET, while n type impurities such as As (arsenic) are ion-implanted into the p-type well 11 of the peripheral circuit region to form n⁺ type semiconductor regions 23 (source and drain) of the n-channel type MISFET. In this manner, p-channel type MISFETQP and n-channel type MISFETQn equipped with an LDD (Lightly Doped Drain) structure in the peripheral circuit region are formed.

Figure 6:
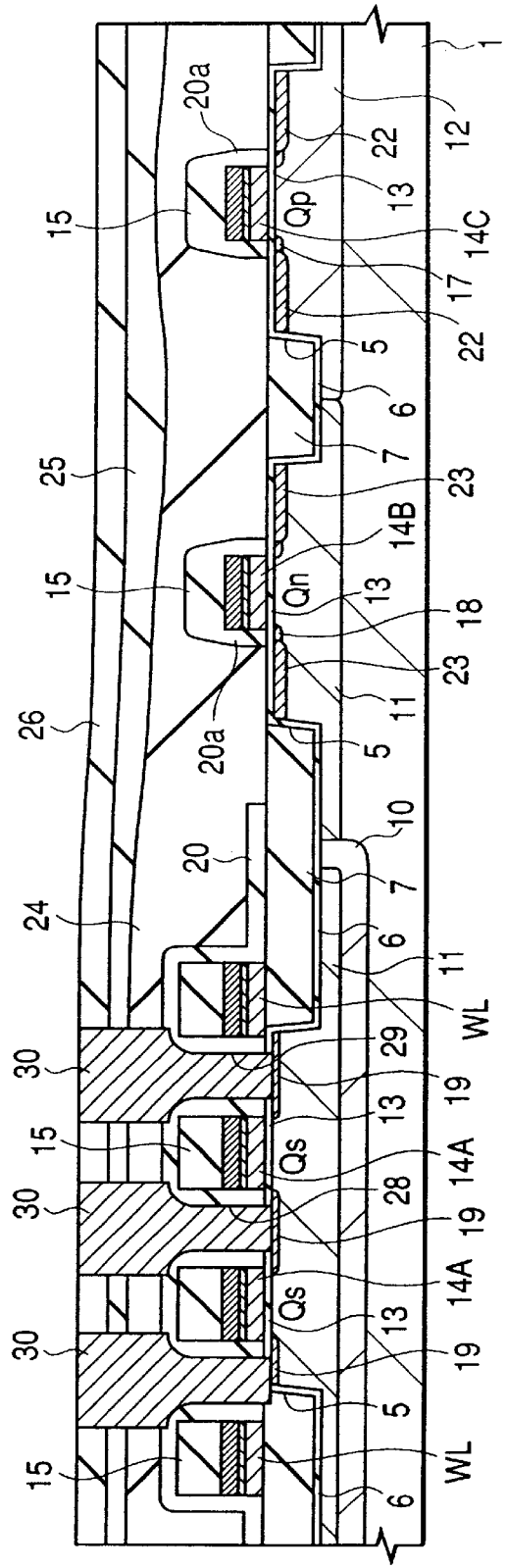
FIGS. 6 and 7 is a cross-sectional view illustrating, in the order of step, one example of the manufacturing step of DRAM according to Embodiment 1.

As illustrated in FIG. 6, an SOG (Spin On Glass) film 24 of about 300 nm thick is formed over the integrated circuit substrate 1 by spin coating, followed by heat treatment of the integrated circuit substrate 1 at 800° C. for about 1 minute to sinter the SOG film 24. After the deposition of a silicon oxide film 25 of about 600 nm thick above the SOG film 24, this silicon oxide film 25 is polished by the CMP method to flatten its surface. Over the silicon oxide film 25, a silicon oxide film 26 of about 100 nm thick is deposited. This silicon oxide film 26 is deposited to repair minute scars on the surface of the silicon oxide film 25 made upon the polishing by the CMP method. The deposition of these silicon oxide films 25 and 26 are carried out by the plasma CVD method using, for example, ozone ($O_3$) and tetraethoxysilane (TEOS) as source gases. A PSG (Phospho Silicate Glass) film or the like may be deposited instead of the silicon oxide film 26.

By dry etching with a photoresist film as a mask, the silicon oxide films 26 and 25, and SOG film 24 above the n type semiconductor regions 19 (source and drain) of the memory-cell selecting MISFETQs are removed. This etching is carried out under conditions to permit the etching rate of the silicon oxide films 26 and 25, and SOG film 24 to become larger than that of the silicon nitride film 20, whereby a portion of the silicon nitride film 20 which has covered the upper part of the n type semiconductor regions 19 and the element isolating groove 5 is not removed completely. Then, the silicon nitride film 20 and gate oxide film 13 above the n type semiconductor regions 19 (source and drain) of the memory-cell selecting MISFETQs are removed by dry etching with the photoresist film as a mask, whereby a contact hole 28 is formed above one of the n-type semiconductor regions 19 (source and drain), while a contact hole 29 is formed above the other region. This etching is carried out under conditions to permit the etching rate of the silicon nitride film 15 to become larger than that of the silicon oxide films (the gate oxide film 13 and silicon oxide film 7 in the element isolating groove 5) in order to prevent the deep etching of the n-type semiconductor regions or element isolation groove 5. In addition, this etching is carried out under conditions to permit anisotropic etching of the silicon nitride film 20, whereby the silicon nitride film 20 remains on the side walls of the gate electrode 14A (word line WL). In this manner, contact holes 28,29 having a minute diameter not greater than the dissolution limit of photolithography are formed in self alignment with the gate electrode 14A (word line WL). It is also possible to form the contact holes 28,29 in self-alignment with the gate electrode 14 (word line WL) by subjecting the silicon nitride film 20 to anisotropic etching and forming side wall spacers on the side walls of the gate electrode 14A (word line WL) in advance.

After the removal of the photoresist film, the dry etching residue, photoresist residue and the like on the surface of the substrate which is exposed at the bottom portions of the contact holes 28,29 are removed using an etchant such as a mixture of hydrofluoric acid and ammonium fluoride. Then a plug 30 is formed inside of the contact holes 28,29. The formation of the plug 30 is conducted by depositing, over the silicon oxide film 26 by the CVD method, a polycrystalline silicon film having n type impurities (ex. P (phosphorus)) doped therein and then, polishing the resulting polycrystalline silicon film by the CMP method, thereby leaving it inside of the contact holes 28,29.

Figure 7:
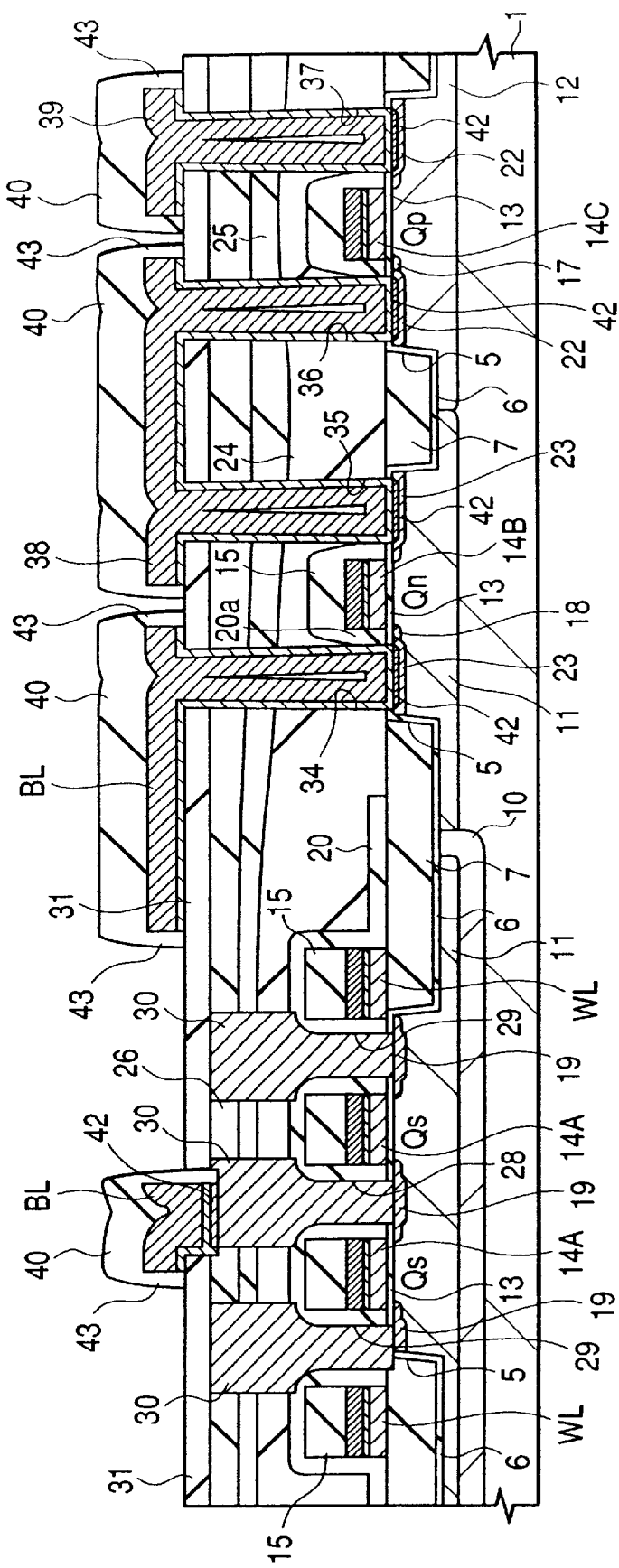

As illustrated in FIG. 7, a silicon oxide film 31 of about 200 nm thick was deposited over the silicon oxide film 26, followed by the heat treatment of the integrated circuit substrate 1 at about 800° C. This silicon oxide film 31 is deposited by the plasma CVD method using, for example, ozone ($O_3$) and tetraethoxysilane (TEOS) as source gases. This heat treatment causes diffusion of n type impurities, which are contained in the polycrystalline silicon film constituting the plug 30, from the contact holes 28,29 to the n type semiconductor regions 19 (source and drain) of the memory-cell selecting MISFETQs, whereby the resistance of the n type semiconductor region 19 is reduced.

By the dry etching with the photoresist film as a mask, the silicon oxide film 31 above the contact hole 28 is removed, whereby the surface of the plug 30 appear. The silicon oxide films 31, 26, 25, SOG film 24 and gate oxide film 13 are then removed from the peripheral circuit region by dry etching with a new photoresist film as a mask, whereby contact holes 34,35 are formed above the $n^+$ type semiconductor regions 23 (source, drain) of the n-channel type MISFETQn, while contact holes 36,37 are formed above the $p^+$ type semiconductor regions 22 (source, drain) of the p-channel type MISFETQP.

After the removal of the photoresist film, a bit line BL and first interconnection layers 28,29 of the peripheral circuit are formed over the silicon oxide film 31. The bit line BL and first interconnection layers 28,29 are formed by depositing a Ti film of about 50 nm thick over the silicon oxide film 31 by the sputtering method, heat treating the integrated circuit substrate 1 at about 800° C., depositing a TiN film of about 50 nm thick over the resulting Ti film by the sputtering method, depositing a W film of about 150 nm and a silicon nitride film 40 of about 200 nm thick over the resulting TiN film by the CVD method and then patterning these films with a photoresist film as a mask.

By the heat treatment of the integrated circuit substrate 1 at about 800° C. after the deposition of the Ti film over the silicon oxide film 31, the TiN film reacts with the underlying Si and a low-resistant $TiSi_2$ (titanium silicide) layer 42 is formed on the surfaces of the $n^+$ type semiconductor regions 23 (source, drain) of the n-channel type MISFETQn, the surfaces of the $p^+$ type semiconductor regions 22 (source, drain) of the p-channel type MISFETQp and the surface of the plug 30, which makes it possible to reduce the contact resistance of the interconnections (bit line BL, first interconnection layers 38,39) to be connected with the $n^+$ type semiconductor regions 23, $p^+$ type semiconductor regions 22 and plug 30. In addition, the sheet resistance of the bit line BL can be reduced by forming it from a W film, TiN film and Ti film, which makes it possible to increase the information read rate and write rate and also to form the bit line BL and the first interconnection layers 38,39 of the peripheral circuit in one step simultaneously, thereby decreasing the number of the manufacturing steps of DRAM. Moreover, when the first interconnection layers (38,39) of the peripheral circuit are formed of the same interconnection layer with the bit line BL, the aspect ratio of the contact holes (34 to 37) which are to connect the MISFETs (n channel type MISFETQn, p channel type MISFETQp) of the peripheral circuit with the first interconnection layer can be decreased compared with the formation of the first connection layer from the Al interconnection above the memory cell, leading to the improvement in the connection reliability of the first interconnection layer.

In order to reduce the parasitic capacity formed between two adjacent bit lines BL as much as possible, thereby improving the read rate and write rate of the information, the bit lines BL are formed so that the space therebetween becomes wider than their width.

After the removal of the photoresist film, side wall spacers 43 are formed on the side walls of the bit line BL and the side walls of the first interconnection layers 38,39. These side wall spacers 43 are formed by depositing a silicon nitride film over the bit line BL and first interconnection layers 38,39 by the CVD method and then subjecting the resulting silicon nitride film to anisotropic etching.

Figure 8:
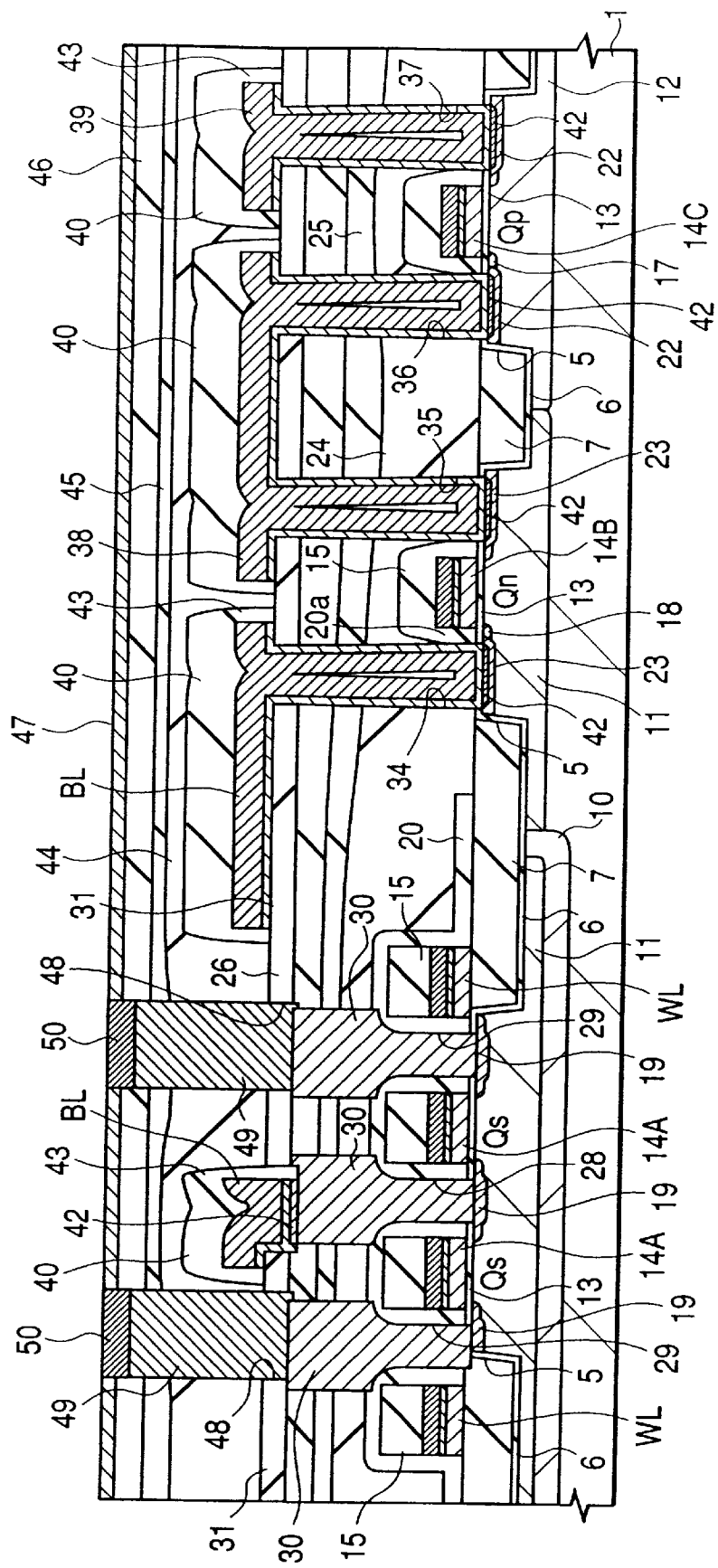
FIG. 8 is a cross-sectional view illustrating, in the order of step, one example of the manufacturing step of DRAM according to Embodiment 1.

As illustrated in FIG. 8, an SOG film 44 of about 300 nm thick is spin-coated above the bit line BL and first interconnection layers 38,39, followed by sintering of the SOG film 44 by heat treatment at 80° C. for about 1 minute. Since the SOG film 44 has high reflow properties and therefore has excellent gap filling properties between the minute interconnections compared with the BPSG film, the space between the bit lines which have been miniaturized even to the resolution limit. of photolithography can be filled well.

Subsequent to the deposition of a silicon oxide film 45 of about 600 nm thick over the SOG film 44, the silicon oxide film 45 is polished by the CMP method to flatten its surface. The deposition of this silicon oxide film 45 is carried out by the plasma CVD method using ozone ($O_3$) and tetraethoxysilane (TEOS) as source gases.

In this embodiment, even rightly after the bit line BL and first interconnection layers 38,39 are formed, the SOG film 44 having good flatness is applied to them and the silicon oxide film 45 deposited thereover is flattened by the CMP method, which makes it possible to improve filling properties of the minute gap between the bit lines BL and also to actualize the flattening of the insulating film over the bit line BL and first interconnection layers 38,39.

Over. the silicon oxide film 45, a silicon oxide film 46 of about 100 nm thick is then deposited. The deposition of this silicon oxide film 46 is carried out in order to repair minute scars on the surface of the silicon oxide film 45 made upon polishing by the CMP method. The silicon oxide film 46 is deposited by the plasma CVD method using, for example, ozone ($O_3$) and tetraethoxysilane (TEOS) as source gases.

A titanium nitride film 47 of about 50 nm thick is then deposited over the silicon oxide film 46. The deposition of this titanium nitride film 47 is conducted by the CVD method or sputtering method. This titanium nitride film 47 serves as a stopper film upon etching of a ruthenium film which will be described later.

By dry etching with a photoresist film as a mask, the titanium nitride film 47 above the contact hole 29 is removed, followed by the removal of the silicon oxide films 46,45, SOG film 44 and silicon oxide film 31, whereby a through-hole 48 reaching the surface of the plug 30 is formed. The etching of these silicon oxide base films is carried out under conditions permitting the etching rate of the silicon nitride film to become smaller relative to that of the silicon oxide films 46,45,31 and SOG film 44, whereby deep etching of the silicon nitride film 40 above the bit line 40 and the side wall spacers 43 is prevented even if the misalignment occurs between the through-hole 48 and the bit line BL. In this manner, the through-hole 48 is formed in self-alignment with the bit line BL.

After the removal of the photoresist film, the dry etching residue or photoresist residue on the surface of the plug 30 which appears at the bottom of the through-hole 48 is removed by an etchant such as a mixture of hydrofluoric acid and ammonium fluoride. The SOG film 44 which has appeared on the side walls of the through-hole 48 is also exposed to the etchant, but this wet etching treatment does not cause a large undercut of the side walls of the through-hole 48, because the etching rate of the SOG film 44 by the hydrofluoric-acid base etchant has been reduced by the above-described sintering at about 800° C.

Next, a plug 49 is formed inside of the through-hole 48. No particular limitation is imposed on the material of the plug 49 insofar as it is conductive. Examples include polycrystalline silicon and metal compounds such as titanium nitride. This plug 49 can be formed, for example, by depositing, over the whole surface of the integrated circuit substrate 1, a polycrystalline silicon film to be embedded in the through-hole 48 and then etching back this polycrystalline silicon film.

Then, a barrier metal 50 is formed over the plug 49. This barrier metal 50 is to be formed between the lower electrode of an information storage capacitive element which will be described later and the plug 49 and serves to suppress the reaction between the lower electrode and plug 49 upon pyrogenic treatment, such as heat treatment, of the capacitive insulating film of the information storage capacitive element. As a material for the barrier metal 50, an alloy of titanium, aluminum and silicon can be employed. This barrier metal 50 can be formed, for example, by depositing the above-described alloy over the entire surface of the integrated circuit substrate 1 and then etching back a portion of the above-described alloy other than the region of the through-hole 48. Polishing by the CMP method can be employed instead of the etching back.

Figure 9:
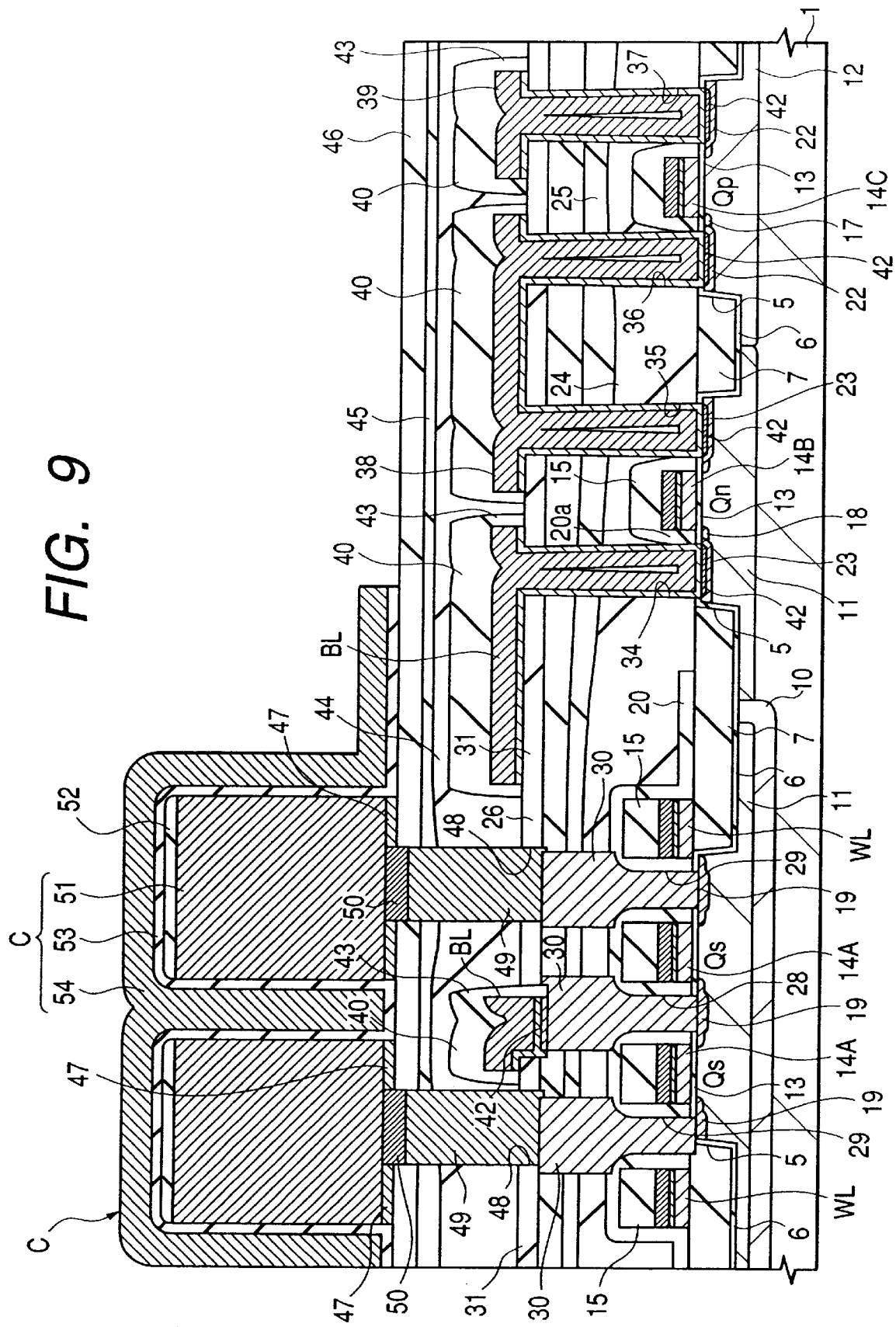
FIG. 9 is a cross-sectional view illustrating, in the order of step, one example of the manufacturing step of DRAM according to Embodiment 1.

As illustrated in FIG. 9, an information storage capacitive element C having a pillar-shaped lower electrode 51 made of a ruthenium metal, a capacitive insulating film 53 made of BST and an upper electrode 54 made of a ruthenium metal is then formed. The use, as the lower electrode 51, of a ruthenium metal having high affinity with BST makes it possible to employ a BST film, which is a high dielectric or ferroelectric substance, as the capacitive insulating film 53. In addition, by the use of a ruthenium metal as the upper electrode 54, it is possible to constitute an MIM (Metal Insulator Metal) capacitor having a high dielectric BST film as an insulating film, while imparting it with good affinity. Such a constitution makes it possible to actualize a DRAM of 1 Gbit or greater. The term "high dielectric substance" as used herein means a substance, such as BST, having a specific dielectric constant not less than 50. Examples of the high dielectric substance generally include $ABO_3$ type perovskites and substances having a similar structure. The term "ferroelectric substance" as used herein means a substance, such as PZT, having a specific dielectric constant not less than 100. Examples generally include $ABO_3$ perovskites and substances having a similar structure (complex structure or laminate structure).

On the upper surface of the pillar-shaped lower electrode 51, the silicon oxide film 52, which is a part of a hard mask used upon etching of a ruthenium film which will be described later, remains. A description on the process-wise merit brought by leaving the silicon oxide film 52 on the lower electrode will be made later- Since the silicon oxide film 52 is left on the lower electrode, there exists between the lower electrode 51 and the capacitive insulating film 53 the silicon oxide film 52 having a small dielectric constant, which lowers the effectiveness of the upper surface of the lower electrode 51 functioning practically as a capacitor. The lower electrode 51 is however formed in a rectangular plane pattern having a longer side in the direction of a bit line (direction x) as illustrated in the plan view of FIG. 10(a) and in the slender pillar-shaped form as illustrated in the perspective view of FIG. 10(b). The lower electrode 51 in this embodiment has a size of 0.39 $\mu$m in the longer side direction and 0.13 $\mu$m in the shorter side direction of the plane pattern and the pattern space is 0.13 $\mu$m. The height of the pillar-shaped lower electrode 51 is 0.45 $\mu$m. Based on these values, the surface area of the lower electrode 51 which is to serve as a capacitor is the sum of the area of the upper surface portion 51a (0.13 $\mu$m×0.39 $\mu$m=0.0507 $\mu m^2$) and the area of the side surface portion 51b (0.13 $\mu$m×0.45 $\mu$m×2+0.39 $\mu$m×0.45 $\mu$m×2=0.468 $\mu m^2$) Even if the upper portion 51a of the lower electrode 51 does not function as a capacitor, the area (0.468 $\mu m^2$) of the side surface portion 51b of the lower electrode 51 amounts to about 90% of the whole surface area (0.5187 $\mu m^2$) So that the reduction in the total capacity is only 10% or so. In other words, a marked reduction in the storage performance of the information storage capacitive element C does not occur. Such a reduction of the capacity is within a permissible range. The process-wise merit, which will be described later, contributes to simplification of the manufacturing steps, improvement in the reliability and the like. From the total point of view, the application of the present invention therefore brings about large technical effects.

It should be noted that a contribution ratio of the upper surface portion 51a of the lower electrode 51 as a capacitor is presumed to be about 3% or less.

Figure 10A:
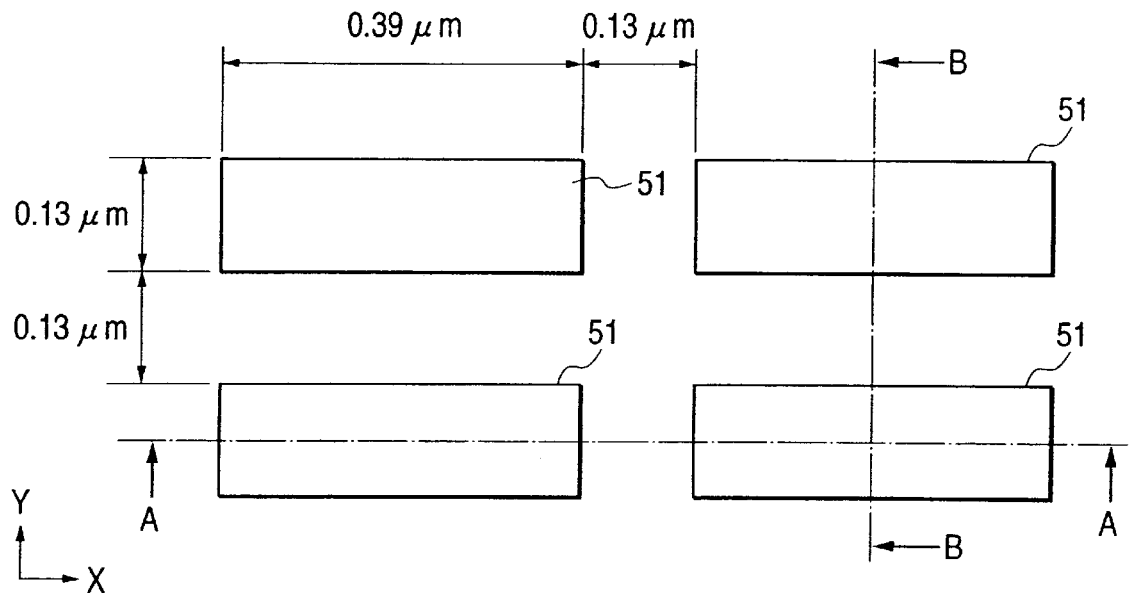
FIG. 10(*a*) is a plan view of a lower electrode pattern and (*b*) is a perspective view of a lower electrode.
Figure 10B:
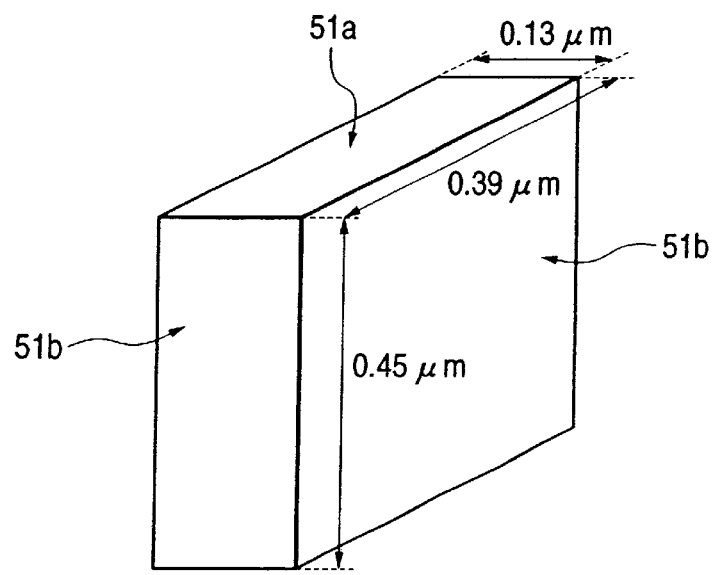

In FIG. 10(a), the plane pattern is drawn as a rectangular shape, but the lower electrode 51 is actually not in such a rectangular form but is formed to have round edges or having a taper. The plane pattern drawn in FIG. 10(a) is that of photolithography. It is needless to say that the exact reproduction of a pattern is impossible owing to the diffraction of exposure light or the like and the plane pattern is actually formed as a shape close to an ellipse.

Figure 12A:
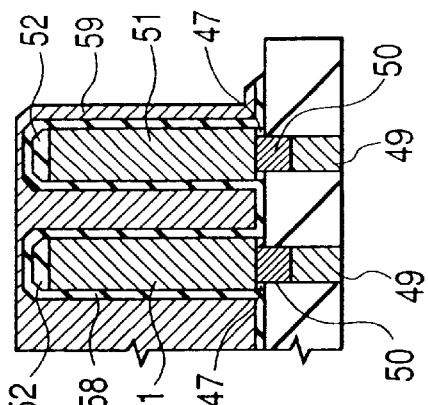
Figure 12B:
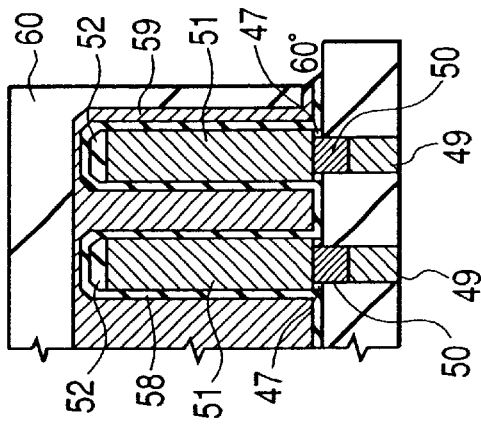
Figure 12C:
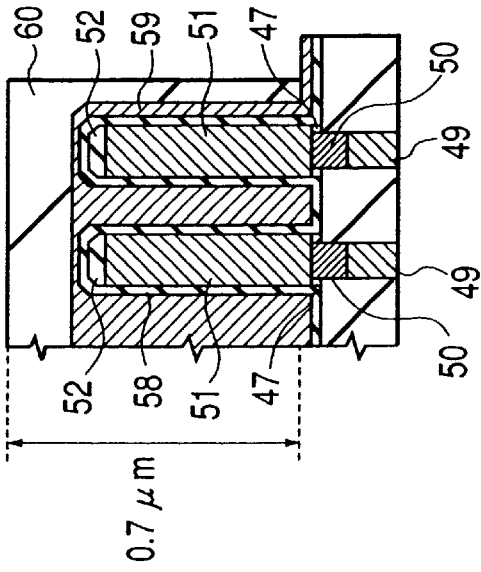

The formation steps of the information storage capacitive element C will next be described in accordance with FIGS. 11 and 12. FIGS. 11 and 12 are each a cross-sectional view illustrating, in the order of step, one example of the manufacturing step of the information storage capacitive element of the DRAM according to Embodiment 1. The pillar-shaped lower electrode 51 is, as described above, in the rectangular and pillar shape. The cross-sectional view of the information storage capacitive element C illustrated in FIG. 9 is taken along line A—A in FIG. 10(a). In FIGS. 11 and 12, on the other hand, the cross-section taken along line B—B in FIG. 10(a) will be described. In a minute processing region to which the present invention is applied, the lower electrodes 51 are formed in the direction of the cross-section along line B—B in FIG. 10(a) with a pattern width of 0.13 $\mu$m, pattern space of 0.13 $\mu$m and pattern height of 0.45 $\mu$m. The formation of a lower electrode having such a high aspect ratio markedly heightens the technical difficulty in consideration of the formation of the lower electrode 51 from a platinum group element such as ruthenium which has difficulty in anisotropic etching. The significance of the present invention however resides in actualizing such technically difficult etching, thereby forming the information storage capacitive element C simply and with good reliability without impairing the precisely processed shape. With a view to clearly describing the features of the present invention, a cross-section taken along line B—B which is a direction difficult in etching will next be described. In FIGS. 11 and 12, only the part of the information storage capacitive element C is illustrated.

After the above-described step in FIG. 8, a ruthenium film 55 and a silicon oxide film 56 are formed, as illustrated in FIG. 11(a), over the titanium nitride film 47 and a patterned photoresist film 57 is formed on the silicon oxide film 56.

The ruthenium film 55 can be formed, for example, by the sputtering or CVD method to a thickness of 0.45 $\mu$m. The ruthenium film 55 is to be the lower electrode 51 later and its film thickness will correspond to the height of the lower electrode 51. The height of the lower electrode 51 can therefore be adjusted by the adjustment of the thickness of the ruthenium film 55. Instead of the ruthenium film 55, a ruthenium dioxide film can be used.

The silicon oxide film 56 serves as a hard mask for etching of the ruthenium film 55 and its composition and thickness are determined in consideration of a decrease in the subsequent etching step. Here, as the silicon oxide film 56, use of a silicon oxide film (which will hereinafter be called "PTEOS film") formed by the plasma CVD method using as a raw material gas a TEOS (tetramethoxysilane) gas is exemplified. In consideration of a decrease in the film thickness by the subsequent etching step, the thickness of the PTEOS film is set at about 0.3 $\mu$m.

The photoresist mask 57 is employed as a mask for the patterning of the silicon oxide film 56 and is formed by the ordinary photolithography step. For patterning, the plane pattern of the lower electrode 51 as illustrated in FIG. 10(*a*) is employed. In the cross-sectional view of FIG. 11(*a*), the lower electrodes are formed at a line and space of 0.13 $\mu$m. The pattern is formed above the plug 49 (barrier metal 50) so that the lower electrode 51 will be connected with the plug 49 (barrier metal 50) later. The thickness of the photoresist mask 57 is set, for example, at 0.3 $\mu$m. It is possible to employ EB (Electron Beam) resist as the photoresist 57 in consideration of the improvement in the resolution.

As illustrated in FIG.(b), the silicon oxide film 56 is patterned with the photoresist film 57 as a mask, whereby a silicon oxide film to be a hard mask is formed. Since the silicon oxide film 56 can be etched with good anisotropy, the silicon oxide film 52 can reproduce the pattern of the photoresist film 57 with good reproducibility, which makes it possible to maintain a line and space of 0.13 $\mu$m at the bottom portion of the silicon oxide film 52. For the etching of the silicon oxide film 56, narrow electrode reactive ion etching can be employed. Etching is carried out under the following conditions: a reaction pressure of 50 m Torr, voltage of 1 kW charged to each of the upper electrode and lower electrode, feeding of octafeluorine tetracarbonate ($C_4F_8$), argon and oxygen at flow rates of 12 sccm, 400 sccm and 5 sccm, respectively and a substrate temperature of 0° C. Under such etching conditions, the etching rate of the PTEOS film is about 300 nm/min and the selection ratio to the photoresist film 57 is about 3. Upon completion of the etching of the silicon oxide film 56, therefore, the photoresist film 57 of about 100 nm thick remains on the silicon oxide film 52.

As illustrated in FIG. 11(*c*), the photoresist film 57 is removed. The photoresist film 57 is removed, for example, by ashing with oxygen plasma. By the removal, patterned silicon oxide film 52 is formed and it can be used as an etching mask for the subsequent etching step of the ruthenium film 55. As will be described later, the ruthenium film 55 is etched by an oxygen base gas so that an oxidation resistant mask is necessary. The mask made of the silicon oxide film 52 satisfies this requirement. Next, as illustrated in FIG. 11(*d*), the lower electrode 51 is formed by etching the ruthenium film 55 with the silicon oxide film 52 as a mask. This ruthenium film 55 can be etched by the method as described below.

Figure 13:
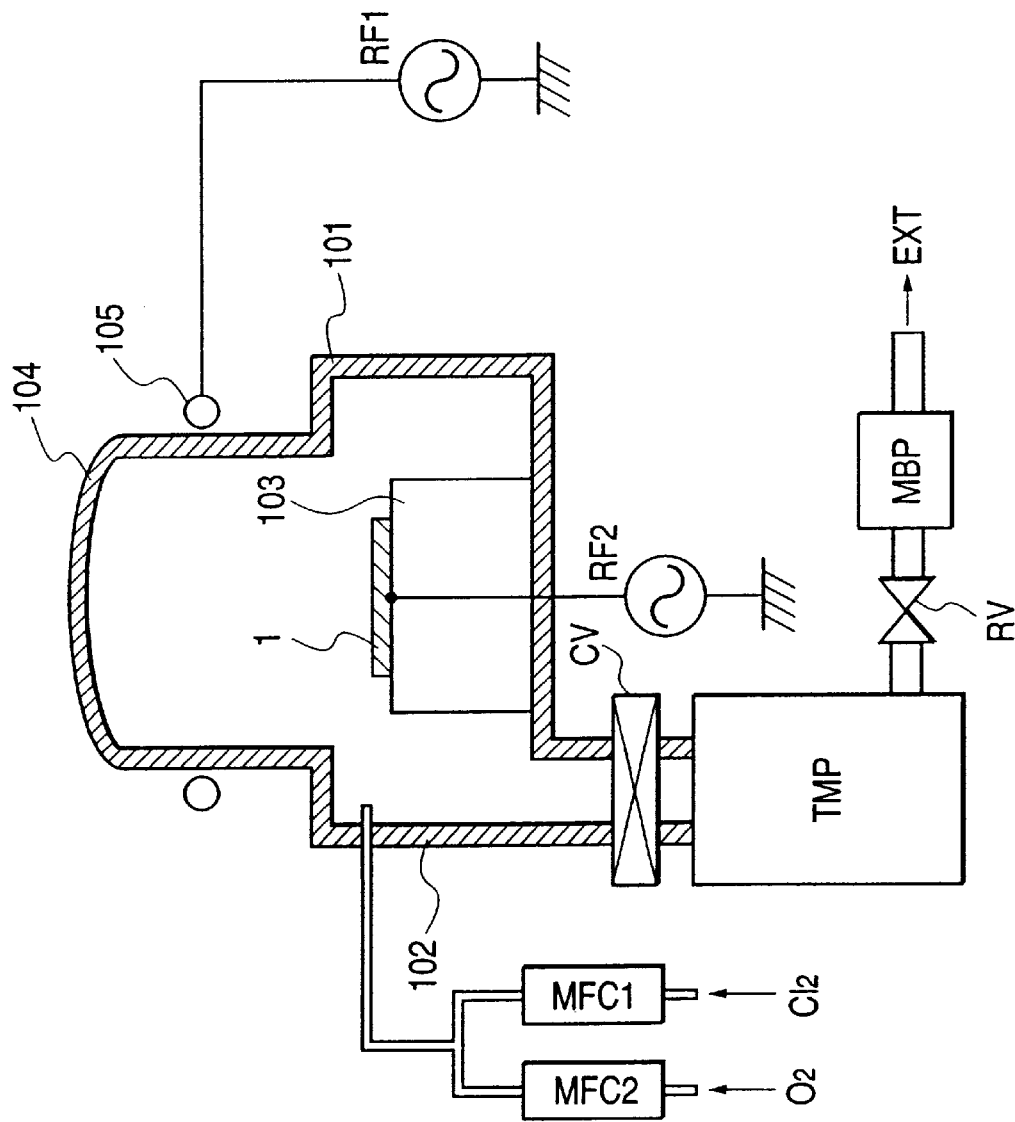
FIG. 13 is a schematic cross-sectional view illustrating one example of an etching apparatus used for the etching of a ruthenium film.

FIG. 13 is a schematic cross-sectional view illustrating one example of an apparatus used for the etching of the ruthenium film 55. This etching apparatus has an oil-free exhaust system formed of a reaction chamber 101 having an internal volume of about 33.3 liters, a vacuum pipe 102 connected with the exhaust port of the reaction chamber 101, a control valve CV disposed on the midway of the vacuum pipe 102, a turbo molecular pump TMP connected with another end of the vacuum pipe 102 and a mechanical booster pump (displacement type roughing vacuum pump) MBP connected with the exhaust port of the turbo molecular pump TMP via a roughing valve RV. The reaction chamber 101 has a mechanical strength sufficient for maintaining the vacuum condition, whereby its inside can be adjusted to high vacuum condition by the above-described exhaust system. Moreover, the pressure inside of the reaction chamber 101 can be adjusted to a desired value by the control of a conductance by the control valve CV upon exhausting, from the exhaust system, of a treatment gas (etching gas) supplied from a gas feeding system which will be described later.

A roughing vacuum system which conducts vacuum drawing of the reaction chamber 101 from atmospheric pressure to the low vacuum-degree region may be disposed, but its illustration is omitted. As a roughing exhaust system, the mechanical booster pump MBP can be replaced with a turbo type dry pump, oil rotary pump or the like.

This etching apparatus has a gas feeding system in which a chlorine gas ($Cl_2$) and an oxygen gas ($O_2$) are introduced into the reaction chamber 101 via the mass flow controller MFC1 and mass flow controller MFC2, respectively. A proper valve (stopper valve) can be inserted into the input/output side of each of the mass flow controllers or at just before the gas introduction part of the reaction chamber 101, but is not illustrated. The gas feeding system can be equipped with a proper purging system but its illustration is also omitted. In addition, a manifold is also installed at a position where a chlorine gas and an oxygen gas are mixed, but its illustration is omitted. Another gas system, for example, a fluorine gas feeding system for etching of a silicon oxide film or a gas system for resist ashing can also be installed.

In the reaction chamber 101, a specimen holder 103 is installed. As illustrated in the drawing, a semiconductor substrate (a wafer for the fabrication of a semiconductor integrated circuit) 1 is placed on this specimen holder 103 with face up. The integrated circuit substrate 1 is, for example, a silicon wafer having a diameter of 6 inches and is supported, for example, by a static chuck. As illustrated in the drawing, this etching apparatus is a single wafer etching apparatus for introducing one wafer into the reaction chamber 101.

As also illustrated, a gas is fed from a gas feeding nozzle 110. The specimen holder 103 is electrically isolated from the reaction chamber 101 and it is designed so that a high-frequency voltage RF2 for bias can be applied to it. A high-frequency bias can therefore be applied to the integrated circuit substrate 1.

The upper portion of the reaction chamber 101 is vacuum locked by a quartz cylinder 104 and an inductively coupled coil 105 is disposed around the quartz cylinder 104. The inductively coupled coil 105 is connected, for example, with a high-frequency power source RF1 of 13.56 MHz. The power from the high-frequency power source RF1 generates plasma in the quartz cylinder 104 and reaction chamber 104 by inductive coupling via the inductively bonded coil 105. In this manner, high-density plasma is generated at low operating pressure (high vacuum region) by using inductively coupled plasma. The apparatus usable in this embodiment is not limited to that using inductively coupled plasma, but a mechanism of generating plasma at low pressure can also be adopted. Examples include ECR (Electron Cycrotoron Resonance) plasma, ICP (Inductively Coupled Plasma), magnetron RIE plasma and helicon wave plasma.

The outline of the etching apparatus used in this embodiment is as described above. Next, characteristics of the apparatus upon etching of the ruthenium film 55 with good anisotropy will be described. In short, an etching gas is fed at a large flow rate in order to carry out etching of the ruthenium film 55 with good anisotropy and this gas is exhausted at a high velocity. In addition, over etching in this embodiment is larger than ordinary over etching. The concept of over etching will be described later.

The etching apparatus in this embodiment makes it possible to feed oxygen and chorine gases at a total gas flow rate of 2000 sccm. In order to obtain a sufficiently low operating pressure (ex. 15 mTorr) even if such a large flow rate of gas is fed, a turbo molecular pump TMP having the maximum exhaust capacity of 2000 liters/sec is employed. It is needless to say that with a view to maintaining the maximum exhaust capacity (compression ratio) of the turbo molecular pump TMP, an exhaust capacity (an exhaust velocity of the mechanical booster pump MBP including the conductance of the roughing valve RV and pipe) of the roughing system sufficient to reduce its back pressure as low as possible is maintained.

Since the exhaust system is constituted, as described above, by using the turbo molecular pump TMP having an exhaust velocity of 2000 liters/sec, the effective exhaust velocity available is about 600 liters/sec, for example, when the total gas flow rate of oxygen and chlorine is about 800 sccm. The term "effective exhaust velocity of the exhaust system" as used herein means an exhaust velocity of the whole exhaust system including the vacuum pipe 102, conductance of the control valve CV, the turbo molecular pump TMP and the roughing exhaust system (mechanical booster pump MBP, roughing valve RV and pipe).

A description will next be made of the etching method of the ruthenium film 55 by using the above-described etching apparatus.

The mass flow controllers MFC 1,2 are adjusted to feed the reaction chamber 101 with chlorine and oxygen at flow rates of 80 sccm and 720 sccm, respectively. The pressure is adjusted to 15 mTorr by the controller valve CV. From the high-frequency power sources RF1,2, high-frequency powers of 500 W and 200 W are applied to the inductively coupled coil 105 and substrate, respectively, whereby plasma is generated. Oxygen ions or oxygen radicals produced by the plasma mainly react with the ruthenium film 55, whereby etching is carried out.

Figure 14:
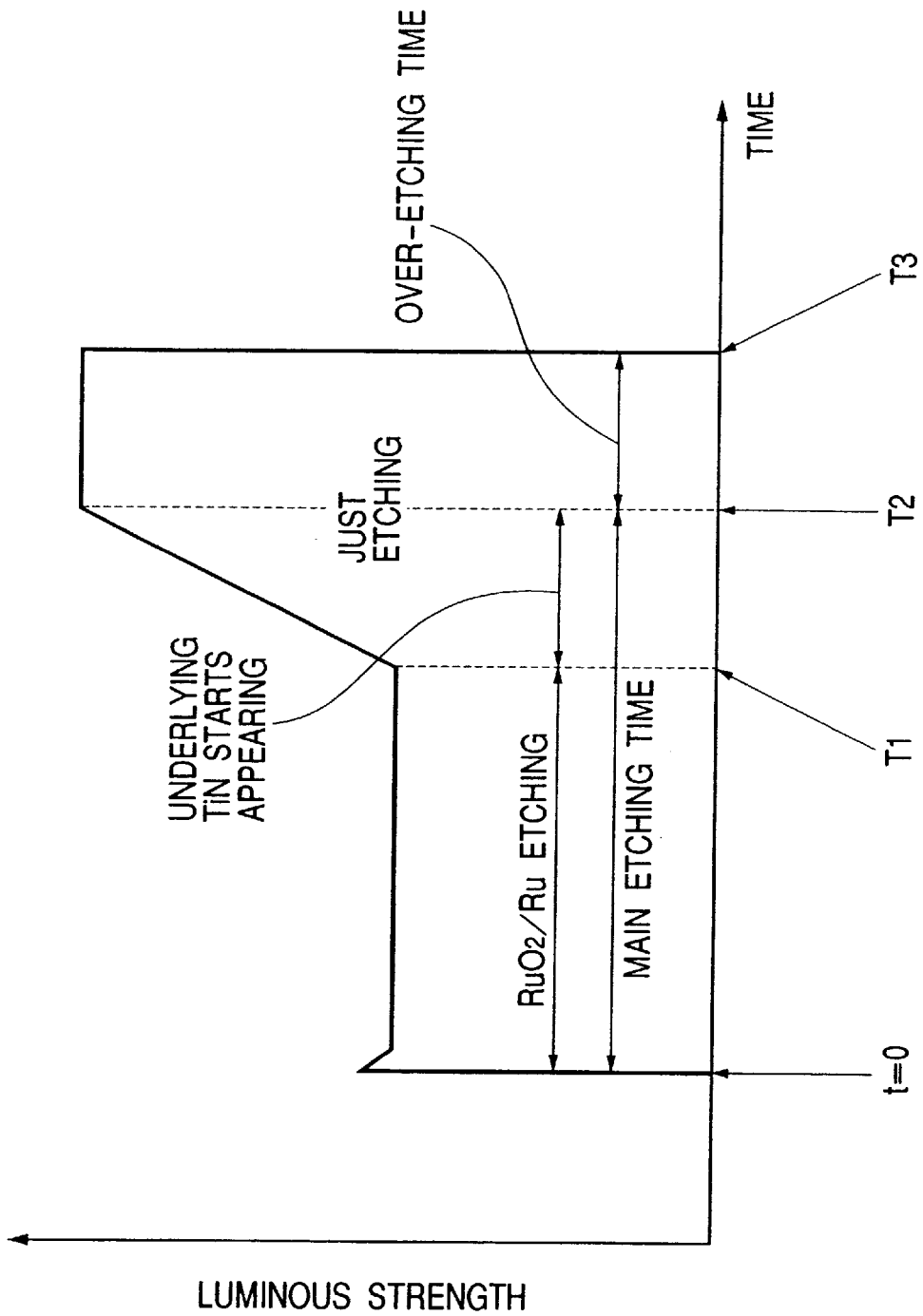
FIG. 14 is a graph describing the concept of over etching.

Under such conditions, 100% over etching is carried out. The concept of over etching as used herein will next be described with reference to FIG. 14. FIG. 14 is a graph in which luminous strength of plasma when the ruthenium film on the titanium-containing underlying film (ex. titanium nitride film (TiN film)) is etched is plotted versus treating time. Concerning plasma light emission, a light having a wave length of 406 nm which is a light emission peak of titanium can be monitored by way of example. Etching is started at the time t=0. During the etching of the Ru film (time t=0 to T1), the luminous strength of the light at 406 nm is maintained on the low level because the TiN film has not appeared yet. At the time t=T1, the etching of the $RuO_2$/Ru film is finished at the center portion of the wafer where the etching rate is relatively high and the underlying TiN film starts appearing. As a result, the luminous strength of the light at 406 nm begins increasing and with the passage of time, in other words, with an increase in the exposed area of the underlying TiN film, the luminous strength of the light at 406 nm shows an increase. At the time t=T2, the etching of the Ru film is finished even at the center portion of the wafer where the etching rate is relatively low and the whole underlying TiN film appears. As a result, the luminous strength of the light at 406 nm is kept substantially constant at a high level. This time t=T2 is defined as just etching time, while the time from t=0 to t=T2 is defined as main etching time. Etching is continued further and at t=T3, it is terminated. The time from T2 to T3 is defined as over etching time. Accordingly, the over etching is defined as (T3−T2)/(T2−0)×100 (%). In this drawing, treatment under a pressure of 15 mTorr is exemplified, but etching treatment can be carried out under any pressure permitting stable formation of plasma. The pressure can be selected from a range of 100 mTorr to 0.1 mTorr, more preferably a range of 30 mTorr to 1 mTorr.

Since the ruthenium film 55 is a side-wall depositing material and is made of a platinum group element, the reaction product is deposited on the etched side wall during etching, prevents anisotropy of etching and forms the resulting film into a taper shape. By the etching under the above-described conditions, however, the lower electrode 51 obtained by etching of the ruthenium film 55 is able to have a substantially vertical (taper angle of 89 degree) cross-section. The term "side-wall depositing material" as used herein means a material which tends to be deposited on the side wall owing to a low vapor pressure of the product upon dry etching and is considered to have difficulty in minute etching, more specifically, a platinum group element, oxide or double oxide containing the element (platinum group, etc.), or $ABO_3$ type transition metal oxide such as perovskite. The term "platinum group element or oxide or double oxide containing the element" as used herein means a platinum group element and an oxide containing the element, a platinum element and an oxide containing a component of the platinum element, and a double oxide containing plural components of the platinum element or containing both of another group element and platinum group element, and solid solution thereof.

First, such an improvement of etching properties is brought about by exhaust of the resulting reaction products (mainly, $RuO_4$, $RuO_x$) at a high velocity due to the supply of an etching gas at a large flow rate. In the etching of a platinum group element, low vapor-pressure reaction products (particularly, $RuO_x$) formed upon etching tend to be deposited on the side wall and impair the etching shape. The exhaust at a high velocity lowers the deposition probability on the side wall, thereby lessening the impairment of the etching shape. Even if the over etching amount is 20% or so, the taper angle obtained by etching is improved to about 84 degree.

Secondly, an improvement of etching properties is brought about by an over etching amount of 100%. Described specifically, the etching of the ruthenium film 55 has been completed at a certain taper angle so that the underlying titanium nitride film 47 appears when over etching is carried out. Since this titanium nitride film is not etched by oxygen ions or oxygen radicals, reaction products are not generated from the bottom surface by etching and therefore no reaction products fly to the side wall. At the side wall portion, there occurs competition between the etching by oxygen ions or oxygen radicals and re-deposition of the reaction products generated at the side wall portion, but owing to a decrease in the reaction products flown to the side wall portion because no reaction products come from the bottom surface as described above, etching wins in this competition. A marked decrease in the amount of the sidewall deposit upon over etching therefore brings about an improvement in the taper angle.

When over etching is carried out in an amount of 100% under the above-described conditions, more specifically, a reaction pressure of 15 mTorr, plasma source power of 500 W, RF bias power of 200 W and flow rates of oxygen and chlorine at 720 sccm and 80 sccm (total flow rate: about 800 sccm), respectively, etching anisotropy can be improved to 89 degree in terms of a taper angle.

Such an improvement permitting the etching of the ruthenium film 55 at a taper angle of 89 degree is one of the marked effects brought by the present invention in consideration that it is principally difficult to vertically etch a platinum group metal such as ruthenium or oxide thereof, in other words, that reaction products of it have low vapor pressure and tend to be deposited on a side wall. This improvement therefore makes it possible to carry out minute processing of DRAM of 1 Gbit class.

By employing such an etching method, it is possible to actualize the formation of an ideal pillar-shaped pattern (including a column filled inside or a cylindrical shape) having a taper angle of 89 degree even under the severe etching conditions for minute processing, more specifically, each of the pattern width and pattern space as minute as 0.13 μm, and the pattern height of 0.45 μm (an aspect ratio of about 3.5, that is, a high aspect region wherein an aspect ratio is not lower than 2 or 3). The term "pillar-shaped pattern" as used herein includes not only column and regular square pillar but also cone, pyramid and pillar different in side length.

Moreover, the etching method according to this embodiment permits large minute processing margin upon etching. This suggests the possibility of sufficiently minute processing (processing of a minute pattern having a pattern width and space not greater than 0.13 μm) based on the present technique in the case where a minute mask can be formed owing to an advance in the limit of lithography in some day.

Under the above-described etching conditions, the etching selection ratio of the silicon oxide film 52 (PTEOS film) relative to the ruthenium film is about 10. In the etching of the ruthenium film 55 having a thickness of 0.45 μm, the thickness of the silicon oxide film 52 serving as a hard mask accordingly decreases by about 45 nm. A large over etching (100%) enlarges the facet of the silicon oxide film 52 and the silicon oxide film 52 takes a form of a pyramid as illustrated in FIG. 11(d) by etching. Its height is, as illustrated in this drawing, about 100 nm.

In this etching of the ruthenium film 55, not a photoresist film but a silicon oxide film is used as a hard mask, because an etching selection ratio of the silicon oxide film relative to ruthenium can be made larger than that of the photoresist film, and the shape after etching can be improved by preventing the release of organic substances from the photoresist film and formation of a side-wall deposit.

As illustrated in FIG. 11(e), the titanium nitride film 47 which lies under the ruthenium film 55 is etched with the silicon oxide film 52 as a mask. This etching of the titanium nitride film 47 can be carried out using, for example, ECR (Electron Cycrotron Resonance) plasma. Etching can be carried out, for example, under the following conditions: a treatment pressure of 8 mTorr, μ-wave power of 300 W, RF bias power of 70 W at frequency of 800 kHz, feeding of boron trichloride ($BCl_3$) and chlorine ($Cl_2$) as etching gases at flow rates of 30 sccm and 70 sccm, respectively, and a substrate temperature of 50° C. By the etching of the titanium nitride film 47, the silicon oxide film 52 (mask) is etched partially, which decreases the film thickness of the silicon oxide film as illustrated in the drawing. The edges of the silicon oxide film 52 are etched as described above so that they become round. Edges having such roundness are advantageous because the deposition of the BST film 58 in the subsequent step can be carried out with good covering properties.

As illustrated in FIG. 11(f), a BST film is deposited without removing the silicon oxide film 52. This BST film 58 can be deposited by the CVD method and its film thickness is controlled to 20 nm. The formation of the BST film 58 by the CVD method makes is possible to carry out uniform film formation even over the lower electrode 51 of this Embodiment which has been subjected to minute processing and has a high aspect ratio. The BST film 58 can be replaced with another high dielectric film such as tantalum oxide, PZT or PLZT film.

Owing to the deposition of the BST film 58 without removing the silicon oxide film 52, a change in the shape of the lower electrode 51 induced by the removal of the silicon oxide film 52, in general, an undesirable shape change for minute processing such as narrowing of the pattern of the lower electrode 51 or rounding of the edges of the lower electrode 51 can be prevented. A change in the shape of the pattern which occurs after processing as minute as possible is not desired, because it has a serious influence all the worse for it and half of the significance of the minute processing is lost. In the present invention, the removing treatment of the silicon oxide film 52 which tends to impair the processed shape is omitted, whereby the state of the lower electrode 51 processed as minute as possible can be maintained.

Moreover, omission of the removing step of the silicon oxide film 52 makes it possible to prevent the roughening of the surface of the lower electrode 51 which will otherwise occur during the removing step of the silicon oxide film 52. If the silicon oxide film 52 is removed, the surface of the lower electrode 52 becomes rough by the etching of the silicon oxide film 52. Such roughening (surface roughening) becomes a cause for lowering the adhesion of the BST film 58, thereby deteriorating the reliability of the information storage capacitive element C. When the surface roughening is eminent, peeling of the BST film 58 presumably occurs and lowers the yield of DRAM. In the present invention, therefore, the silicon oxide film 52 is not removed in order to prevent such roughening.

Furthermore, the omission of the removing step of the silicon oxide film 52 contributes to the simplification of the manufacturing steps of DRAM not only by omission of the removing step itself but also omission of steps attendant on the removing step such as washing step after etching (removal of the silicon oxide film 52).

Thus, leaving of the silicon oxide film 52 above the lower electrode 51 brings about the above-described merits in the step and performance of DRAM. Although unremoval of the silicon oxide film 52 still has a disadvantage as described above, it is not so influential insofar as such a method is applied to the lower electrode 51 to be subjected to minute processing into a size as described in this embodiment.

As illustrated in FIG. 11(g), the BST film 58 is heat treated (annealed) in an oxygen atmosphere. Heat treatment is carried out at about 700° C. By this heat treatment, oxygen defects can be removed from the BST film 58. The temperature of 700° C. is selected based on the requirement that a volumetric change, such as expansion, of the lower electrode 51 and residues thereon must not be caused by the heat treatment in an oxygen atmosphere. The silicon oxide film 52 satisfies the above-described requirement, because it does not undergo volumetric expansion by the heat treatment under an oxygen atmosphere at 700° C.

As illustrated in FIG. 11(h), a ruthenium film 59 is deposited over the BST film 58, followed by the formation of a photoresist film 60 over the ruthenium film 59 as illustrated in FIG. 12(i). The photoresist film 60 is formed to cover the memory cell region of DRAM. As illustrated in FIG. 12(j), the ruthenium film 59 and BST film 58 are etched with this photoresist film 60 as a mask, whereby a capacitive insulating film 53 and upper electrode 54 are formed. Then, the photoresist film 60 is removed by ashing or the like and the information storage capacitive element C. having the lower electrode 51 made of ruthenium, the capacitive insulating film 53 made of BST and the upper electrode 54 made of ruthenium is completed (FIG. 12(k)), by which the memory cell of DRAM constituted of memory-cell selecting MISFETQs and information storage capacitive element C connected therewith is completed.

For the deposition of the ruthenium film 59, the sputtering method or CVD method can be employed by way of example. For the etching of the ruthenium film 59 and BST film 58, the etching apparatus as illustrated in FIG. 13 can be employed. Etching conditions are as follows: a reaction pressure of 2 mTorr, plasma source power of 300 W, RF bias power of 600 W, feeding of carbon tetrafluoride ($CF_4$) and argon (Ar) at flow rates of 10 sccm and 40 sccm, respectively and over etching amount of 10%. Under such conditions, anisotropic etching is not carried out and the taper angle is formed to be about 60 degree, which does not matter in this case because minute processing is not required.

Over the upper electrode 54, a suitable barrier metal may be formed. As a material constituting the upper electrode 54, a ruthenium dioxide film can be replaced with a titanium nitride film, ruthenium film or tungsten film.

Figure 15:
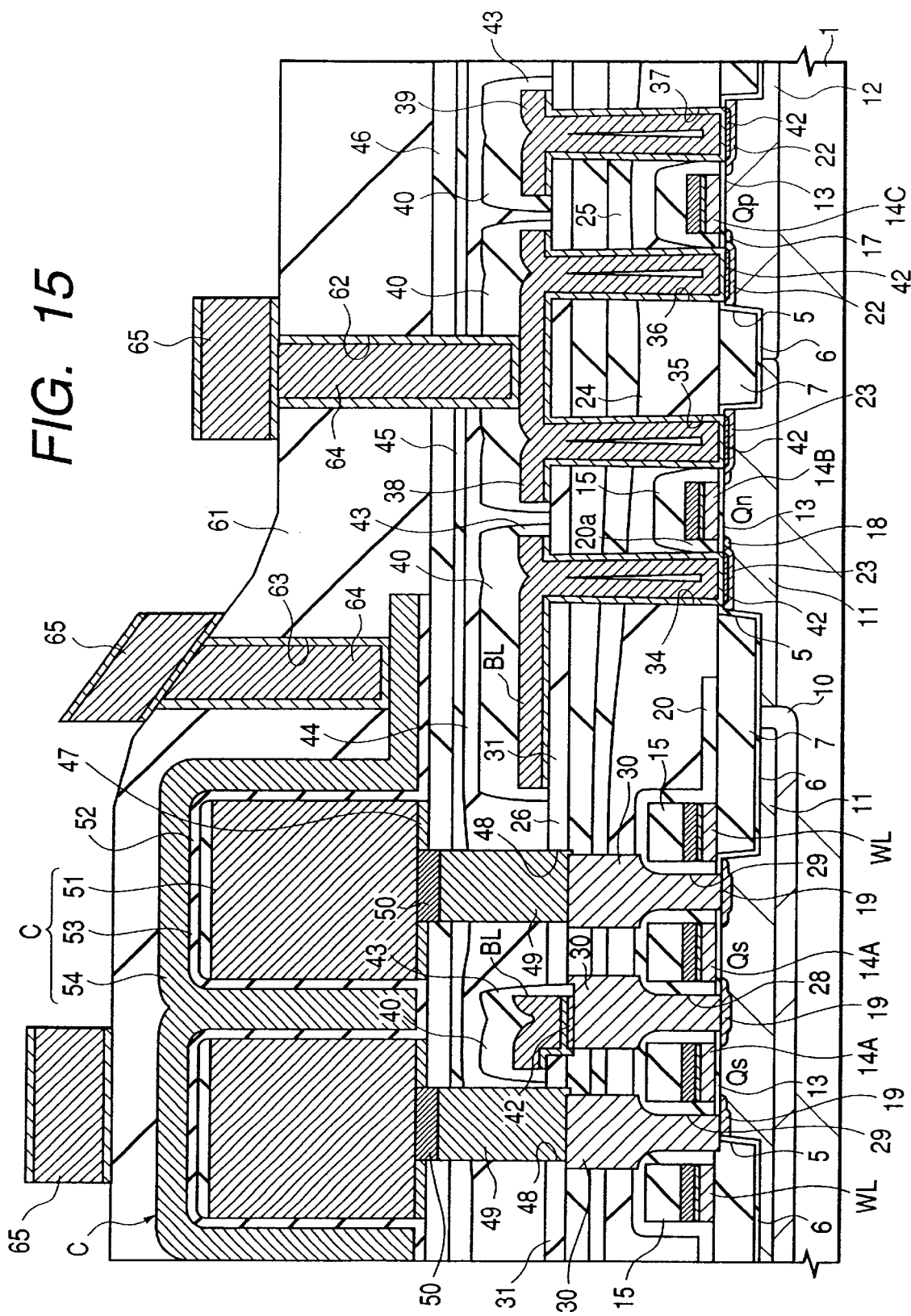
FIG. 15 is a cross-sectional view illustrating, in the order of step, one example of the manufacturing step of DRAM according to Embodiment 1.

As illustrated in FIG. 15, a silicon oxide film 61 made of SOG is then formed over the information storage capacitive element C. The use of the SOG film as the silicon oxide film 61 makes it possible to flatten the memory-cell formed region and at the same time, to relax the step difference with the peripheral circuit region. Between the upper portion of the capacitor C and the silicon oxide film 61A, a silicon oxide film which has a thickness of about 40 nm and has been formed by deposition, for example, by the plasma CVD method using ozone ($O_3$) and tetraethoxysilane (TEOS) as source gases may be formed.

A through-hole 62 is then formed by removing, by dry etching with a photoresist film as a mask, the silicon oxide films 61,46,45, SOG film 44 and silicon nitride film 40 above the first interconnection layer 38. Similarly, a through-hole 63 is formed by removing the silicon oxide film 61 over the upper electrode 54. Inside of each of the through-holes 62,63, a plug 64 is formed, followed by the formation of a second interconnection layer 65 over the silicon oxide film 61. This plug 64 is formed by depositing a TiN film of about 100 nm thick over the silicon oxide film 61 by the sputtering method, depositing a W film of about 500 nm thick thereover by the CVD method, and leaving these films inside of each of the through-holes 62 and 63 by etch back. The second interconnection layer 65 is formed by depositing a TiN film of about 50 nm thick, an Al (aluminum) film of about 500 nm thick and a Ti film of about 50 nm thick above the silicon oxide film 61 by the sputtering method, and then patterning these films by dry etching with a photoresist film as a mask.

A third interconnection layer is then formed through an intrastratum insulating film, followed by deposition thereover a passivation film made of a silicon oxide film and a silicon nitride film, which however is not illustrated. By the above-described steps, the DRAM according this embodiment is substantially completed.

The third interconnection layer and a plug connected therewith can be formed in a similar manner to the case of the second interconnection layer. The intrastratum insulating film can be formed, for example, of a silicon oxide film of about 300 nm thick, an SOG film of about 400 nm thick and a silicon oxide film of about 300 nm thick. The silicon oxide film can be deposited by the plasma CVD method by using ozone ($O_3$) and tetraethoxysilane (TEOS) as source gases.

According to this embodiment, ruthenium having affinity with the ferroelectric capacitive insulating film 53 such as BST is used as a material for the lower electrode 51. Upon etching of this lower electrode 51, the silicon oxide film 52 is left as a hard mask and in the presence of the silicon oxide film 52, the capacitive insulating film 53 is formed, whereby the removing step of the silicon oxide film 52 becomes unnecessary and the manufacturing steps can therefore be simplified. In addition, roughening of the upper surface of the lower electrode 51 or roughening of the underlying film which will otherwise occur in the removing step can be prevented, which makes it possible to form the capacitive insulating film 53 with good reliability. Moreover, the blunting or narrowing of the pattern of the lower electrode 51 which will otherwise occur in the removing step of the silicon oxide film 52 can be prevented, whereby the shape of the minutely processed lower electrode 51 can be maintained.

In this embodiment, a description was made of the lower electrode 51 made of ruthenium, but the lower electrode can also be formed of a ruthenium dioxide film or a laminate film of ruthenium and ruthenium dioxide.

In this embodiment, the titanium nitride film 47 is employed as an etching stopper of the ruthenium film 55, but the titanium nitride film 47 can be replaced with a silicon nitride film. The silicon nitride film can also be used as an etching stopper in this embodiment, because it has, similar to the titanium nitride film 47, has a large etching selection ratio to the etching action mainly brought by oxygen radicals. In this case, since the silicon nitride film is a nonconductor, it is not necessary to remove it after etching of the ruthenium film 55, that is, after the formation of the lower electrode 51 and therefore, the above-described step 11(e) is not required. In this case, the BST film 58 may be formed after the step of FIG. 11(d), which makes it possible to simplify the manufacturing steps. Over the lower electrode 51, the relatively thick silicon oxide film 52 remains, but as described above, such a silicon oxide film 52 does not inhibit the performance of the information storage capacitive element C.

Embodiment 2

The DRAM according to Embodiment 2 differs from that of Embodiment 1 only in the constitution and manufacturing method of the information storage capacitive element C, but is similar in the constitution and manufacturing method of the other members. Accordingly, the manufacturing method of the information storage capacitive element C will next be described and description of that of the other members is omitted herein.

FIG. 16 are cross-sectional views illustrating, in the order of step, one example of the manufacturing steps of the information storage capacitive element of the DRAM according to Embodiment 2. FIG. 16 each illustrates, similar to FIGS. 11 and 12, a cross-section taken along line B—B in FIG. 10(a) and illustrates only the region of the information storage capacitive element C of the DRAM.

Figure 16A:
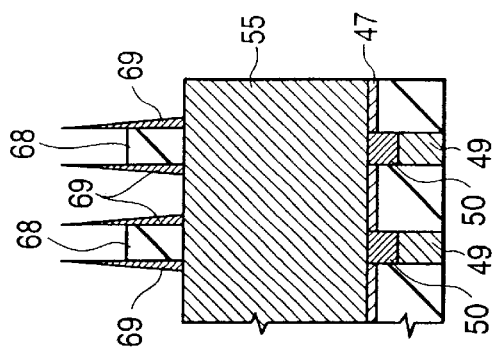
FIGS. 16(a) to (f) are each a cross-sectional view illustrating, in the order of step, one example of the manufacturing step of the information storage capacitive element of DRAM according to Embodiment 2 of the present invention.

After the step of FIG. 8 in Embodiment 1, as illustrated in FIG. 16(a), a ruthenium film 55 and a platinum film 66 are formed over a titanium nitride film 47, followed by the formation of a patterned photoresist film 67 on the platinum film 66.

Since the ruthenium film 55 is similar to that in Embodiment 1, a detailed description of it is omitted. The platinum film 66 serves as a hard mask upon etching of the ruthenium film 55 and will serve as a part of the lower electrode. Its film thickness is adjusted to 0.1 82 m in consideration of a decrease in the subsequent etching step.

The photoresist film 67 is used as a mask for patterning of the platinum film 66. It is formed by the ordinary photolithography step. The patterning of the photoresist film 67 is, different from that in Embodiment 1, carried out after the width of the film is narrowed in consideration of an increase in the bottom surface area due to a side-wall deposit upon etching of the platinum film 66. Described specifically, as illustrated in the drawing, the pattern width is formed to 0.1 $\mu$m, while the pattern space is formed to 190 nm. The photoresist film 67 is formed to have a thickness of 300 nm in consideration of a decrease caused by etching of the platinum film 66. As in Embodiment 1, EB (Electron Beam) resist can be employed as the photoresist film. The photoresist film is formed to have, at upper portions (edges) thereof, round or beveled shapes, that is, formed as a round resist. The formation of the photoresist film 67 as round resist makes it possible to reduce a side-wall deposit upon etching of platinum, thereby carrying out etching of platinum with good anisotropy.

Figure 16B:
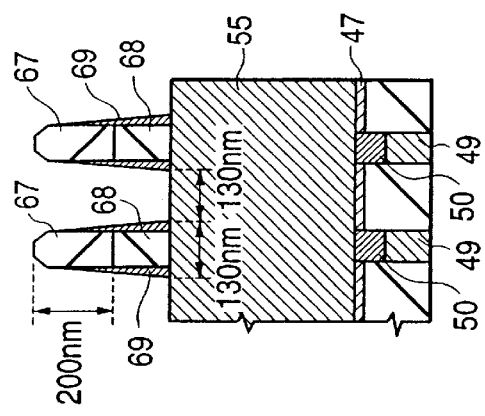

As illustrated in FIG. 16(b), the platinum film 66 is then patterned with the photoresist film 67 as a mask, whereby a hard mask 68 made of platinum is formed. The platinum film 66 can be etched, for example, by magnetron reactive ion etching under conditions of a reaction pressure of 5 mTorr, RF power of 2 kW, feeding of argon as an etching gas at a flow rate of 15 sccm and a substrate temperature at 30° C. The platinum film is thus etched by sputtering. Under such etching conditions, the etching rate of platinum is about 150 nm/min and a selection ratio to the photoresist film 67 is about 1. Upon completion of the etching of the platinum film 66, the photoresist film 67 of about 200 nm thick remains on the hard mask 68. On the side walls of the photoresist film 67 and hard mask 68, side-wall deposit 69 is formed. The side-wall deposit 69 is formed by re-deposition owing to a low vapor pressure of the reaction product formed upon etching of platinum and it is formed easily. In this embodiment, this side-wall deposit 69 is positively used as an etching mask of the ruthenium film 55 in the subsequent step. By the formation of the side-wall deposit 69, a region which acts as a mask in addition to the hard mask 68 is widened. This region is adjusted to be 0.13 $\mu$m at the bottom surface which is a target patterning size of the ruthenium film 55. Thus, a lower electrode pattern of 0.13 $\mu$m wide is formed.

Figure 16C:
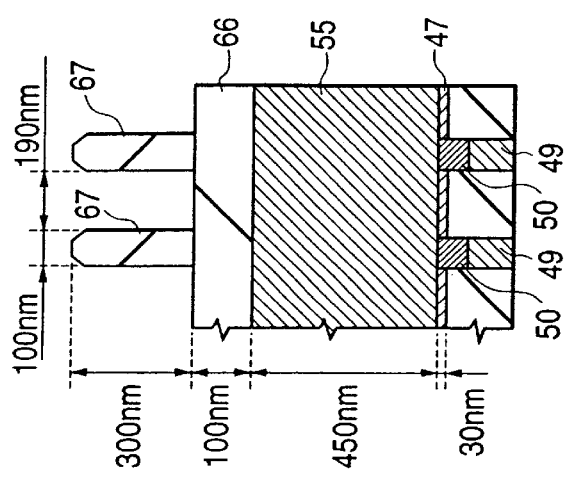

As illustrated in FIG. 16(c), the photoresist film 67 is removed. The removal of the photoresist film 67 is carried out as in Embodiment 1.

Figure 16D:
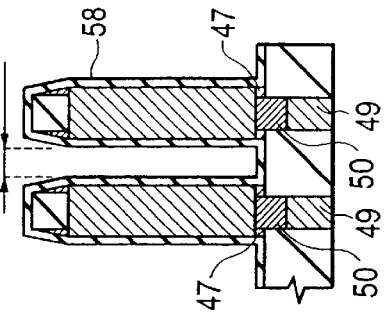

As illustrated in FIG. 16(d), the lower electrode 51 is formed by etching the ruthenium film 55 with the hard mask 68 and side-wall deposit 69 as masks. The ruthenium film 55 is etched as in Embodiment 1 so that it is formed to have a taper angle of 89 degree, almost a right angle, with good anisotropy. Upon etching of the ruthenium film 55, the edges of the hard mask 68 and the protruding portions of the side-wall deposit 69 are rounded by etching.

Figure 16E:
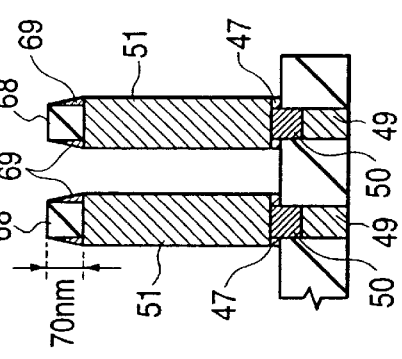

As illustrated in FIG. 16(e), the titanium nitride film 47 which lies below the ruthenium film 55 is etched with the hard mask 68 and side-wall deposit 69 as masks. The titanium nitride film 47 is etched as in Embodiment 1. By the etching of the titanium nitride film 47, the hard mask 68 and side-wall deposit 69 are partially etched and their film thicknesses decrease as illustrated in the drawing. The edges of the hard mask 68 and side-wall deposit 69 are more rounded by this etching. Such a round shape is accompanied with the advantage that the subsequent deposition of a BST film 58 can be conducted with good covering properties.

Figure 16F:
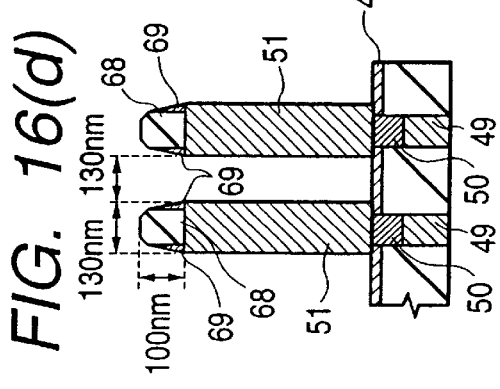

As illustrated in FIG. 16(f), the BST film 58 is deposited without removing the hard mask 68 and side-wall deposit 69. The BST film 58 can be formed as in Embodiment 1. Deposition of the BST film 58 without removing the hard mask 68 and side-wall deposit 69 brings about similar merits to those of Embodiment 1. The subsequent steps are similar to those of Embodiment 1 so that a description of them is omitted. The hard mask 68 remaining on the surface of the lower electrode 51 is made of platinum so that it is excellent in heat resistance and neither volumetric increase nor quality change occurs even by the heat treatment of the BST film 58 under an oxidizing atmosphere.

This Embodiment brings about effects as described below, in addition to the effects described in Embodiment 1. Described specifically, the hard mask 68 remaining on the lower electrode 51 is made of platinum which is a conductor, which permits the functioning of the hard mask 68 as a part of the lower electrode 51. The area of the lower electrode can be increased by the area corresponding to the hard mask 68. Owing to the constitution according to this Embodiment, the storage capacitance of the information storage capacitive element C increases, resulting in an improvement in the performance of the DRAM. Since the side-wall deposit 69 is generally not a conductor, functioning, as a capacitor, of the portion of the side-wall deposit 69 contiguous to the BST film 58 cannot be expected. Even in this case, as described in Embodiment 1, such a disadvantage is not so influential.

As in Embodiment 1, the lower electrode 51 can also be made of ruthenium dioxide or a laminate film of ruthenium and ruthenium dioxide and the titanium nitride film 47 can be replaced with a silicon nitride film.

Embodiment 3

The DRAM according to Embodiment 3 differs from that of Embodiment 1 only in the constitution and manufacturing method of the information storage capacitive element C of DRAM, but is similar in the constitution and manufacturing method of the other members. Accordingly, the manufacturing method of the information storage capacitive element C will next be described and a description of that of the other members will be omitted.

FIG. 17 are cross-sectional views illustrating, in the order of step, one example of the manufacturing steps of the information storage capacitive element of the DRAM according to Embodiment 3. FIG. 17 each illustrates, similar to FIGS. 11 and 12, a cross-section taken along line B—B in FIG. 10(a) and illustrates only the region of the information storage capacitive element C of the DRAM.

Figure 17A:
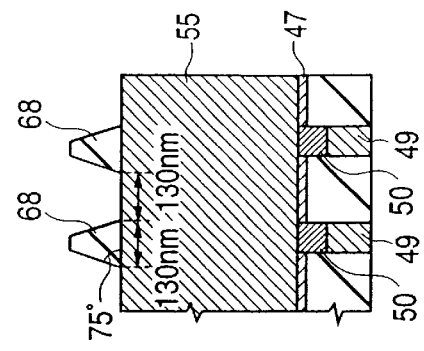
FIGS. 17(a) to (f) are each a cross-sectional view illustrating, in the order of step, one example of the manufacturing step of the information storage capacitive element of DRAM according to Embodiment 3 of the present invention.

After the step of FIG. 8 in Embodiment 1, as illustrated in FIG. 17(a), a ruthenium film 55 and a platinum film 66 are formed above the titanium nitride film 47, followed by the formation of a patterned photoresist film 70 on the platinum film 66.

Since the ruthenium film 55 is similar to that in Embodiment 1, a detailed description of it is omitted. The platinum film 66 serves as a hard mask upon etching of the ruthenium film 55 and also will serve as a part of the lower electrode. Its film thickness is adjusted to 0.1 μm in consideration of a decrease in the subsequent etching step.

The photoresist film 70 is used as a mask for patterning of the platinum film 66. It is formed by the ordinary photolithography step. The patterning of the photoresist film 70 is, different from that in Embodiment 1, carried out after the width of the film is narrowed in consideration of an increase in the bottom surface area due to the formation of a taper portion upon etching of the platinum film 66. Described specifically, as illustrated in the drawing, the pattern width is formed to 0.08 μm. while the pattern space is formed to 260 nm. The photoresist film 70 is formed to have a thickness of 300 nm in consideration of its decrease caused by the etching of the platinum film 66. As in Embodiment 1, EB (Electron Beam) resist can be employed as the photoresist film 70. The photoresist film 70 is, similar to that of Embodiment 2, formed to have, at upper portions (edges) thereof, round or beveled shapes, that is, formed as a round resist.

Figure 17B:
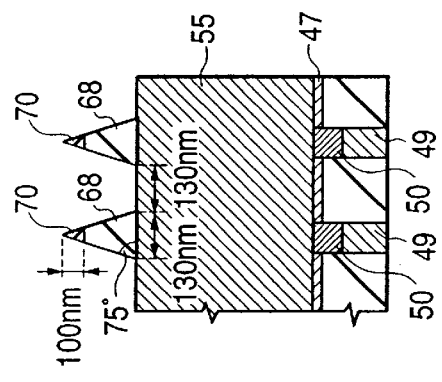

As illustrated in FIG. 17(b), the platinum film 66 is then patterned with the photoresist film 70 as a mask, whereby a hard mask 68 made of platinum is formed. The platinum film 66 can be etched by magnetron reactive ion etching as in Embodiment 2, but etching conditions are different from those of Embodiment 2. Etching in this embodiment is carried out under conditions of a reaction pressure of 1 mTorr, RF power of 2 kW, feeding of chlorine ($Cl_2$) as an etching gas at a flow rate of 15 sccm and a substrate temperature at 30° C. The platinum film is etched by sputtering in Embodiment 2, while in Embodiment 3, it is etched by the chemical action of chlorine radicals. Under such etching conditions, the etching rate of platinum is about 150 nm/min and selection ratio to the photoresist film 70 is about 0.5. Since the photoresist film 70 is etched largely, the thickness of the photoresist film 70 decreases and upon completion of the etching, only a small portion of it remains on the patterned platinum film 66 (hard mask 68). On the side walls of the patterned hard mask 68, no side-wall deposit is formed, because the side-wall deposit is etched by chlorine radicals. Owing to poor anisotropy of the platinum film 66, however, the taper angle formed is about 75 degree. The bottom portion of the hard mask 68 therefore becomes wider than the pattern width of the photoresist film 70 and upon completion of the etching, width of the bottom portion of the hard mask 68 becomes 0.13 μm, whereby the lower electrode pattern having a width of 0.13 μm is formed.

Figure 17C:
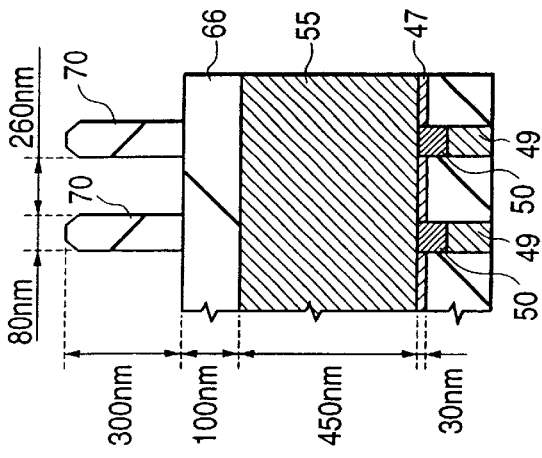

As illustrated in FIG. 17(c), the photoresist film 70 is removed. The removal of the photoresist film 70 is carried out as in Embodiment 1.

Figure 17D:
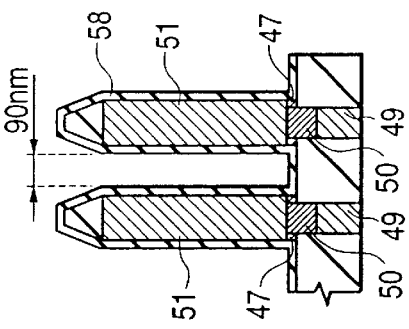

As illustrated in FIG. 17(d), the lower electrode 51 is formed by etching the ruthenium film 55 with the hard mask 68 as a mask. The ruthenium film 55 is etched as in Embodiment 1 so that it has a taper angle of 89 degree, almost a right angle, with good anisotropy. Upon etching of the ruthenium film 55, the hard mask 68 is also etched though partially and its thickness decreases to 70 nm.

Figure 17E:
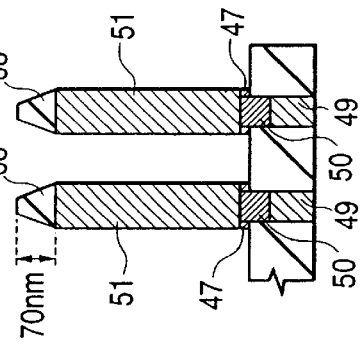

As illustrated in FIG. 17(e), the titanium nitride film 47 which lies below the ruthenium film 55 is etched with the hard mask 68 as a mask. The titanium nitride film 47 is etched as in Embodiment 1. By the etching of the titanium nitride film 47, the hard mask 68 is partially etched and its thickness decreases as illustrated in the drawing. The edges of the hard mask 68 are more rounded by the etching in the above-described step. Such a round shape is accompanied with the advantage that the subsequent deposition of the BST film 58 can be conducted with good covering properties.

Figure 17F:
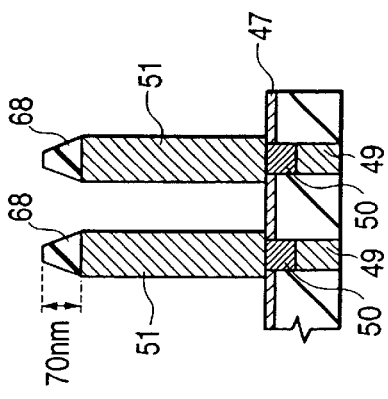

As illustrated in FIG. 17(f), a BST film 58 is deposited without removing the hard mask 68. The BST film 58 can be formed as in Embodiment 1. Deposition of the BST film 58 without removing the hard mask 68 brings about similar merits to those of Embodiment 1. The subsequent steps are similar to those of Embodiment 1 so that a description of them is omitted. As in Embodiment 2, since the hard mask 68 remaining on the surface of the lower electrode 51 is made of platinum, it is excellent in heat resistance and neither volumetric increase nor quality change occurs even by the heat treatment of the BST film 58 under an oxidizing atmosphere.

This Embodiment brings about effects as described below, in addition to the effects described in Embodiment 1. Described specifically, the hard mask 68 remaining on the lower electrode 51 is made of platinum, which is a conductor, which permits functioning of the hard mask 68 as a part of the lower electrode 51. Moreover, since no sidewall deposit is formed on the side surface of the hard mask 68, the whole region of the hard mask 68 contiguous to the BST film 58 can be rendered to function as a capacitor. In other words, not only the upper surface but also the side surface of the hard mask 68 can be rendered to function as a capacitor. Owing to such constitution, the whole surface area of the lower electrode 51 and the surface of the hard mask 68 contributes to the capacitor, which makes it possible to increase the storage capacitance of the information storage capacitive element C compared with that of Embodiment 2, thereby improving the performance of the DRAM. In this Embodiment, leaving of the hard mask 68 on the lower electrode brings about effects as described in Embodiment 1, but demerits brought by such a constitution do not exist.

As in Embodiment 1, the lower electrode 51 can also be made of ruthenium dioxide or a laminate film of ruthenium and ruthenium dioxide and the titanium nitride film 47 is replaced with a silicon nitride film.

Embodiment 4

The DRAM according to this embodiment 4 differs from that of Embodiment 1 only in the constitution and manufacturing method of the information storage capacitive element C, but is similar in the constitution and manufacturing method of the other members. Accordingly, the manufacturing method of the capacitor C will next be described and a description of that of the other members will be omitted.

FIG. 18 are cross-sectional views illustrating, in the order of step, one example of the manufacturing steps of the information storage capacitive element of the DRAM according to Embodiment 4. FIG. 18 each illustrates, similar to FIGS. 11 and 12, a cross-section taken along line B—B in FIG. 10(a) and illustrates only the region of the information storage capacitive element C of the DRAM.

After the step of FIG. 8 in Embodiment 1, as illustrated in FIG. 18(a), a ruthenium film 55, a platinum film 66 and a silicon oxide film 71 are formed above a titanium nitride film 47, followed by the formation of a patterned photoresist film 70 on the silicon oxide film 71.

Since the ruthenium film 55 and the platinum film 66 are similar to those in Embodiment 3, a detailed description of them is omitted. The silicon oxide film 71 is similar to that of Embodiment 1. The platinum film 66 serves as a hard mask upon etching of the ruthenium film 55 and will serve as a part of the lower electrode. Its film thickness is adjusted to 0.1 μm in consideration of its decrease in the subsequent etching step. The silicon oxide film 56 serves as a hard mask upon etching of the platinum film 66 and its film thickness is adjusted to 0.3 μm in consideration of its decrease in the subsequent etching step.

The photoresist film 70 is used as a mask for patterning of the silicon oxide film 71. It is formed by the ordinary photolithography step. The patterning of the photoresist film 70 is, as in Embodiment 3, carried out after the width of the film is narrowed in consideration of an increase in the bottom surface area caused by the formation of a taper portion upon etching of the platinum film 66. In this Embodiment, however, the pattern width is widened a little to 0.1 μm in order to carry out etching of the platinum film 66 with better anisotropy than that of Embodiment 3. The pattern space is formed to 190 nm. The photoresist film 70 is formed to have a thickness of 300 nm in consideration of its decrease caused by etching of the silicon oxide film 71. As in Embodiments 1 to 3, EB (Electron Beam) resist can be employed as the photoresist film 70.

As illustrated in FIG. 18(b), the silicon oxide film 71 is etched with the photoresist film 70 as a mask, whereby a hard mask 72 for patterning of the platinum film 66 is formed. The silicon oxide film is formed with good anisotropy so that the pattern of the photoresist film 70 is reproduced precisely and even at the bottom portion of the hard mask 72, it is formed with the pattern width of 100 nm and pattern space of 190 nm.

As illustrated in FIG. 18(c), the photoresist film 70 is then removed. The removal of the photoresist film 70 is conducted as in Embodiment 1.

As illustrated in FIG. 18(c), the platinum film 66 is then patterned with the hard mask 72 made of a silicon oxide film as a mask, whereby a hard mask 68 made of platinum is formed. Similarly to Embodiment 2 or 3, magnetron reactive ion etching can be employed for the etching of the platinum film 66, but etching conditions are different. Described specifically, etching is carried out, for example, under conditions of a reaction pressure of 5 mTorr, RF power of 1.2 kW, feeding of oxygen ($O_2$) and chlorine ($Cl_2$) as etching gases at flow rates of 80 sccm and 20 sccm, respectively, an over etching amount of 100% and a substrate temperature at 160° C. The platinum film is etched by sputtering in Embodiment 2 and by chemical etching with chlorine radicals in Embodiment 3. In this Embodiment 4, on the other hand, the platinum film 66 is etched by the chemical action of oxygen radicals under a high temperature condition, that is, at a substrate temperature of 160° C. Under such etching conditions, the etching rate of platinum is about 150 nm/min and a selection ratio to the hard mask 72 made of a silicon oxide film is about 1. Under such conditions, no side-wall deposit is formed on the side walls of the hard mask 68. As a result of an improvement in the anisotropy of the platinum etching compared with Embodiment 3, the taper angle of the hard mask 68 becomes about 85 degree. The bottom portion of the hard mask 68 becomes wider than the first pattern width of the hard mask 72 and it becomes 0.13 μm upon completion of etching. In this manner, a line and space pattern of 0.13 μm wide is formed. Such an improvement in etching properties of the platinum film 66 makes it possible to increase the margin in the etching step and to carry out minute processing which can be applied even to high integration.

As illustrated in FIG. 18(e), the lower electrode 51 is formed by etching the ruthenium film 55 with the hard mask 68 as a mask. In this stage, the hard mask 72 is partially etched and its thickness decreases. The ruthenium film 55 is etched as in Embodiment 1 so that it has a taper angle of 89 degree, almost right angle, with good anisotropy.

As illustrated in FIG. 18(f), the titanium nitride film 47 which lies below the ruthenium film 55 is etched with the hard mask 68 as a mask. At this stage, the hard mask 72 is etched and substantially disappears. The titanium nitride film 47 is etched as in Embodiment 1. By the etching of the titanium nitride film 47, the hard mask 68 is partially etched and its thickness decreases as illustrated in the drawing.

As illustrated in FIG. 18(g), a BST film 58 is deposited without removing the hard mask 68. The BST film 58 can be formed as in Embodiment 1. Deposition of the BST film 58 without removing the hard mask 68 brings about similar merits to those of Embodiment 1. The subsequent steps are similar to those of Embodiment 1 so that a description of them is omitted. As in Embodiment 2, since the hard mask 68 remaining on the surface of the lower electrode 51 is made of platinum, it is excellent in heat resistance and neither volumetric increase nor quality change occurs even by the heat treatment of the BST film 58 under an oxidizing atmosphere.

In addition to the effects as described in Embodiment 1, the below-described effects are available in this Embodiment 4. Described specifically, the hard mask 68. remaining over the lower electrode 51 is made of platinum, which is a conductor, so that the hard mask 68 serves as a part of the lower electrode 51. In addition, since no side-wall deposit is formed on the side walls of the hard mask 68, the whole region of the hard mask 68 contiguous to the BST film 58 can be rendered to function as a capacitor. In other words, not only the upper surface but also the side walls of the hard mask 68 function as a capacitor, whereby the whole surface area of the lower electrode 51 and the hard mask 68 contributes to the capacitor, thereby increasing the storage capacitance of the information storage capacitive element C compared with that of Embodiment 2 and improving the performance of the DRAM. Moreover, in this embodiment, the photoresist film 70 can be formed wider than that of Embodiment 3 so that a photolithography margin can be increased Conversely speaking, minute processing properties in this Embodiment are superior to those in Embodiment 3.

As in Embodiment 1, the lower electrode 51 can also be made of ruthenium dioxide or a laminate film of ruthenium and ruthenium dioxide and the titanium nitride film 47 can be replaced with a silicon nitride film.

Embodiment 5

The DRAM according to this Embodiment 5 differs from that of Embodiment 1 only in the constitution and manufacturing method of the information storage capacitive element C, but is similar in the constitution and manufacturing method of the other members. Accordingly, the manufacturing method of the information storage capacitive element C will next be described and a description of that of the other members are omitted herein.

FIG. 19 are cross-sectional views illustrating, in the order of step, one example of the manufacturing steps of the information storage capacitive element of the DRAM according to Embodiment 5. FIG. 19 each illustrates, similar to FIGS. 11 and 12, a cross-section taken along line B—B in FIG. 10(a) and illustrates only the region of the capacitor C of the DRAM.

After the step of FIG. 8 in Embodiment 1, as illustrated in FIG. 19(*a*), a ruthenium film 55 and a BST film 73 are formed above a titanium nitride film 47, followed by the formation of a patterned photoresist film 70 on the BST film 73.

Since the ruthenium film 55 is similar to that in Embodiment 1, a detailed description of it is omitted. The BST film 73 serves as a hard mask upon etching of the ruthenium film 55 and will serve as a part of the capacitive insulating film. Its film thickness is adjusted to 0.1 μm in consideration of its decrease in the subsequent etching step.

The photoresist film 70 is used as a mask for patterning of the BST film 66. It is formed by the ordinary photolithography step. The patterning of the. photoresist film 70 is, as in Embodiment 2, carried out after the width of the film is narrowed in consideration of an increase in the bottom surface area caused by the formation of a taper portion upon etching of the BST film 73. Described specifically, as illustrated in the drawing, the pattern width is formed to 0.1 μm, while the pattern space is formed to 190 nm. The photoresist film 70 is formed to have a thickness of 300 nm in consideration of its decrease caused by etching of the BST film 73. As in Embodiment 1, EB (Electron Beam) resist can be employed as the photoresist film 70. The photoresist film is formed to have, at upper portions (edges) thereof, round or beveled shapes, that is, formed as a round resist.

As illustrated in FIG. 19(*b*), the BST film 73 is then patterned with the photoresist film 70 as a mask, whereby a hard mask 74 made of BST is formed. The BST film 73 is etched in a similar manner to Embodiment 3. Etching is conducted, for example, under the following conditions: a reaction pressure of 1 mTorr, RF power of 2 kW, feeding of chlorine (Cl$_2$) as an etching gas at 15 sccm and a substrate temperature at 30° C. Under such etching conditions, the etching rate of BST film 73 is about 150 nm/min and a selection ratio to the photoresist film 70 becomes about 1. Upon completion of the etching, the taper angle of the patterned BST film 73 (hard mask 74) becomes from 70 to. 80 degree and the bottom portion of the hard mask 74 becomes 0.13 μm which is wider than the first pattern width of the photo resist film 70. Thus, a line and space pattern of 0.13 μm wide is formed.

As illustrated in FIG. 19(*c*), the photoresist film 70 is then removed. The removal of the photoresist film 70 is carried out as in Embodiment 1.

As illustrated in FIG. 19(*d*), the lower electrode 51 is formed by etching the ruthenium film 55 with the hard mask 74 as a mask. The ruthenium film 55 is etched as in Embodiment 1 so that it has a taper angle of 89 degree, almost a right angle, with good anisotropy. Upon etching of the ruthenium film 55, the hard mask 74 is partially etched.

As illustrated in FIG. 19(*e*), the titanium nitride film 47 is etched with the hard mask 74 as a mask. The titanium nitride film 47 is etched as in Embodiment 1. By the etching of the titanium nitride film 47, the hard mask 74 is partially etched, which decreases its thickness.

As illustrated in FIG. 19(*f*), the BST film 58 is deposited without removing the hard mask 74. The BST film 58 can be formed as in Embodiment 1. Deposition of the BST film 58 without removing the hard mask 74 brings about similar merits to those of Embodiment 1.

As illustrated in FIG. 19(*g*), the BST film 58 is then heat treated in an oxygen atmosphere, whereby the hard mask 74 made of BST and the BST film 58 are integrated. The subsequent steps are similar to those of Embodiment 1 so that a description of them is omitted. In addition to the effects as described in Embodiment 1, the below-described effects are available according to this Embodiment 5. Described specifically, the hard mask 74 left on the lower electrode 51 is made of BST, so that the hard mask 74 and BST film 58 are integrated, which markedly improves the adhesion of the BST film 58 over the lower electrode 51. This makes it possible to form the information storage capacitive element C with good reliability. Moreover, since the BST is a ferroelectric material, its contribution to the capacitance of the capacitor over the upper electrode 51 becomes a little larger than that in Embodiment 1, which raises the storage capacitance of the information storage capacitive element C.

As in Embodiment 1, the lower electrode 51 can also be made of ruthenium dioxide or a laminate film of ruthenium and ruthenium dioxide and the titanium nitride film 47 is replaced with a silicon nitride film.

Embodiment 6

The DRAM according to this Embodiment 6 differs from that of Embodiment 1 only in the constitution and manufacturing method of the information storage capacitive element C, but is similar in the constitution and manufacturing method of the other members. In this Embodiment, however, the titanium nitride film 47 of Embodiment 1 is replaced with a titanium oxide film 75. The titanium oxide film 75 is formed by the CVD or sputtering method to a film thickness of 30 nm. Accordingly, the manufacturing method of the information storage capacitive element C will next be described and a description of that of the other members is omitted herein.

FIG. 20 are cross-sectional views illustrating, in order of step, one example of the manufacturing steps of the information storage capacitive element of the DRAM according to Embodiment 6. FIG. 20 each illustrates, similar to FIGS. 11 and 12, a cross-section taken along line B—B in FIG. 10(*a*) and illustrates only the region of the information storage capacitive element C of the DRAM.

After the step of FIG. 8 in Embodiment 1 (in which the titanium oxide film 75 is formed instead of the titanium nitride film 47), as illustrated in FIG. 20(*a*), a ruthenium film 55 and a titanium oxide film 76 are formed above a titanium oxide film 75, followed by the formation of a patterned photoresist film 70 on the titanium oxide film 76.

The ruthenium film 55 is similar to that in Embodiment 1. The titanium oxide film 76 serves as a hard mask upon etching of the ruthenium film 55. Its film thickness is adjusted to 30 nm.

The photoresist film 70 is used as a mask for patterning of the titanium oxide film 76. It is formed by the ordinary photolithography step. The patterning of the photoresist film 70 is carried out as in Embodiment 1.

As illustrated in FIG. 20(*b*), the titanium oxide film 76 is then patterned with the photoresist film 70 as a mask, whereby a hard mask 77 is formed. The titanium oxide film 76 is etched in a similar manner to Embodiment 3. Since the titanium oxide film 76 is as thin as 30 nm, it is free from the problem of etching anisotropy and the hard mask 77 is patterned with almost a similar size with the photoresist film 70. Thus, a line and space pattern of 0.13 μm wide is formed.

As illustrated in FIG. 20(*c*), the photoresist film 70 is then removed. The removal of the photoresist film 70 is carried out as in Embodiment 1.

As illustrated in FIG. 20(*d*), the lower electrode 51 is formed by etching the ruthenium film 55 with the hard mask 77 as a mask. The ruthenium film 55 is etched as in Embodiment 1.

Figure 20A:
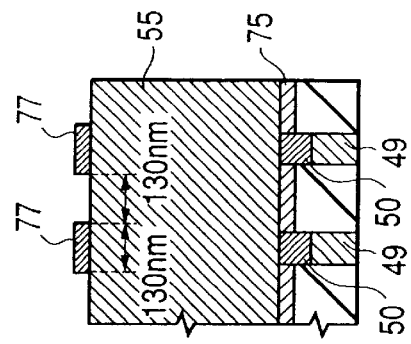
FIGS. 20(a) to (f) are each a cross-sectional view illustrating, in the order of step, one example of the manufacturing step of the information storage capacitive element of DRAM according to Embodiment 6 of the present invention.
Figure 20B:
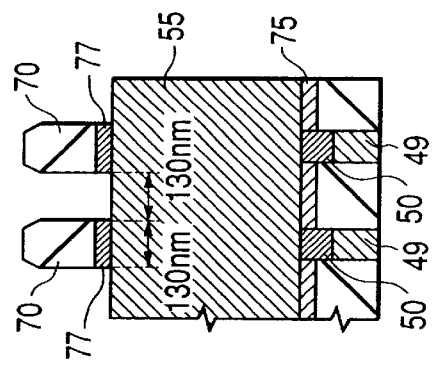
Figure 20C:
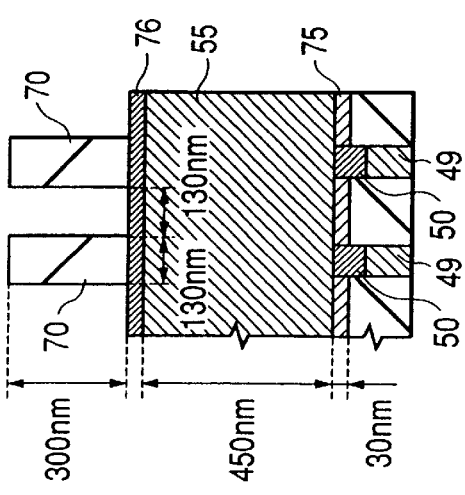
Figure 20D:
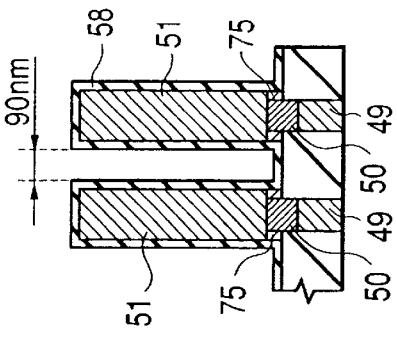
Figure 20E:
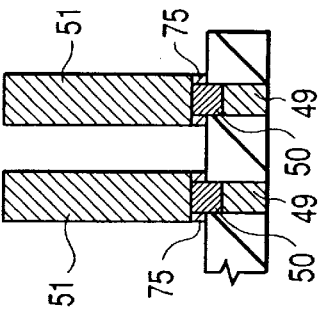

As illustrated in FIG. 20(e), the hard mask 77 (titanium oxide film) and titanium oxide film 75 are etched.

Figure 20F:
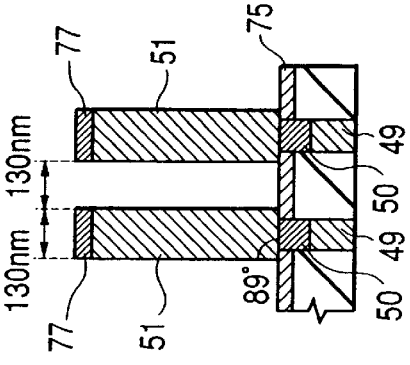

As illustrated in FIG. 20(f), a BST film 58 is then deposited. The BST film 58 can be formed as in Embodiment 1. The lower electrode 51 is thus formed as in Embodiment 1 to 5 by using titanium oxide as the hard mask 77. The titanium oxide film can be replaced with a tantalum oxide film.

Embodiment 7

The DRAM according to this Embodiment 7 differs from that of Embodiment 1 only in the constitution and manufacturing method of the information storage capacitive element C, but is similar in the constitution and manufacturing method of the other members. Accordingly, the manufacturing method of the information storage capacitive element C will next be described and a description of that of the other members will be omitted.

FIG. 21 are cross-sectional views illustrating, in order of step, one example of the manufacturing steps of the information storage capacitive element of the DRAM according to Embodiment 7. FIG. 21 each illustrates, similar to FIGS. 11 and 12, a cross-section taken along line B—B in FIG. 10(a) and illustrates only the region of the information storage capacitive element C of the DRAM.

Figure 21A:
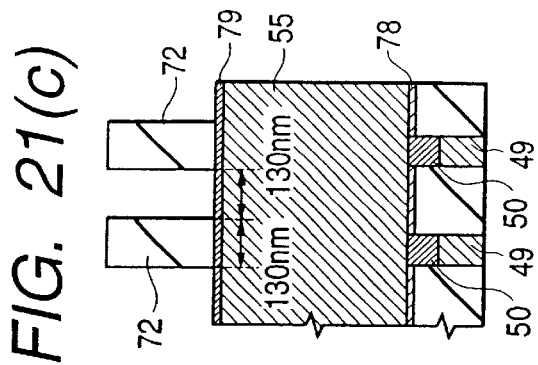
FIGS. 21(a) to (f) are each a cross-sectional view illustrating, in the order of step, one example of the manufacturing step of the information storage capacitive element of DRAM according to Embodiment 7 of the present invention.

After the step of FIG. 8 in Embodiment 1 (in which a silicon nitride film 78 is formed instead of the titanium nitride film 47 of Embodiment 1), as illustrated in FIG. 21(a), a ruthenium film 55, a platinum film 79 and a silicon oxide film 71 are formed over the silicon nitride film 78, followed by the formation of a patterned photoresist film 70 over the silicon oxide film 71.

Since the ruthenium film 55 is similar to that in Embodiment 3, a detailed description of it is omitted. The platinum film 79 is a kind of a blocking film upon etching of the ruthenium film 55 and has a function of protecting the surface of the lower electrode 51. In addition, the platinum film 79 will serve as a part of the lower electrode 51. The film thickness of the platinum film 79 is 30 nm.

The silicon oxide film 71 is similar to the silicon oxide film 56 in Embodiment 1. The silicon oxide film 56 functions as a hard mask used upon etching of the platinum film 79 and ruthenium film 55. Its film thickness is formed to 0.3 $\mu$m in consideration of its decrease in the subsequent etching step.

The photoresist film 70 is used as a mask for patterning of the silicon oxide film 71. It is formed by the ordinary photolithography step. The patterning of the photoresist film 70 is carried out as in Embodiment 1.

Figure 21B:
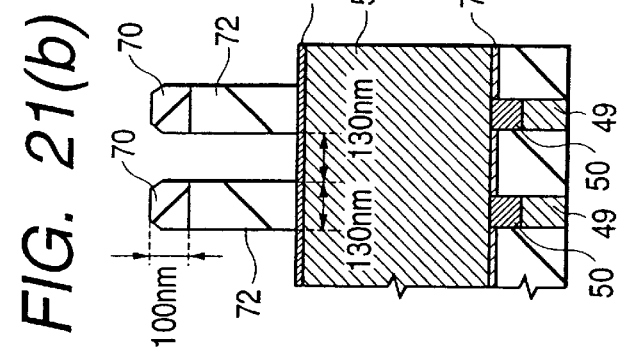

As illustrated in FIG. 21(b), the silicon oxide film 71 is etched with the photoresist film 70 as a mask, whereby a hard mask 72 made of a silicon oxide film is formed. The silicon oxide film is formed with good anisotropy so that the pattern of the photoresist film 70 is reproduced precisely and even at the bottom portion of the hard mask 72, it is formed with a pattern width of 130 nm and pattern space of 130 nm.

Figure 21C:
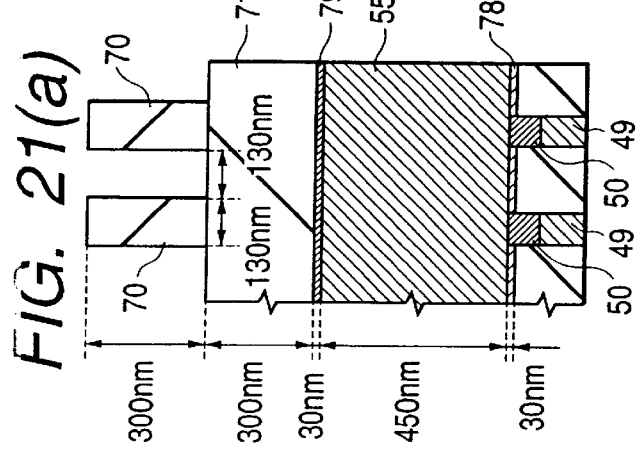

As illustrated in FIG. 21(c), the photoresist film 70 is then removed. The removal of the photoresist film 70 is conducted as in Embodiment 1.

Figure 21D:
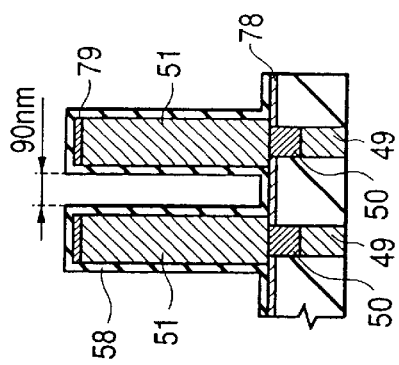

As illustrated in FIG. 21(d), the platinum film 79 and the ruthenium film 55 are etched using, as a mask, the hard mask 72 made of a silicon oxide film. Etching of the ruthenium film 55 is carried out in a similar manner to Embodiment 1 so that it is formed to have a taper angle of 89 degree, almost a right angle, with good anisotropy. In this manner, the lower electrode 51 is formed. The platinum film 79 is formed over the lower electrode 51. The platinum film is hardly etched in the etching step so that it is useful for protecting the etching of the edges of the ruthenium film. The hard mask 72 is etched largely and owing to a decrease in the film thickness, it finally remains only a little on the lower electrode 51.

Figure 21E:
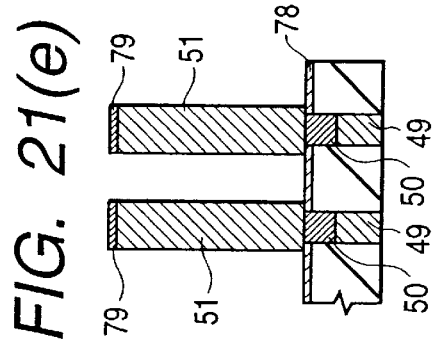

As illustrated in FIG. 21(e), the hard mask 72 is removed. By this removing step of the hard mask 72, the platinum film 79 is hardly etched. The underlying film is a silicon nitride film 78 so that excessive etching of the underlying film is also prevented.

Figure 21F:
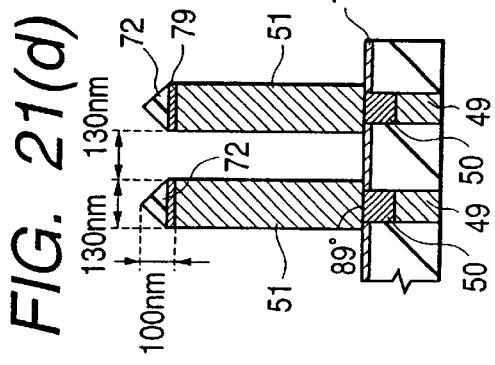

As illustrated in FIG. 21(f), the BST film 58 is deposited without removing the platinum film 79. The BST film 58 can be formed in a similar manner to Embodiment 1. The deposition of the BST film 58 without removing the platinum film 79 brings about similar merits as in Embodiment 1. The subsequent steps are similar to those of Embodiment 1 so that a description of them is omitted.

The platinum film 79 remains on the surface of the lower electrode 51. Owing to its excellent heat resistance, neither volumetric increase nor quality change occurs even by the heat treatment of the BST film 58 under an oxidizing atmosphere. In addition, the platinum film 79 functions as a part of the lower electrode 51, which makes it possible to function the whole surface of the lower electrode 51 contiguous to the BST film 58 as a capacitor. The whole surface area of the lower electrode 51 therefore contributes to the capacitor, thereby increasing the storage capacitance of the information storage capacitive element C and improving the performance of the DRAM.

As in Embodiment 1, the lower electrode 51 can also be made of ruthenium dioxide or a laminate film of ruthenium and ruthenium dioxide.

Embodiment 8

The DRAM according to this Embodiment 8 differs from that of Embodiment 1 only in the constitution and manufacturing method of the information storage capacitive element C, but is similar in the constitution and manufacturing method of the other members. Accordingly, the manufacturing method of the information storage capacitive element C will next be described and a description of that of the other members will be omitted herein.

FIG. 22 are cross-sectional views illustrating, in the order of step, one example of the manufacturing steps of the information storage capacitive element of the DRAM according to Embodiment 8. FIG. 22 each illustrates, similar to FIGS. 11 and 12, a cross-section taken along line B—B in FIG. 10(a) and illustrates only the region of the information storage capacitive element C of the DRAM.

After the step of FIG. 8 in Embodiment 1, as illustrated in FIG. 22(a), a ruthenium film 55 and a silicon nitride film 80 are formed above a titanium nitride film 47, followed by the formation of a patterned photoresist film 70 on the silicon nitride film 80.

The ruthenium film 55 is similar to that in Embodiment 1 so that a detailed description of it is omitted. The silicon nitride film 80 serves as a hard mask upon etching of the ruthenium film 55. Its film thickness is adjusted to 60 nm in consideration of its decrease caused upon etching of the ruthenium film 55.

The photoresist film 70 is used as a mask for patterning of the silicon nitride film 80. It is formed by the ordinary photolithography step. The patterning of the photoresist film 70 is carried out as in Embodiment 1.

As illustrated in FIG. 22(b), the silicon nitride film 80 is then etched with the photoresist film 70 as a mask, whereby a hard mask 81 formed of the silicon nitride film is formed. Since the silicon nitride film 80 is formed with good anisotropy, the pattern of the photoresist film 70 is reproduced exactly and even at the bottom portion of the hard mask 81, it is formed to have a pattern width of 130 nm and pattern space of 130 nm.

As illustrated in FIG. 22(c), the photoresist film 70 is then removed. The removal of the photoresist film 70 is carried out as in Embodiment 1.

As illustrated in FIG. 22(d), the ruthenium film 55 is etched using, as a mask, the hard mask 81 made of the silicon nitride film. The ruthenium film 55 is etched as in Embodiment 1 so that it is formed to have a taper angle of 89 degree, almost a right angle, with good anisotropy. Thus, the lower electrode 51 is formed. During etching, the hard mask 81 is etched a little, resulting in a decrease in the film thickness to 40 nm.

As illustrated in FIG. 22(e), the titanium nitride film 47 is removed. Upon this removing step of the titanium nitride film, the hard mask 81 is further etched and comes to have round edges, which results in an improvement in the covering properties for the BST film 58 and also an improvement in the reliability of the information storage capacitive element C.

As illustrated in FIG. 22(f), the BST film 58 is deposited without removing the hard mask 81. The BST film 58 can be formed as in Embodiment 1. Deposition of the BST film 58 without removing the hard mask 81 brings about similar merits to those described in Embodiment 1. In addition, a silicon nitride film having a higher dielectric constant than a silicon oxide film is employed as the hard mask 81 in this Embodiment so that a ratio of the upper portion of the lower electrode 51 contributing to the capacitance of the capacitor becomes larger than that of Embodiment 1. The subsequent steps are similar to those of Embodiment 1 so that a description of it is omitted.

As in Embodiment 1, the lower electrode 52 can also be made of ruthenium dioxide or a laminate film of ruthenium and ruthenium dioxide.

Embodiment 9

The DRAM according to this Embodiment 9 differs from that of Embodiment 1 only in the constitution and manufacturing method of the information storage capacitive element C, but is similar in the constitution and manufacturing method of the other members. Accordingly, the manufacturing method of the information storage capacitive element C will next be described and a description of that of the other members will be omitted herein.

FIG. 23 are cross-sectional views illustrating, in the order of step, one example of the manufacturing steps of the information storage capacitive element of the DRAM according to Embodiment 9. FIG. 23 each illustrates, similar to FIGS. 11 and 12, a cross-section taken along line B—B in FIG. 10(a) and illustrates only the region of the information storage capacitive element C of the DRAM.

Figure 23A:
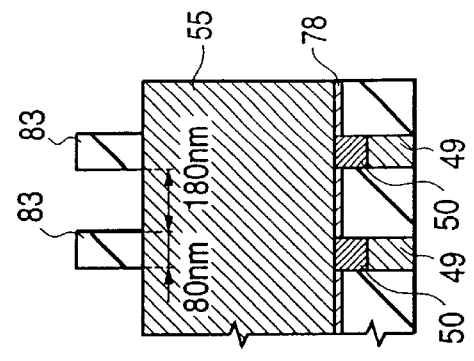
FIGS. 23(a) to (e) are each a cross-sectional view illustrating, in the order of step, one example of the manufacturing step of the information storage capacitive element of DRAM according to Embodiment 9 of the present invention.

After the step of FIG. 8 in Embodiment 1 (a silicon nitride film 78 is formed instead of the titanium nitride film 47 of Embodiment 1), as illustrated in FIG. 23(a), a ruthenium film 55 and a silicon oxide film 82 are formed over the silicon nitride film 78, followed by the formation of a patterned photoresist film 70 over the silicon oxide film 82.

Since the ruthenium film 55 is similar to that in Embodiment 1, a detailed description of it is omitted. The silicon oxide film 82 serves as a hard mask upon etching of the ruthenium film 55. Its thickness is selected so as to disappear just when the etching of the ruthenium film 55 is completed, for example, 150 nm.

The photoresist film 70 is used as a mask for patterning of the silicon oxide film 82. It is formed by the ordinary photolithography. The patterning of the photoresist film 70 is selected, after consideration of the film thickness of the silicon oxide film 82, so that the silicon oxide film 82 disappears just when the etching of the ruthenium film 55 is completed. When the silicon oxide film 82 is 150 nm thick, the pattern width and pattern space are formed to be 80 nm and 180 nm, respectively.

Figure 23B:
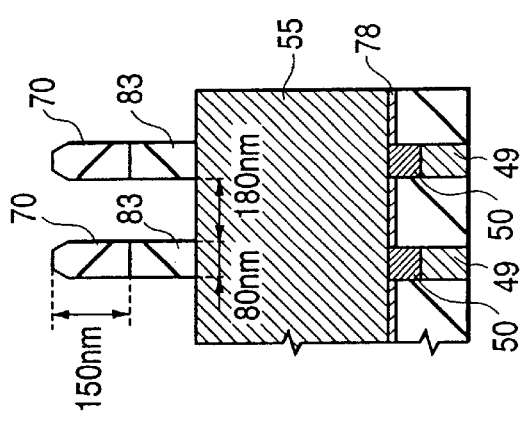

As illustrated in FIG. 23(b), the silicon oxide film 82 is etched with the photoresist film 70 as a mask, whereby a hard mask 83 made of a silicon oxide film is formed. The silicon oxide film is formed with good anisotropy so that the pattern of the photoresist film 70 is reproduced precisely and even at the bottom portion of the hard mask 83, it is formed with the pattern width of 80 nm and pattern space of 180 nm.

Figure 23C:
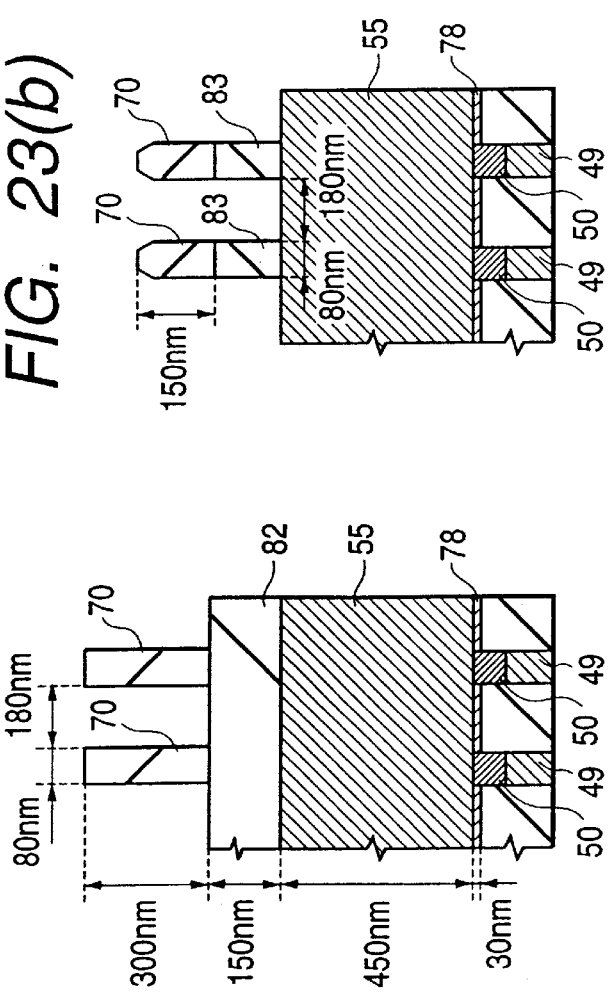

As illustrated in FIG. 23(c), the photoresist film 70 is then removed. The removal of the photoresist film 70 is conducted as in Embodiment 1.

Figure 23D:
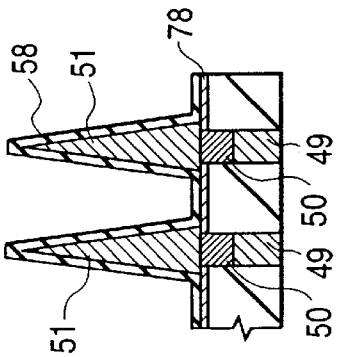

As illustrated in FIG. 23(d), the ruthenium film 55 is etched using, as a mask, the hard mask 83 made of a silicon oxide film. Etching of the ruthenium film 55 is carried out under conditions a little different from those of Embodiment 1, more specifically, under conditions permitting the etching of the ruthenium film 55 to have a little taper shape The over etching amount of 100% in Embodiment 1 is lowered to, for example, 30%. The other conditions are similar to those of Embodiment 1. By the etching under such conditions, the ruthenium film 55 is etched to have a taper angle of not 89 degree but about 85 degree. As described above, the film thickness and pattern width are selected so that the hard mask 83 disappears just when the etching of the ruthenium film 55 is completed. As a result, when the etching is completed, the lower electrode 51 has a triangular cross-section as illustrated in the drawing. Thus, the hard mask 83 has disappeared at the time when the lower electrode 51 is completed, so that removal of the hard mask by etching is not required. This embodiment therefore makes it possible to simplify manufacturing steps. This Embodiment causes neither deterioration in the processed shape of the lower electrode 51 nor roughening of the underlying film.

Figure 23E:
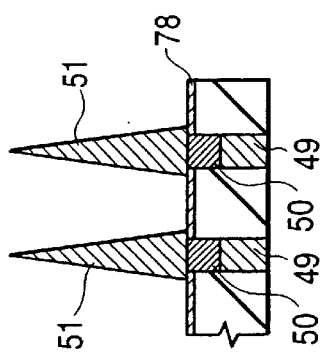

As illustrated in FIG. 23(e), a BST film 58 is deposited. The BST film 58 can be formed in a similar manner to Embodiment 1.

Since this embodiment does not need the removing step of the hard mask 83, the same effects as described in Embodiment 1 are available. In addition, a substance which lowers the capacitance is not formed between the lower electrode 51 and the BST film 58, the whole surface area of the lower electrode 51 can be used effectively.

As in Embodiment 1, the lower electrode 51 can also be made of ruthenium dioxide or a laminate film of ruthenium and ruthenium dioxide. The silicon nitride film 78 can be replaced with a titanium nitride film. In this case, the titanium nitride film must be etched after the step of FIG. 23(d). In consideration of the necessity of the etching step, the use of the silicon nitride film 78 is preferred.

Embodiment 10

The DRAM according to this Embodiment 10 differs from that of Embodiment 1 in the constitution and manufacturing method of the information storage capacitive element C. The other members are different from those of Embodiment 1 in the size. Described specifically, in Embodiment 1, the lower electrode 51 is formed with a pitch of 260 µm along line B—B of FIG. 10(a), while in this Embodiment, it is formed with a pitch of 160 µm. The DRAM according to this embodiment is applied to a device having an integration degree of 4 to 16 Gbit. The size of the members other than the information storage capacitive element C is formed to suit for the above-described pitch of 160 µm.

FIG. 24 are cross-sectional views illustrating, in the order of step, one example of the manufacturing steps of the information storage capacitive element of the DRAM according to Embodiment 10. FIG. 24 each illustrates, similar to FIGS. 11 and 12, a cross-section taken along line B—B in FIG. 10(a) and illustrates only the region of the information storage capacitive element C of the DRAM.

Figure 24C:
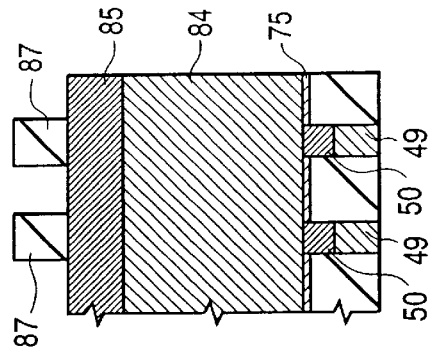
FIGS. 24(a) to (f) are each a cross-sectional view illustrating, in the order of step, one example of the manufacturing step of the information storage capacitive element of DRAM according to Embodiment 10 of the present invention.
Figure 24B:
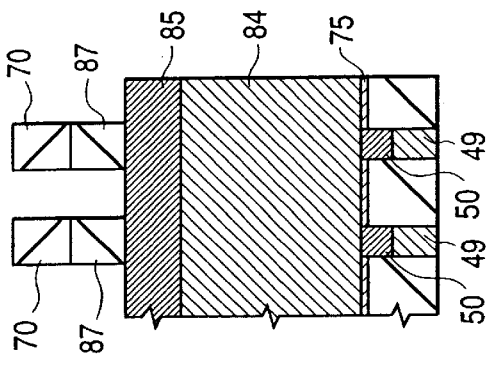
Figure 24A:
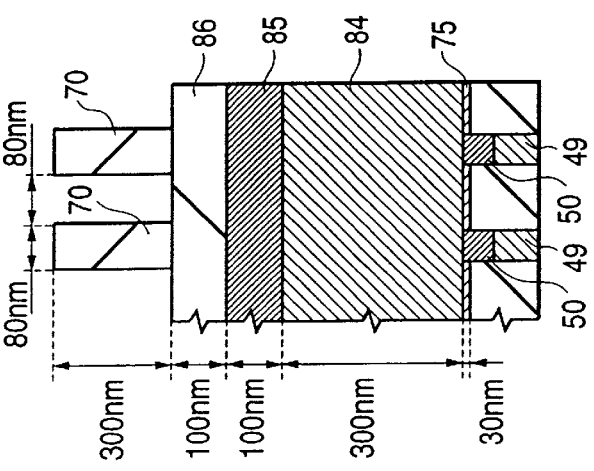

After the step of FIG. 8 in Embodiment 1 (in which, however, each member is formed to fit for the above-described size and a titanium oxide film 75 has been formed instead of the titanium nitride film 47), as illustrated in FIG. 24(a), an iridium film 84, a ruthenium film 85 and a silicon oxide film 86 are formed above the titanium oxide film 75, followed by the formation of a patterned photoresist film 70 on the silicon oxide film 86.

The iridium film 84 is formed, for example, by the CVD or sputtering method and it will constitute a part of the lower electrode 51. It is formed to have a thickness of, for example, 300 nm. The ruthenium film 85 is used as a part of a hard mask upon etching of the iridium film 84 and it is formed to have a thickness of 100 nm. The silicon oxide film 86 is similar to the silicon oxide film 56 in Embodiment 1 and it functions as a hard mask upon etching of the ruthenium film 85. It is formed to have a thickness of 100 nm in consideration of its decrease in the subsequent etching step.

The photoresist film 70 is used as a mask for patterning of the silicon oxide film 86. It is formed by the ordinary photolithography step. The patterning of the photoresist film 70 is carried out as in Embodiment 1 except that the pattern size is smaller than that of Embodiment 1, more specifically, a pattern width of 80 nm and a pattern space of 80 nm. The photoresist film 70 is formed to have a thickness of 300 nm in consideration of its decrease caused by etching of the silicon oxide film 86. As in Embodiment 1, EB (Electron Beam) resist can be employed as the photoresist film 70.

As illustrated in FIG. 24(b), the silicon oxide film 86 is then etched with the photoresist film 70 as a mask, whereby a hard mask 87 for patterning of the ruthenium film 85 formed. The silicon oxide film is formed with good anisotropy so that it exactly reproduces the pattern of the photoresist film 70 and even at the bottom portion of the hard mask 87, it has a pattern width of 80 nm and a pattern space of 80 nm.

As illustrated in FIG. 24(c), the photoresist film 70 is then removed. The removal of the photoresist film 70 is conducted as in Embodiment 1.

Figure 24F:
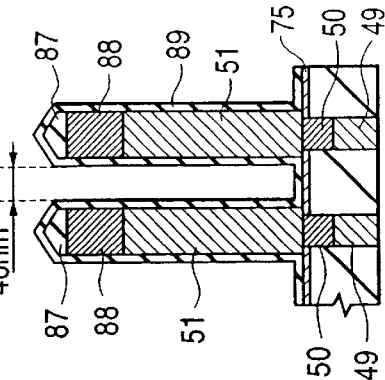
Figure 24E:
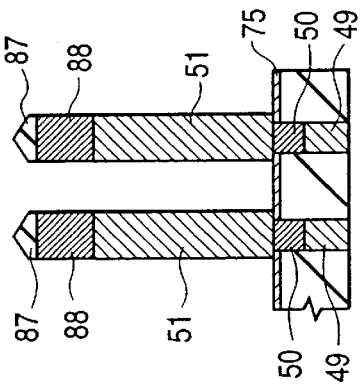
Figure 24D:
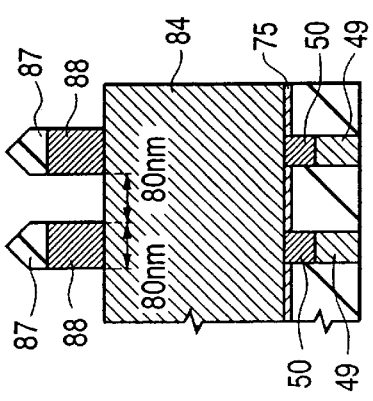

As illustrated in FIG. 24(d), using, as a mask, the hard mask 87 made of a silicon oxide film, the ruthenium film 85 is patterned, whereby a hard mask 88 made of ruthenium is formed. The ruthenium film 85 is etched by high anisotropic etching of ruthenium as described in the step of FIG. 11(d) of Embodiment 1. Under such etching conditions, the etching rate of the ruthenium film 85 is about 112 nm/min and the selection ratio to the hard mask 87 made of a silicon oxide film is as high as about 10. Such conditions make it possible to form the hard mask 88 to have a taper angle of 89 degree, almost a right angle and a pattern of the hard mask 88 in which the pattern of the hard mask 87 has been reproduced exactly is formed. In this stage, however, the hard mask 87 is etched partially and its film thickness decreases.

As illustrated in FIG. 24(e), the iridium film 84 is etched with the hard masks 87,88 as masks, whereby the lower electrode 51 is formed. In this stage, the hard mask 87 is etched further, resulting in a further decrease in its thickness. The etching of the iridium film 84 is conducted in a similar manner to the etching of the ruthenium film 85 in the previous step. The iridium film 84 is therefore formed with good anisotropy to have a taper angle of 89 degree, almost a right angle.

As illustrated in FIG. 24(f), a PZT film 89 is deposited without removing the hard masks 87,88. The PZT film 89 can be formed, for example, by the sputtering or CVD method. Deposition of the PZT film 89 without removing the hard masks 87,88 brings about similar merits to those of Embodiment 1. The hard mask 88 formed on the surface portion of the lower electrode 51 is made of ruthenium so that it has excellent heat resistance and high affinity with the PZT film 89. The side surface portion of the hard mask 88 is able to contribute to the capacitance of the capacitor. Since the hard mask 87 is however made of a silicon oxide film, it does not contribute to the capacitance of the capacitor. Even if there is a portion which does not contribute to the capacitance of the capacitor, a reduction rate of the capacitance in total is within a permissible range as in Embodiment 1.

The subsequent steps are almost similar to those of Embodiment 1 so that a description of them is omitted. It should however be noted that the PZT film 89 is annealed at about 500° C. and a iridium film is employed as an upper electrode.

This embodiment makes it possible to bring about effects as described in Embodiment 1 and in addition, to form a highly-integrated information storage capacitive element C. By this Embodiment, DRAMs of 4 to 16 Gbit classes can be manufactured.

The lower electrode 51 can also be made of iridium oxide or a laminate film of iridium and iridium oxide. After the above-described step of FIG. 24(e), etching of the silicon nitride film 75 and removal of the hard mask 87 can be conducted. In this case, owing to the absence of the hard mask 87, the upper portion of the hard mask 88 is able to contribute to the capacitance of the capacitor, resulting in an increase in the storage capacitance.

Embodiment 11

FIGS. 25 and 26 are each a cross-sectional view illustrating, in the order of step, one example of the manufacturing step of FeRAM according to Embodiment 11, more specifically, the portion of the information storage capacitive element C. The FeRAM according to this embodiment is similar to Embodiment 1 in the selecting MISFET and peripheral circuit. A description will next be made of only the information storage capacitive element C.

Figure 25A:
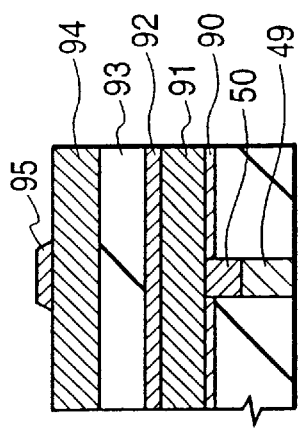
FIGS. 25(a) to (f) are each a cross-sectional view illustrating, in the order of step, one example of the manufacturing step of FeRAM according to Embodiment 11 of the present invention, particularly, a portion of the information storage capacitive element of the FeRAM.

After the step of FIG. 8 in Embodiment 1, as illustrated in FIG. 25(a), a titanium film of 20 nm thick, an iridium film 91 of 150 nm thick, a platinum film 92 of 20 nm thick, a PZT film 93 of 250 nm thick, an iridium film 94 of 150 nm thick and a platinum film 95 of 20 nm thick are deposited successively. Over the platinum film 95, a round resist film 96 similar to that described in Embodiment 2 is then formed. The round resist film 96 is formed above a plug 49.

Figure 25B:
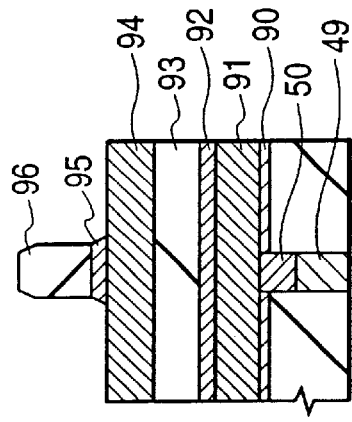

As illustrated in FIG. 25(b), the platinum film 95 is etched with the round resist film 96 as a mask. This platinum film 95 can be etched, for example, by the magnetron reactive ion etching method. Etching is conducted, for example, under the conditions of a reaction pressure of 5 mTorr, RF power of 1.2 kW, feeding of chlorine ($Cl_2$) and argon as etching gases at flow rates of 20 sccm and 10 sccm, respectively, and a substrate temperature at 30° C. Under such conditions, a taper angle of about 70 degree is formed by the anisotropy exhibited upon etching. Since the round resist film 96 has been formed, this etching does not generate a side-wall deposit on the platinum film 95.

Figure 25C:
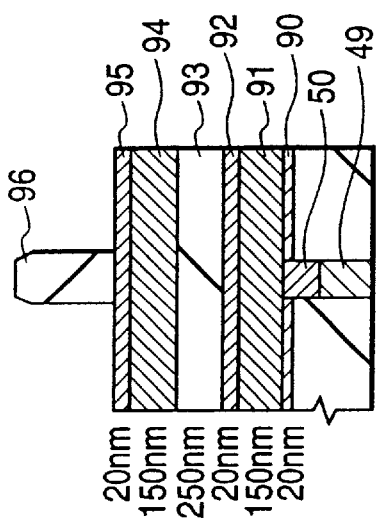
Figure 25D:
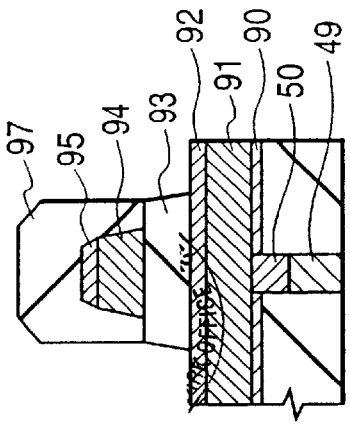

As illustrated in FIG. 25(c), the round resist film 96 is then removed by ashing or the like and the iridium film 94 is etched with the etched platinum film 95 as a mask (FIG. 25(d)). This etching of the iridium film 94 is carried out in a similar manner to the etching of the platinum film 95. The iridium film 94 after etching has a taper angle of about 70 degree and no side-wall deposit is formed.

Figure 25E:
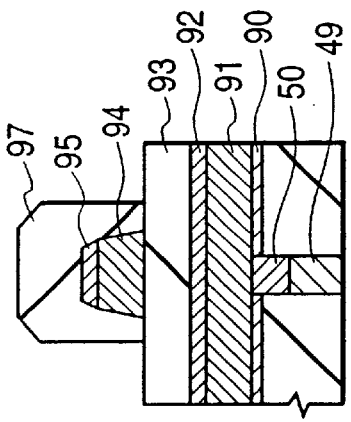
Figure 25F:
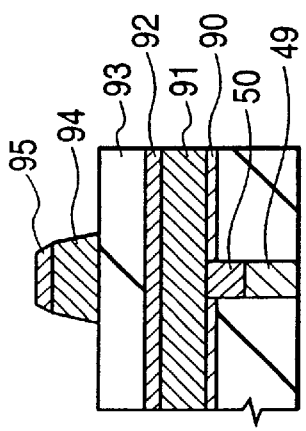

Without removing the platinum film 95 used as a hard mask upon etching of the iridium film 94, a resist film 97 is formed to cover the etched iridium film 94 (FIG. 25(e)). With the resist mask 97 as a mask, the PZT film 93 is etched (FIG. 25(f)). The etching of the PZT film 93 is conducted in a similar manner to the etching of the platinum film 95. After etching, the PZT film 93 has a taper angle of about 70 degree and no side-wall deposit is formed.

The resist film 97 is then removed (FIG. 26(g)) and a resist film 98 is formed so as to cover the etched PZT film 93. With the resist film 98 as a mask, the platinum film 92 is then etched (FIG. 26(h)). With the resist film 98 and the etched platinum film 92 as a mask, the iridium film 91 and titanium film 90 are etched (FIG. 26(i)). Finally, the resist film 98 is then removed by ashing or the like (FIG. 26(j)).

Thus formed is a capacitor constituted of an upper electrode made of the patterned platinum film 95 and iridium film 94, a dielectric film made of the patterned PZT film 93 and a lower electrode made of the patterned platinum film 92 and iridium film 91.

According to this embodiment, the iridium films 94,91 can be etched using the platinum films 95,92, whereby the capacitor of FeRAM can be formed with good precision.

The platinum can be replaced with ruthenium. In this case, the etching method of the ruthenium film as described in Embodiment 1 can be employed. In addition, PZT can be replaced with BST.

Embodiment 12

The DRAM according to this Embodiment 12 differs from that of Embodiment 7 only in the constitution and manufacturing method of the information storage capacitive element C, but is similar in the constitution and manufacturing method of the other members. Accordingly, the manufacturing method of the information storage capacitive element C will next be described and a description of that of the other members will be omitted herein.

Figure 28A:
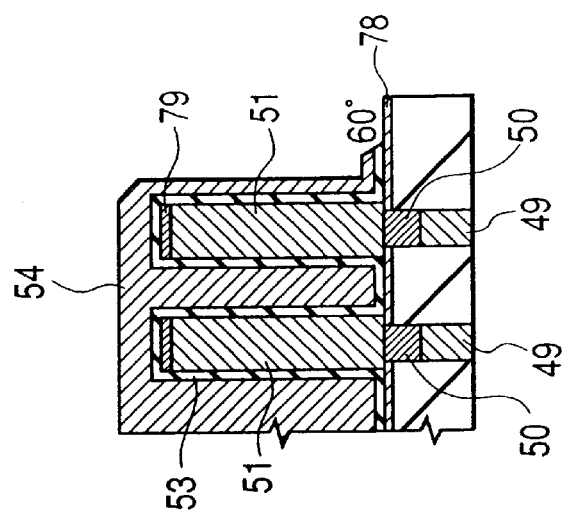
FIG. 28(a) to (c) are each a cross-sectional view illustrating, in the order of step, one example of the manufacturing step of DRAM according to Embodiment 12 of the present invention.
Figure 28B:
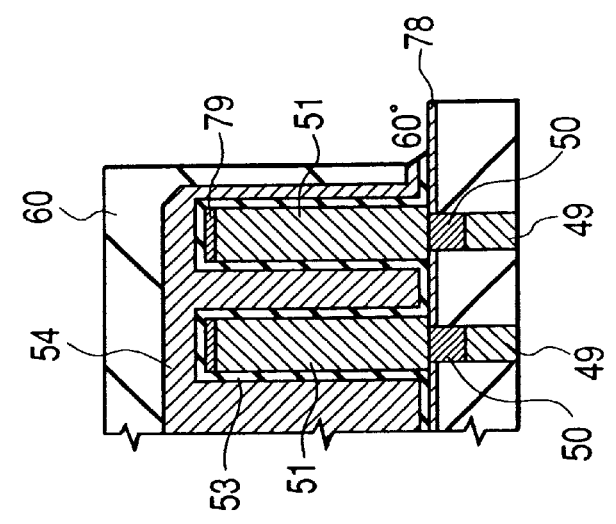
Figure 28C:
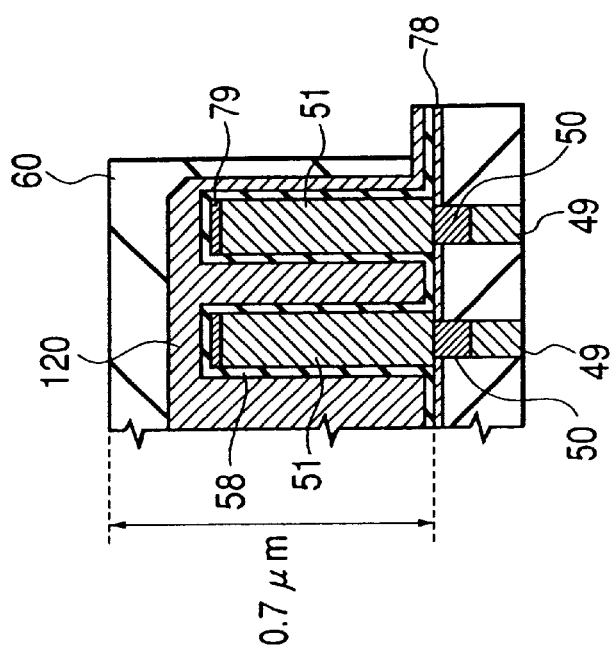

FIGS. 27 and 28 are each cross-sectional views illustrating, in the order of step, one example of the manufacturing steps of the information storage capacitive element of the DRAM according to Embodiment 12. FIGS. 27 and 28 illustrate, similar to FIGS. 11 and 12, cross-sections taken along line B—B in FIG. 10(a) and illustrate only the region of the information storage capacitive element C of the DRAM.

As illustrated in FIG. 27(a), a ruthenium film 55, a platinum film 79 and a silicon oxide film 71 are formed over a silicon nitride film 78, followed by the formation of a patterned photoresist film 70 over the silicon oxide film 71.

The silicon nitride film 78, ruthenium film 55, silicon oxide film 71 and photoresist film 70 are similar to those of Embodiment 7. The platinum film 79 is, similar to that in Embodiment 7, protects the surface of the lower electrode 51, functioning as a part of the lower electrode 51. The platinum film 79 serves as a protecting film upon ashing of the photoresist film 70. The function as a protecting film upon ashing will be described later. The film thickness of the platinum film 79 is 20 nm.

As illustrated in FIG. 27(b), the silicon oxide film 71 is then etched with the photoresist film 70 as a mask, whereby a hard mask 72 made of a silicon oxide film is formed. The silicon oxide film is, similar to that of Embodiment 7, processed with good anisotropy so that it reproduces the pattern of the photoresist film 70 exactly. Even at the bottom portion of the hard mask 72, the film is formed with a pattern width of 130 nm and pattern space of 130 nm.

As illustrated in FIG. 27(c), the photoresist film 70 is then removed. The removal of the photoresist film 70 is conducted by ashing. For ashing, a single-wafer system plasma asher containing oxygen as a raw material gas, a barrel type asher, an ozone asher using an ozone, or the like gas can be employed. Ashing is attained by exposing a film to the atmosphere of active oxygen such as oxygen radical or ozone, or the atmosphere of a strong acidic gas.

In this Embodiment, the platinum film 79 is formed over the ruthenium film 55 so that the ruthenium film 55 is not etched even upon ashing. It thus prevents erosion or disappearance of the ruthenium film 55. Described specifically, owing to the existence of oxygen radicals or ozone active in the ashing atmosphere, there is a possibility of the ruthenium film 55, which is to be the lower electrode 51, being eroded. Ruthenium is eroded (etched) by active oxygen or ozone, so when the ruthenium film 55 is exposed, the portion of the ruthenium film 55 which has no hard mask 72 disposed thereover happens to be eroded. The region free from the hard mask 72 is a region to be removed by etching in the subsequent step, but the anisotropic erosion by ashing enters into the region below the hard mask 72 and happens to lower the processing accuracy of the lower electrode 51. In an extreme case, there is a potential danger of the disappearance of the ruthenium film 55.

In this Embodiment, however, the platinum film 79 is formed over the ruthenium film 55. Different from the ruthenium film 79, the platinum film 79 is not etched by active oxygen or ozone. As a result, in the ashing step, the ruthenium film 55 is free from exposure to active oxygen or ozone and therefore, is never eroded. It is therefore possible to improve the processing accuracy of the lower electrode 51 in the subsequent step and in addition, to prevent the disappearance of the ruthenium film 55, thereby actualizing the processing of the lower electrode 51.

As illustrated in FIG. 27(d), the platinum film 79 and the ruthenium film 55 are etched using, as a mask, the hard mask 72 made of a silicon oxide film, as described in Embodiment 7. The ruthenium film 55 exists without being eroded as described above and it is formed with good anisotropy to have a taper angle of 89 degree, that is, substantially a right angle so that its processing accuracy can be improved.

Here, the platinum film 79 and the ruthenium film 55 are successively etched in one etching step. Etching of the platinum film 79 presumably forms a nonvolatile platinum reaction product. Since the platinum film 79 is as thin as 20 nm, the generation amount of the nonvolatile platinum reaction product is not so much. In the etching of the ruthenium film 55 conducted subsequent to the processing of the platinum film 79, the existence of this platinum reaction product does not cause any special problem and has little influence on the anisotropy of the processing of the ruthenium film 55. As a result, the ruthenium film 55 is formed to have a taper angle of 89 degree, almost a right angle.

The platinum film 79 is hardly etched both in the above-described ashing step and the ruthenium etching of this step so that etching of the edges of the ruthenium film can be prevented as in Embodiment 7. The hard mask 72 is etched largely and its film thickness decreases and remains only a little over the lower electrode 51, which is similar to Embodiment 7.

As in Embodiment 7, the hard mask 72 is removed (FIG. 27(e)). This Embodiment is similar to Embodiment 7 in the points that the platinum film 79 is hardly etched by this removing step of the hard mask 72, and the underlying film formed of the silicon nitride film 78 prevents excessive etching.

It should be noted that the removal of the hard mask 72 is not necessary and without removing the hard mask 72, the BST film 58 may be deposited in the subsequent step. In this case, as in Embodiment 1, the upper surface portion of the lower electrode 51 does not function as a capacitor, but the area (contribution ratio) of the upper surface portion is small enough not to cause a problem.

As illustrated in FIG. 27(f), the BST film 58 is deposited without removing the platinum film 79. The BST film 58 can be formed in a similar manner to Embodiment 1. The deposition of the BST film 58 without removing the platinum film 79 brings about similar merits as in Embodiment 1.

As illustrated in FIG. 27(g), the BST film 58 is heat treated (annealed) in an oxygen atmosphere. The heat treating conditions and the like are similar to those of Embodiment 1.

As illustrated in FIG. 27(h), the platinum film 120 is deposited over the BST film 58. The platinum film 120 can be deposited by the sputtering or CVD method. Similar to the platinum film 79, the platinum film 120 is resistant to erosion upon ashing of the photoresist film 60, which will be described later.

As illustrated in FIG. 28(i), a photoresist film 60 is then formed over the platinum film 120. The photoresist film 60 is formed so as to cover the memory cell region of the DRAM.

As illustrated in FIG. 28(j), the platinum film 120 and BST film 58 are etched with this photoresist film 60 as a mask to form a capacitive insulating film 53 and upper electrode 54. Anisotropy upon etching of the platinum film 120 is not so good as that of the above-described ruthenium film, but since the upper electrode 54 is generally formed in one body over the whole surface of the memory cell region, the etched edges do not have a serious influence on the minute processing properties even if they are formed to have a little taper shape. The platinum film 120 is etched with a taper angle of about 60 degree.

As illustrated in FIG. 28(k), the photoresist film 60 is removed by ashing. This ashing is carried out in a similar manner to that in the case of the photoresist film 70. In this Embodiment, the platinum film 120 is used as a material which is to be the upper electrode 54, which makes it possible to prevent erosion by ashing as in the case of the platinum film 79 constituting the lower electrode 51. The existence of the platinum film 120 thus makes it possible to process and actualize the upper electrode 54 without causing erosion or disappearance of the platinum film 120.

In this manner, the information storage capacitive element C having the lower electrode 51 made of ruthenium and platinum, the capacitive insulating film 53 made of BST and the upper electrode 54 made of platinum is completed (FIG. 28(k)), whereby the memory cell of the DRAM formed of the memory cell selecting MISFETQs and the information storage capacitive element C connected in series therewith is completed.

The platinum film 120 is deposited, for example, by the sputtering or CVD method. For the etching of the platinum film 120 or BST film 58, the etching apparatus as illustrated in FIG. 13 of Embodiment 1 can be employed. Etching is carried out, for example, under the conditions of a reaction pressure of 2 mTorr, plasma source power of 300 W, RF bias power of 600 W, feeding of carbon tetrafluoride ($CF_4$) and argon (Ar) at flow rates of 10 sccm and 40 sccm, respectively and an over etching amount of 10%. Under such conditions, the etched shape is not formed with anisotropy and the taper angle becomes about 60 degree, but it does not pose any problem because minute processing is not required here. Under such conditions, the etching rate of platinum is 100 nm/min, while that of BST is 100 nm/min.

The subsequent steps are similar to those of Embodiment 1 so that a description of them is omitted.

The platinum film 79 remains on the surface of the lower electrode 51. Owing to its excellent heat resistance, neither volumetric change nor quality change occurs even by the heat treatment of the BST film 58 under an oxidizing atmosphere. In addition, according to the findings of the present inventors, platinum has good crystalline congeniality to BST so that the existence of the platinum film improves the properties of BST, thereby improving the capacitor properties on the upper surface of the lower electrode 51 and adhesion of BST. Moreover, the platinum film 79 functions as a part of the lower electrode 51, which permits the functioning, as a capacitor, of the whole surface area of the lower electrode 51 contiguous to the BST film 58. The whole surface area of the lower electrode 51 therefore contributes to the capacitor and increases the storage capacitance of the information storage capacitive element C, leading to an improvement in the performance of the DRAM. Such merits brought by the platinum film is similar to those of Embodiment 7. As in Embodiment 1, the lower electrode 51 can be formed of ruthenium dioxide or a laminate film of ruthenium and ruthenium dioxide.

Instead of the platinum film 79 of the lower electrode 51, ruthenium dioxide, tantalum oxide, titanium oxide, BST, silicon oxide, iridium or iridium dioxide can be employed. The above-exemplified material is, similar to platinum, resistant to etching by ashing, or has a smaller etching rate than ruthenium so that similar to the platinum film 79, it can prevent erosion or disappearance of the ruthenium film 55. Ruthenium dioxide, tantalum oxide, titanium oxide, BST or silicon oxide is not a novel substance which has not been used in the conventional process but a material whose properties or preparation process is well known. Use of such a substance, therefore, brings about the merit that the findings so far obtained in the conventional process can be made use of.

Embodiment 13

The DRAM according to Embodiment 13 differs from that of Embodiment 12 only in the upper electrode of the information storage capacitive element C, but is similar in the constitution and manufacturing method of the other members. Accordingly, the manufacturing method of the information storage capacitive element C will next be described and a description of that of the other members is omitted.

FIG. 29 are cross-sectional views illustrating, in the order of step, one example of the manufacturing steps of the information storage capacitive element of the DRAM according to Embodiment 13. FIG. 29 each illustrates, similar to FIGS. 11 and 12, a cross-section taken along line B—B in FIG. 10(a) and illustrate only the region of the information storage capacitive element C of the DRAM.

In a similar manner to the steps up to FIG. 27(g) in Embodiment 12, the BST film 58 is formed over the lower electrode 51.

Figure 29A:
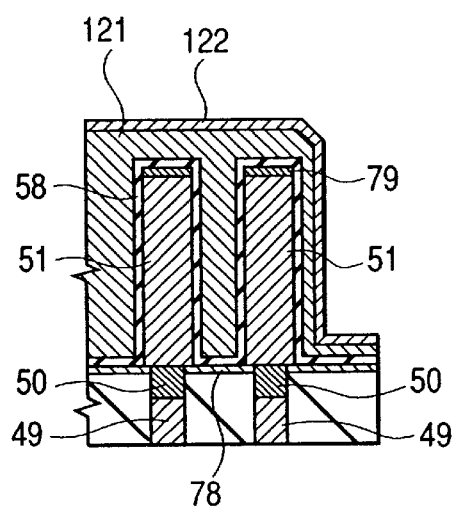
FIG. 29(a) to (d) are each a cross-sectional view illustrating, in the order of step, one example of the manufacturing process of DRAM according to Embodiment 13 of the present invention.

As illustrated in FIG. 29(a), a ruthenium film 121 and a titanium nitride film 122 are then deposited over a BST film 58. The ruthenium film 121 and the titanium nitride film 122 can be deposited by the sputtering or CVD method.

In this Embodiment, the titanium nitride film 122 is formed over the ruthenium film 121 so that, similar to the platinum film 79 of the lower electrode 51 in Embodiment 12, the titanium nitride film 122 can prevent erosion or disappearance of the ruthenium film 121 upon ashing of the photoresist film 60. In other words, the titanium nitride film 122 serves as a blocking film against the erosion of the ruthenium film 121 upon ashing of the photoresist film 60.

Figure 29B:
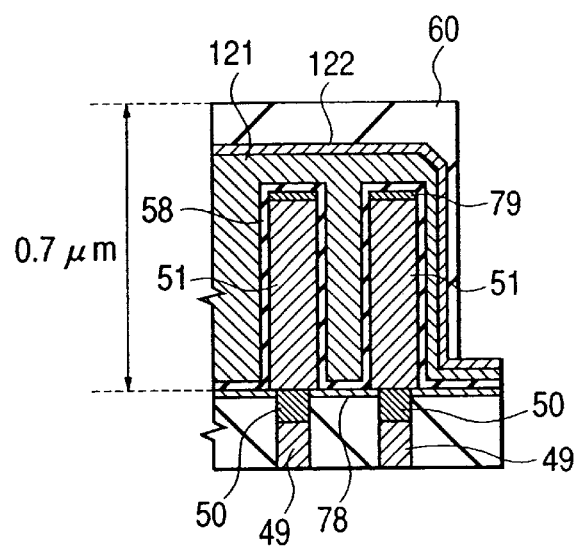
Figure 29C:
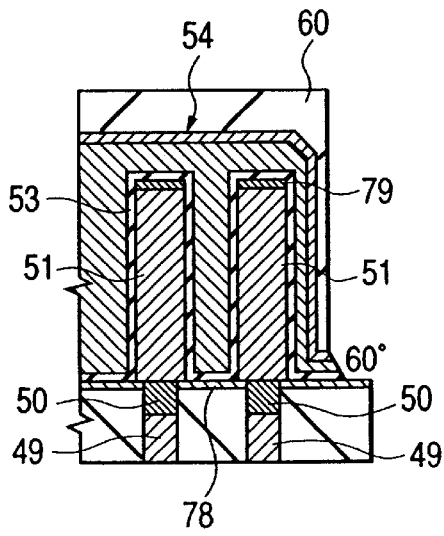
Figure 29D:
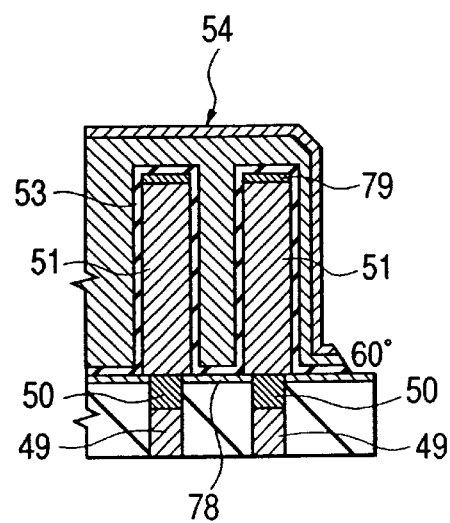

As illustrated in FIG. 29(b), the photoresist film 60 is formed over the titanium nitride film 122 so as to cover the memory cell region of the DRAM and as illustrated in FIG. 29(c), and the titanium nitride film 122, ruthenium film 121 and BST film 58 are etched with the photoresist film 60 as a mask, whereby the capacitive insulating film 53 made of the BST film 58 and the upper electrode 54 made of the titanium nitride film 122 and the ruthenium film 121 is formed. As illustrated in FIG. 29(d), the photoresist film 60 is removed by ashing. This ashing is carried out in a similar manner to the ashing of the photoresist film 70 in Embodiment 12.

In this Embodiment, since the ruthenium film 121 and titanium nitride film 122 are employed as materials which are to be the upper electrode 54 and the titanium nitride film 122 is formed over the ruthenium film 121, erosion by ashing can be prevented as in the case of the platinum film 79 in Embodiment 12. Described specifically, the titanium nitride film 122 is not etched because of the resistance to active oxygen radicals or ozone of the ashing atmosphere so that the ruthenium film 121 which lies below the titanium nitride film 122 can be protected. Thus, the erosion or disappearance of the ruthenium film 121 can be prevented, which makes it possible to process and actualize the upper electrode 54.

Although on the etched end surface of the titanium nitride film 122 and ruthenium film 121, ruthenium appears and erosion of this portion occurs. The upper electrode 54 is generally formed as one body all over the surface of the memory cell region so that some erosion at the etched end portion has not a large influence on the minute processing properties.

In this manner, the information storage capacitive element C having the lower electrode 51 made of ruthenium and platinum, capacitive insulating film 53 made of BST and upper electrode 54 made of ruthenium and titanium nitride is completed (FIG. 29(d)), whereby the memory cell of the DRAM formed of the memory cell selecting MISFETQs and the information storage capacitive element C connected in series therewith is completed.

For etching of the titanium nitride film 122, ruthenium film 121 and BST film 58, the etching apparatus as illustrated in FIG. 13 of Embodiment 1 can be employed. Etching is carried out, for example, under conditions of a reaction pressure of 2 mTorr, plasma source power of 300 W, RF bias power of 600 W, feeding of carbon tetrafluoride ($CF_4$) and argon (Ar) at flow rates of 10 sccm and 40 sccm, respectively and an over etching amount of 10%. Under such conditions, etching is not carried out with anisotropy and the taper angle becomes about 60 degree, which however does not pose any problem because minute processing is not required here. Under such conditions, the etching rates of ruthenium, BST and titanium nitride are 150 nm/min, 100 nm/min and 120 nm/min, respectively.

The subsequent steps are similar to those of Embodiment 1 so that a description of them is omitted.

Effects of leaving the platinum film 79 on the surface of the lower electrode 51 are similar to those of Embodiment 12. The lower electrode 51 can also be made of ruthenium dioxide or a laminate film of ruthenium and ruthenium dioxide, which is similar to Embodiment 1.

As in Embodiment 12, the platinum film 79 of the lower electrode 51 can be replaced with ruthenium dioxide, tantalum oxide, titanium oxide, BST, silicon oxide, iridium or iridium dioxide.

In this Embodiment, it is possible to form, as in Embodiment 1, a silicon oxide film 61 made of SOG after the formation of the information storage capacitive element C, followed by the formation of a plug 64. On the upper layer (surface layer) of the upper electrode 54, titanium nitride is formed, which makes it possible to reduce the contact resistance of the upper electrode 54 with the plug 64.

Embodiment 14

The DRAM according to this Embodiment 14 differs from that of Embodiment 13 only in the upper electrode of the information storage capacitive element C, but is similar in the constitution and manufacturing method of the other members. Accordingly, a description will next be made of the manufacturing method of the information storage capacitive element C and a description of that of the other members is omitted herein.

FIG. 30 are cross-sectional views illustrating, in the order of step, one example of the manufacturing steps of the information storage capacitive element of the DRAM according to Embodiment 14. FIG. 30 each illustrates, similar to FIGS. 11 and 12, cross-sections taken along line B—B in FIG. 10(a) and illustrate only the region of the information storage capacitive element C of the DRAM.

Similar to Embodiment 13, as illustrated in FIG. 27(g) of Embodiment 12, a BST film 58 is formed over the lower electrode 51.

Figure 30A:
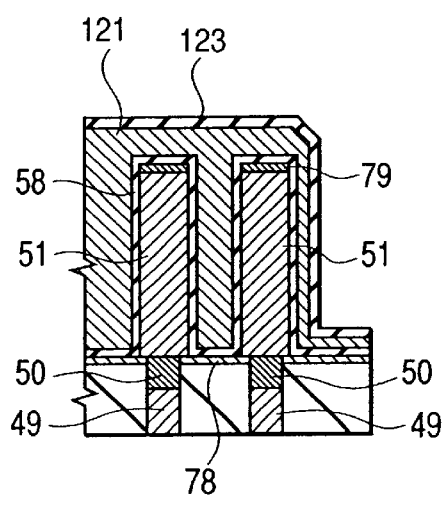
FIG. 30(a) to (d) are each a cross-sectional view illustrating, in the order of step, one example of the manufacturing step of DRAM according to Embodiment 14 of the present invention.

As illustrated in FIG. 30(a), a ruthenium film 121 and a silicon oxide film 123 are then deposited over the BST film 58. The ruthenium film 121 can be deposited by the sputtering or CVD method, while the silicon oxide film 124 is formed, for example, by the CVD method using TEOS as a raw material gas. The silicon oxide film 123 is formed to have a thickness of 30 nm.

In this Embodiment, the silicon oxide film 123 is formed over the ruthenium film 121 so that, similar to the titanium nitride film 122 in Embodiment 13, the silicon oxide film can be rendered to serve as a blocking film against the erosion or disappearance of the ruthenium film 121 upon ashing of the photoresist film 60.

Figure 30B:
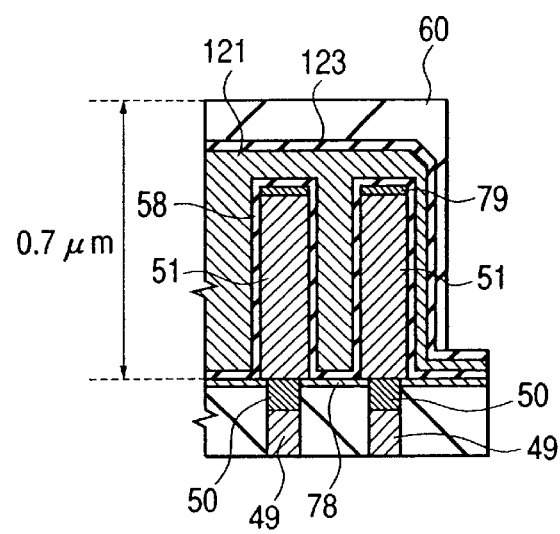
Figure 30C:
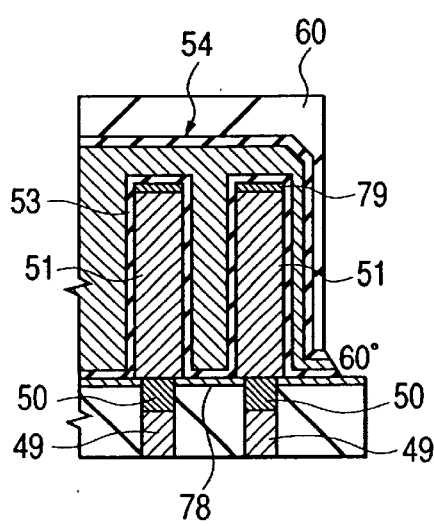
Figure 30D:
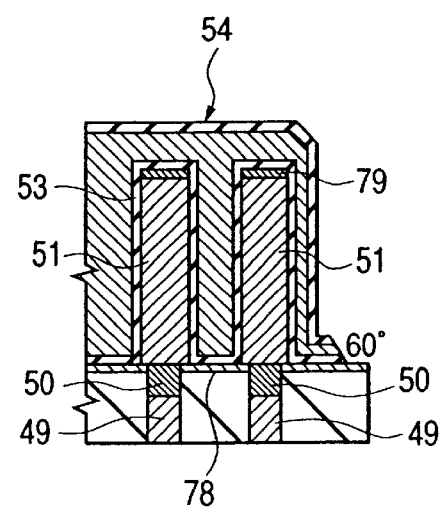

As illustrated in FIG. 30(b), the photoresist film 60 is formed over the silicon oxide film 123 so as to cover the memory cell region of the DRAM and as illustrated in FIG. 30(c), the silicon oxide film 123, ruthenium film 121 and BST film 58 are etched with the photoresist film 60 as a mask, whereby the capacitive insulating film 53 made of the BST film 58 and the upper electrode 54 made of the silicon oxide film 123 and the ruthenium film 121 are formed As illustrated in FIG. 30(d), the photoresist film 60 is removed by ashing. This ashing is carried out in a similar manner to the ashing of the photoresist film 70 in Embodiment 12.

In this Embodiment, since the ruthenium film 121 and silicon oxide film 123 are employed as materials for the upper electrode 54 and the silicon oxide film 123 is formed over the ruthenium film 121, erosion by ashing can be prevented as in the case of the titanium nitride film 122 of Embodiment 13. Described specifically, the silicon oxide film 123 is resistant to the etching by active oxygen radicals or ozone of the ashing atmosphere so that the ruthenium film 121 which lies below the silicon oxide film 123 can be protected.

Although on the etched end surface of the silicon oxide film 123 and ruthenium film 121, ruthenium appears but as in Embodiment 13, it does not cause any serious problem.

In this manner, the information storage capacitive element C having the lower electrode 51 made of ruthenium and platinum, capacitive insulating film 53 made of BST and upper electrode 54 made of ruthenium and silicon oxide film is completed (FIG. 30(d)), whereby the memory cell of the DRAM formed of the memory cell selecting MISFETQs and the information storage capacitive element C connected in series therewith is completed. The silicon oxide film 123, which is an insulating film, does not act as an electrode, but in this specification, it is considered to be included in the upper electrode 54, because it is formed integral with ruthenium constituting the upper electrode 54. Alternatively, another insulating film such as silicon nitride film can be employed as the silicon oxide film 123.

For the etching of the silicon oxide film 123, ruthenium film 121 and BST film 58, the etching apparatus as illustrated in FIG. 13 of Embodiment 1 can be employed as in Embodiment 13. Etching conditions are also similar to those of Embodiment 13. Under such conditions, the etching rates of ruthenium, BST and silicon oxide film are 150 nm/min, 100 nm/min and 300 nm/min, respectively.

The subsequent steps are similar to those of Embodiment 1 so that a description of them is omitted.

Effects of leaving the platinum film 79 on the surface of the lower electrode 51 are similar to those of Embodiment 12. As in Embodiment 1, the lower electrode 51 can be made of ruthenium dioxide or a laminate film of ruthenium and ruthenium dioxide 1.

The platinum film 79 of the lower electrode 51 can be replaced with ruthenium dioxide, tantalum oxide, titanium oxide, BST, silicon oxide, iridium or iridium dioxide as in Embodiment 12.

In this Embodiment, it is possible to form a silicon oxide film 61 made of SOG, similar to Embodiment 1, after the formation of the information storage capacitive element C. The silicon oxide film 123 becomes a part of the intrastratum insulating film together with the silicon oxide film 61 made of SOG. When unevenness is formed on the surface of the upper electrode, a silicon oxide film (TEOS oxide film) is formed to embed in the space between the upper electrode and SOG. It is also possible to make the silicon oxide film 123 function as a part of this silicon oxide film.

Embodiment 15

FIG. 31 are cross-sectional views illustrating, in the order of step, one example of the manufacturing steps of the information storage capacitive element of the DRAM according to Embodiment 15. FIG. 31 each illustrates, similar to FIGS. 11 and 12, a cross-section taken along line B—B in FIG. 10(a) and illustrates only the region of the information storage capacitive element C of the DRAM.

The manufacturing method of this Embodiment is similar to that of Embodiment 12 until the step of FIG. 27(g).

Figure 31A:
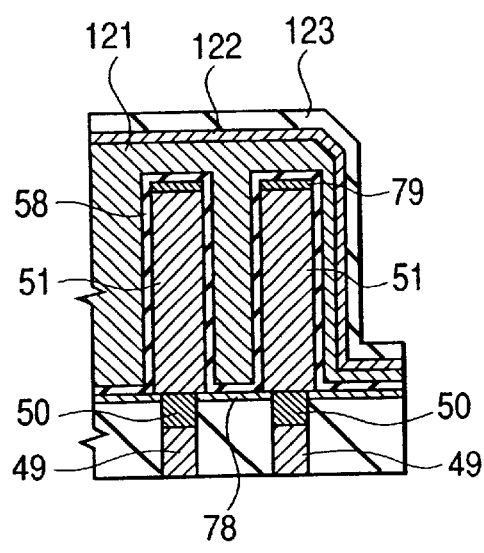
FIG. 31(a) to (d) are each a cross-sectional view illustrating, in the order of step, one example of the manufacturing step of DRAM according to Embodiment 15 of the present invention.

As illustrated in FIG. 27(g), the BST film 58 is formed over the lower electrode 51, followed by the successive formation of a ruthenium film 121, titanium nitride film 122 and silicon oxide film 123 as illustrated in FIG. 31(a). The formation of each of the ruthenium film 121, titanium nitride film 122 and silicon oxide film 123 can be carried out as is described in Embodiment 13 or 14.

Figure 31B:
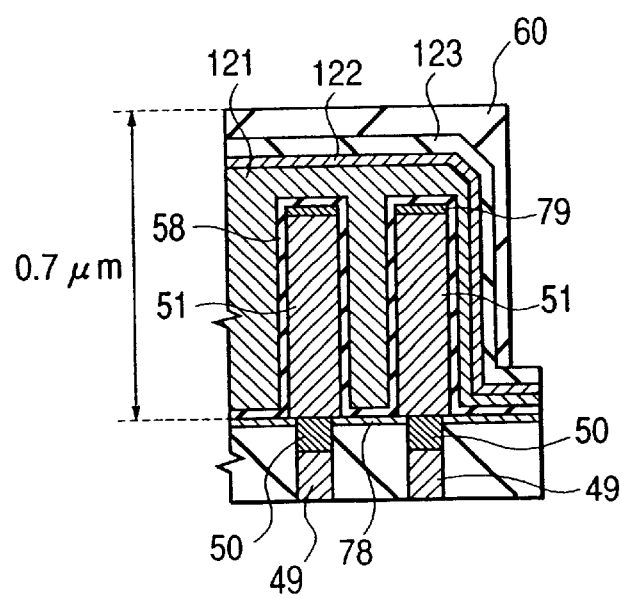
Figure 31C:
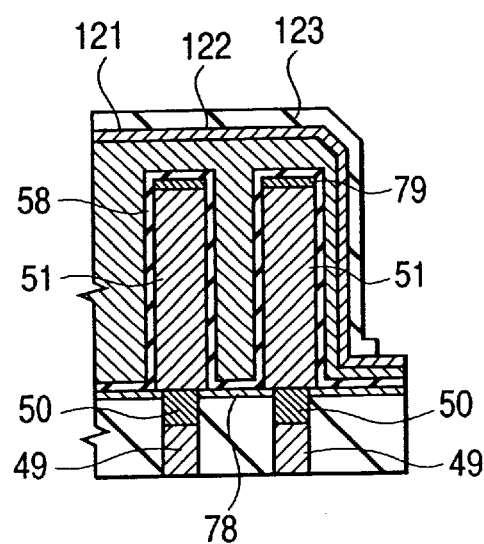

As illustrated in FIG. 31(b), a photoresist film 60 is then formed over the silicon oxide film 123 to cover the memory cell region of the DRAM. As illustrated in FIG. 31(c), the silicon oxide film 123 is etched with the photoresist film 60 as a mask, followed by removal of the photoresist film by ashing.

In this Embodiment, ashing of the photoresist film 60 is carried out while leaving the titanium nitride film 122 on the ruthenium film 121 so that the ruthenium film 121 is never eroded by ashing.

Figure 31D:
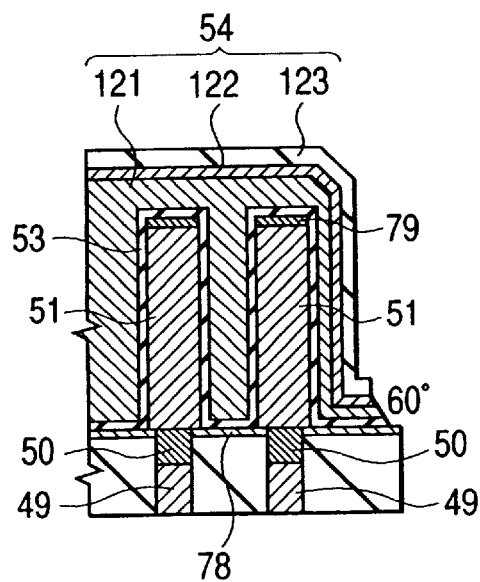

As illustrated in FIG. 31(d), the titanium nitride film 122, ruthenium film 121 and BST film 58 are then etched anisotropically by dry etching with the silicon oxide film 123, which has been patterned by the above-described etching, as a mask, whereby a capacitive insulating film 53 made of the BST film 58 and an upper electrode 54 made of the silicon oxide film 123, silicon nitride film 122 and ruthenium film 121 are formed.

As described above, the titanium nitride film 122, ruthenium film 121 and BST film 58 are etched by dry etching. They are not exposed to ashing atmosphere thereafter so that erosion or disappearance of the ruthenium film 121 even at the etched edge portion can be prevented, resulting in an improvement in the processing accuracy and contribution to minute processing. The other effects are similar to those described in Embodiment 13 or 14.

Embodiment 16

FIG. 32 are cross-sectional views illustrating, in the order of step, one example of the manufacturing steps of the information storage capacitive element of the DRAM according to Embodiment 16. FIG. 32 each illustrates, similar to FIGS. 11 and 12, a cross-section taken along line B—B in FIG. 10(a) and illustrates only the region of the information storage capacitive element C of the DRAM.

The manufacturing method according to this Embodiment is similar to that of Embodiment 1 until the step of FIG. 8.

After the step of FIG. 8 in Embodiment 1, as illustrated in FIG. 32(a), a ruthenium film 55 and a silicon oxide film 56 are formed over a titanium nitride film 47, followed by the formation of a patterned photoresist film 57 over the silicon oxide film 56.

The ruthenium film 55, silicon oxide film 56 and photoresist film 57 are similar to those of Embodiment 1.

As illustrated in FIG. 32(b), the silicon oxide film 56 is etched with the photoresist film 57 as a mask. This etching of the silicon oxide film 56 is stopped before it reaches the bottom surface thereof so that a thin silicon oxide film remains without being etched. In other words, the silicon oxide film 56 is not patterned completely but formed into a cross-section having an unevenness. The etching method of the silicon oxide film 52 is similar to that of Embodiment 1.

As illustrated in FIG. 32(c), the photoresist film 57 is then removed. The removal of the photoresist film 70 is conducted by ashing as in Embodiment 12 to 15. Since the silicon oxide film 52 is not completely patterned, in other words, the surface of the ruthenium film 55 is not exposed, upon ashing, the ruthenium film 55 is not exposed to the ashing atmosphere, which makes it possible to prevent the erosion or disappearance of the ruthenium film 55.

As illustrated in FIG. 32(d), etching is carried out in the presence of the silicon oxide film 52 having an unevenness. Owing to the disappearance of a thin portion of the thin silicon oxide film 52 first, the remaining portion of the silicon oxide film serves as a mask, whereby the ruthenium film 55 can be etched and the lower electrode 51 can be formed. The ruthenium film 55 can be etched as in Embodiment 1.

In this Embodiment, the erosion or disappearance of the ruthenium film 55 can be prevented so that the lower electrode 51 can be processed with good accuracy as in Embodiment 1.

The silicon oxide film 52 can be replaced with another insulating film such as silicon nitride film.

Embodiment 17

FIG. 33 are cross-sectional views illustrating, in the order of step, one example of the manufacturing steps of the information storage capacitive element of the DRAM according to Embodiment 17. FIG. 33 each illustrates, similar to FIGS. 11 and 12, a cross-section taken along line B—B in FIG. 10(a) and illustrates only the region of the information storage capacitive element C of the DRAM.

The manufacturing method according to this Embodiment is similar to that of Embodiment 12 until the step of FIG. 27(c). As described in Embodiment 12, a photoresist film 70 on a hard mask 72 is removed. At this time, since a platinum film 79 has been formed over a ruthenium film 55, erosion or disappearance of the ruthenium film 55 can be prevented as in Embodiment 12.

In this Embodiment, the platinum film 79 and the ruthenium film 55 are not etched by the same step as in Embodiment 12. As illustrated in FIG. 33(a), the platinum film 79 is etched and patterned in the existence of the hard mask 72. For this etching, an etching apparatus, for example, that as shown in FIG. 13 of Embodiment 1 can be employed. Etching is conducted under conditions of a reactive pressure of 2 mTorr, plasma source power of 300 W, RF bias power of 600 W, feeding of carbon tetrafluoride ($CF_4$) and argon (Ar) at flow rates of 10 sccm and 40 sccm, respectively and an over etching time of about 10 seconds.

As illustrated in FIG. 27(d) of Embodiment 12, the ruthenium film 55 is etched (FIG. 33(b)). The steps subsequent thereto are similar to those of Embodiment 12.

In this Embodiment, the platinum film 79 and the ruthenium film 55 are etched not in one etching step but two etching steps, which improves the processing accuracy of the etching. Described specifically, etching of the platinum film 79 is carried out in the first step under the conditions described above, that is, the conditions which do not produce nonvolatile platinum reaction products easily, thereby preventing the generation of the platinum reaction products, then in the second step under conditions (etching conditions of the ruthenium film 55 in Embodiment 1) which permit processing of the ruthenium film 55 with excellent anisotropy. By such etching, no platinum reaction products exist upon the processing of the ruthenium film 55, whereby the processing accuracy of the ruthenium film 55 is improved. Under the above-described conditions (conditions which do not produce nonvolatile platinum reaction products easily), the platinum film 79 is processed with poor anisotropy to have a cross-section having a small taper angle. Owing to the film thickness of the platinum film 79 as thin as 20 nm, however, an influence on the processing accuracy of the ruthenium film 55 is small and does not cause any special problem.

The invention completed by the present inventors have so far been described specifically based on the embodiments. It should however be borne in mind that the present invention is not limited to them. It will be apparent that many changes and modifications can be made to the invention without departing from the scope of the invention as set forth herein.

In Embodiment 2, platinum is employed as a hard mask upon etching of the ruthenium film 55, but the lower electrode can be formed of iridium, iridium oxide or a laminate film of iridium and iridium oxide. In this case, the conductive film such as iridium which is to be the lower electrode 51 can be formed to have a thickness of 300 nm and the photoresist film 67 can be formed to have a pattern width of 60 nm and a pattern space of 100 nm.

As the capacitive insulating film, a PZT film can be used while as the upper electrode, iridium, iridium oxide or a laminate film of iridium and iridium oxide can be employed. Application of the manufacturing method of Embodiment 2 to such a constitution makes it possible to manufacture a DRAM of 4 to 16 Gbit class, as in Embodiment 10.

The PZT film can be used as an etching mask (hard mask) for iridium, iridium oxide or a laminate film of iridium and iridium oxide. It is also possible to replace the ruthenium film 55 of Embodiment 5 with iridium, iridium oxide or a laminate film of iridium and iridium oxide and the BST film 73 with a PZT film; adjust the size of the photoresist film 70 to have a pattern width of 60 nm and a pattern space of 100 nm; and apply the processing method of Embodiment 5, thereby forming a lower electrode made of iridium or the like. In such a constitution, it is also possible to manufacture a DRAM of 4 to 16 Gbit class, as in Embodiment 10. In this case, as described above, a PZT film is employed as the capacitive insulating film and iridium, iridium oxide or a laminate film of iridium and iridium oxide is used as the upper electrode.

In Embodiments 12 to 16, a method for removing the photoresist film by ashing was described. Alternatively, the photoresist film can be removed by the peeling method or wet etching method. In such a method, the photoresist film is not exposed to an ashing atmosphere so that upon removal of the photoresist film, it does not matter whether a part or whole of the ruthenium film is exposed.

Effects available from typical inventions, among the inventions disclosed by this application, will next be described briefly.

(1) It becomes possible to actualize minute etching of ruthenium, ruthenium oxide or the like suited for a ferroelectric film such as BST.

(2) It becomes possible to prevent narrowing of the pattern, roughening of the upper surface of the pattern and etching of the underlying insulating film which occur upon removal of the hard mask such as titanium nitride film, thereby forming a highly reliable capacitive insulating film.

(3) It becomes possible to simplify the storage capacitance formation step.

(4) It becomes possible to prevent erosion or disappearance of ruthenium upon ashing of a photoresist film.

What is claimed is:

1. A manufacturing method of a semiconductor integrated circuit, comprising the steps of:
    (a) forming, over the main surface of an integrated circuit wafer, a conductive first film which constitutes a lower electrode of an information storage capacitive element of a memory cell,
    (b) forming, over said first film, a second film having a smaller etching rate than said first film in an ashing atmosphere in a removing step of a photoresist film,
    (c) forming an inorganic third film over said second film,
    (d) forming a photoresist film pattern over said third film,
    (e) dry etching said third film in the presence of said photoresist film pattern, thereby forming an inorganic film pattern of said third film over said second film,
    (f) removing said photoresist film pattern by ashing,
    (g) dry etching said first and second films in the presence of said inorganic film pattern, thereby patterning said first and second films, and
    (h) forming, over the patterned surfaces of said first and second films, a dielectric film which constitutes a capacitive insulating film of the information storage capacitive element of said memory cell.

2. A manufacturing method of a semiconductor integrated circuit according to claim 1, wherein said first film is made of ruthenium and said second film is made of any material selected from platinum, ruthenium dioxide, tantalum oxide, titanium oxide, BST, silicon oxide, iridium or iridium dioxide.

3. A manufacturing method of a semiconductor integrated circuit according to claim 2, which further comprises:
    (i) forming, over said capacitive insulating film, a monolayer or multilayer conductive fourth film which is made of, at at least the surface portion thereof, a material having a smaller etching rate than said first film in the ashing atmosphere upon removal of the photoresist film,
    (j) forming a photoresist film pattern over said fourth film,
    (k) dry etching said fourth film in the presence of said photoresist film pattern, thereby patterning said fourth film, and
    (l) removing said photoresist film pattern by ashing.

4. A manufacturing method of a semiconductor integrated circuit according to claim 3, wherein said fourth film is formed of a lower layer made of ruthenium and an upper layer made of titanium nitride, a silicon oxide or tantalum oxide.

5. A manufacturing method of a semiconductor integrated circuit according to claim 2, which further comprises:
    (i) forming, over said capacitive insulating film, a monolayer or multilayer fourth conductive film which is made of, at at least the surface thereof, a material having a smaller etching rate than said first film in the ashing atmosphere of a removing step of a photoresist film,
    (j) forming an inorganic fifth film over said fourth film,
    (k) forming a photoresist film pattern over said fifth film,
    (l) dry etching said fifth film in the presence of said photoresist film pattern, thereby forming an inorganic film-pattern of said fifth film,
    (m) removing said photoresist film pattern by ashing, and
    (n) dry etching said fourth film in the presence of said inorganic film pattern, thereby patterning said fourth film.

6. A manufacturing method of a semiconductor integrated circuit according to claim 5, wherein said fourth film is formed of a lower layer made of ruthenium and an upper layer made of titanium nitride and said fifth film is formed of a silicon oxide film.

* * * * *